US007335395B2

(12) United States Patent
Ward et al.

(10) Patent No.: US 7,335,395 B2
(45) Date of Patent: *Feb. 26, 2008

(54) METHODS OF USING PRE-FORMED NANOTUBES TO MAKE CARBON NANOTUBE FILMS, LAYERS, FABRICS, RIBBONS, ELEMENTS AND ARTICLES

(75) Inventors: Jonathan W. Ward, Burlington, MA (US); Thomas Rueckes, Boston, MA (US); Brent M. Segal, Woburn, MA (US)

(73) Assignee: Nantero, Inc., Woburn, MA (US)

( * ) Notice: Subject to any disclaimer, the term of this patent is extended or adjusted under 35 U.S.C. 154(b) by 297 days.

This patent is subject to a terminal disclaimer.

(21) Appl. No.: 10/341,054

(22) Filed: Jan. 13, 2003

(65) Prior Publication Data

US 2007/0248758 A1 Oct. 25, 2007

Related U.S. Application Data

(63) Continuation-in-part of application No. 10/128,118, filed on Apr. 23, 2002, now Pat. No. 6,706,402.

(51) Int. Cl.
*B05D 3/12* (2006.01)
(52) U.S. Cl. ............... 427/198; 427/240; 427/264; 427/271
(58) Field of Classification Search ........... 427/198, 427/240, 264, 270, 271, 903; 977/842, 892; 423/447.1, 445 B; 118/320
See application file for complete search history.

(56) References Cited

U.S. PATENT DOCUMENTS

| 3,448,302 | A | 6/1969 | Shanefield ............... 307/318 |
| 3,740,494 | A | 6/1973 | Dunand et al. |
| 3,892,890 | A | 7/1975 | Watanabe et al. |
| 3,970,887 | A | 7/1976 | Smith et al. ............ 313/309 |
| 4,324,814 | A | 4/1982 | Reichert ................. 427/86 |
| 4,378,629 | A | 4/1983 | Bozler et al. ............ 29/580 |
| 4,495,511 | A | 1/1985 | Yoder ...................... 357/22 |
| 4,510,016 | A | 4/1985 | Chi et al. ................ 156/643 |
| 4,524,431 | A | 6/1985 | Haken et al. |
| 4,673,474 | A | 6/1987 | Ogawa ................. 204/157.64 |
| 4,694,427 | A | 9/1987 | Miyamoto et al. |
| 4,701,842 | A | 10/1987 | Olnowich ............... 364/200 |
| 4,707,197 | A | 11/1987 | Hensel et al. ........... 437/189 |
| 4,758,534 | A | 7/1988 | Derkits, Jr. et al. ...... 437/89 |
| 4,819,212 | A | 4/1989 | Nakai et al. |
| 4,845,533 | A | 7/1989 | Pryor et al. ............... 357/2 |
| 4,853,893 | A | 8/1989 | Eaton, Jr. et al. ......... 365/145 |
| 4,876,667 | A | 10/1989 | Ross et al. ............... 365/113 |
| 4,888,630 | A | 12/1989 | Paterson .................. 357/23.5 |
| 4,901,121 | A | 2/1990 | Gibson et al. ............. 357/15 |
| 4,903,090 | A | 2/1990 | Yokoyama .............. 357/22 |
| 4,909,624 | A | 3/1990 | Tsuru et al. .............. 438/396 |
| 4,939,556 | A | 7/1990 | Eguchi et al. ............. 357/4 |
| 4,947,226 | A | 8/1990 | Huang et al. |
| 4,979,149 | A | 12/1990 | Popovic et al. |
| 4,985,871 | A | 1/1991 | Catlin .................. 365/230.06 |
| 5,010,037 | A | 4/1991 | Lin et al. ................ 437/200 |
| 5,031,145 | A | 7/1991 | Lever |
| 5,032,538 | A | 7/1991 | Bozler et al. ............. 437/83 |
| 5,051,956 | A | 9/1991 | Burns |
| 5,057,883 | A | 10/1991 | Noda ..................... 357/22 |
| 5,089,545 | A | 2/1992 | Pol ........................ 524/17 |
| 5,116,812 | A * | 5/1992 | Lelental et al. .......... 505/445 |
| 5,155,561 | A | 10/1992 | Bozler et al. ............ 357/22 |
| 5,161,218 | A | 11/1992 | Catlin .................... 395/425 |
| 5,168,070 | A | 12/1992 | Luth ...................... 437/31 |
| 5,175,597 | A | 12/1992 | Cachier et al. .......... 257/267 |
| 5,184,320 | A | 2/1993 | Dye ...................... 365/49 |
| 5,196,396 | A | 3/1993 | Lieber ..................... 505/1 |
| 5,198,390 | A | 3/1993 | MacDonald et al. ...... 437/203 |
| 5,198,994 | A | 3/1993 | Natori ................... 365/145 |
| 5,216,631 | A | 6/1993 | Sliwa .................... 365/174 |
| 5,252,835 | A | 10/1993 | Lieber et al. ............ 250/492.1 |
| 5,271,862 | A | 12/1993 | Freese ................... 395/445 |
| 5,290,715 | A | 3/1994 | Pandya ................... 437/29 |
| 5,316,979 | A | 5/1994 | MacDonald et al. ...... 437/203 |
| 5,346,683 | A | 9/1994 | Green et al. ............ 423/447.2 |
| 5,412,785 | A | 5/1995 | Skruhak et al. .......... 395/375 |
| 5,424,054 | A | 6/1995 | Bethune et al. .......... 423/447.2 |
| 5,426,070 | A | 6/1995 | Shaw et al. .............. 437/203 |
| 5,444,421 | A | 8/1995 | Carroll et al. ............ 331/111 |
| 5,444,651 | A | 8/1995 | Yamamoto et al. ....... 365/108 |
| 5,453,970 | A | 9/1995 | Rust et al. ............... 396/176 |
| 5,456,986 | A | 10/1995 | Majetich et al. ......... 428/403 |
| 5,475,341 | A | 12/1995 | Reed ..................... 327/566 |
| 5,479,172 | A | 12/1995 | Smith et al. ............. 342/51 |
| 5,482,601 | A | 1/1996 | Ohshima et al. ......... 204/173 |
| 5,517,194 | A | 5/1996 | Carroll et al. ............ 342/50 |

(Continued)

FOREIGN PATENT DOCUMENTS

DE        4446289        6/1996

(Continued)

OTHER PUBLICATIONS

Collins et al., "Engineering Carbon Nanotubes and Nanotube Circuits Using Electrical Breakdown", Science, 292, pp. 706-709, Apr. 2001.*

(Continued)

*Primary Examiner*—Fred J. Parker
(74) *Attorney, Agent, or Firm*—Wilmer Cutler Pickering Hale and Dorr LLP

(57) ABSTRACT

Methods of Using Preformed Nanotubes to Make Carbon Nanotube Films, Layers, Fabrics, Ribbons, Elements and Articles are disclosed. To make various articles, certain embodiments provide a substrate. Preformed nanotubes are applied to a surface of the substrate to create a non-woven fabric of carbon nanotubes. Portions of the non-woven fabric are selectively removed according to a defined pattern to create the article. To make a nanofabric, a substrate is provided. Preformed nanotubes are applied to a surface of the substrate to create a non-woven fabric of carbon nanotubes wherein the non-woven fabric is substantially uniform density.

41 Claims, 34 Drawing Sheets

U.S. PATENT DOCUMENTS

| | | |
|---|---|---|
| 5,521,602 A | 5/1996 | Carroll et al. ............... 342/50 |
| 5,533,061 A | 7/1996 | Smith et al. ............... 375/334 |
| 5,538,916 A | 7/1996 | Kuroi et al. |
| 5,547,748 A | 8/1996 | Ruoff et al. ............... 428/323 |
| 5,553,099 A | 9/1996 | Carroll et al. ............... 375/334 |
| 5,563,424 A | 10/1996 | Yang et al. ............... 257/40 |
| 5,586,286 A | 12/1996 | Santeler et al. ............ 395/432 |
| 5,589,692 A | 12/1996 | Reed ............ 257/23 |
| 5,590,078 A | 12/1996 | Chatter ............... 365/189.01 |
| 5,591,312 A | 1/1997 | Smalley |
| 5,592,642 A | 1/1997 | Thomas |
| 5,592,643 A | 1/1997 | Thomas |
| 5,592,644 A | 1/1997 | Thomas |
| 5,608,246 A | 3/1997 | Yeager et al. ............... 257/295 |
| 5,608,888 A | 3/1997 | Purcell et al. ............... 395/412 |
| 5,623,638 A | 4/1997 | Andrade ............... 395/494 |
| 5,626,670 A | 5/1997 | Varshney et al. ............... 117/7 |
| 5,626,812 A | 5/1997 | Ebbesen et al. ............ 264/248 |
| 5,640,133 A | 6/1997 | MacDonald et al. ....... 333/197 |
| 5,640,343 A | 6/1997 | Gallagher et al. ............ 365/171 |
| 5,650,958 A | 7/1997 | Gallagher et al. ............ 365/173 |
| 5,651,126 A | 7/1997 | Bailey et al. ............... 395/401 |
| 5,652,856 A | 7/1997 | Santeler et al. ............ 395/432 |
| 5,676,865 A | 10/1997 | Chang |
| 5,699,317 A | 12/1997 | Sartore et al. ......... 365/230.06 |
| 5,716,708 A | 2/1998 | Lagow ............... 428/408 |
| 5,719,073 A | 2/1998 | Shaw et al. ............... 437/228 |
| 5,721,862 A | 2/1998 | Sartore et al. |
| 5,739,057 A | 4/1998 | Tiwari et al. ............... 438/172 |
| 5,747,180 A | 5/1998 | Miller et al. ............... 428/601 |
| 5,751,156 A | 5/1998 | Muller et al. ............... 324/699 |
| 5,753,088 A | 5/1998 | Olk ............... 204/173 |
| 5,780,101 A | 7/1998 | Nolan et al. ............... 428/216 |
| 5,781,717 A | 7/1998 | Wu et al. ............... 395/182.06 |
| 5,793,697 A | 8/1998 | Scheuerlein .......... 365/230.07 |
| 5,799,209 A | 8/1998 | Chatter ............... 395/876 |
| 5,802,583 A | 9/1998 | Yeager et al. ............... 711/152 |
| 5,829,125 A | 11/1998 | Fujimoto et al. |
| 5,838,165 A | 11/1998 | Chatter ............... 326/38 |
| 5,840,435 A | 11/1998 | Lieber et al. ............... 428/698 |
| 5,841,692 A | 11/1998 | Gallagher et al. ............ 365/173 |
| 5,846,849 A | 12/1998 | Shaw et al. ............... 438/52 |
| 5,847,454 A | 12/1998 | Shaw et al. ............... 257/734 |
| 5,847,565 A | 12/1998 | Narayanan ............... 324/322 |
| 5,850,089 A | 12/1998 | Varshney et al. ............ 257/295 |
| 5,850,231 A | 12/1998 | Orimoto et al. ............ 345/507 |
| 5,858,862 A | 1/1999 | Westwater et al. .......... 438/503 |
| 5,875,451 A | 2/1999 | Joseph ............... 711/105 |
| 5,878,840 A | 3/1999 | Tessum et al. ............... 182/229 |
| 5,887,272 A | 3/1999 | Sartore et al. ............... 711/105 |
| 5,897,945 A | 4/1999 | Lieber et al. ............... 428/323 |
| 5,903,010 A | 5/1999 | Flory et al. ............... 257/24 |
| 5,914,553 A | 6/1999 | Adams et al. ............... 310/309 |
| 5,925,465 A | 7/1999 | Ebbesen et al. ............ 428/408 |
| 5,928,450 A | 7/1999 | Russell ............... 156/169 |
| 5,930,164 A | 7/1999 | Zhu ............... 365/158 |
| 5,939,785 A | 8/1999 | Klonis et al. ............... 257/729 |
| 5,946,228 A | 8/1999 | Abraham et al. ............ 365/173 |
| 5,946,930 A | 9/1999 | Anthony ............... 62/293 |
| 5,973,444 A | 10/1999 | Xu et al. ............... 313/309 |
| 5,985,446 A | 11/1999 | Lagow ............... 428/367 |
| 5,993,697 A | 11/1999 | Cohen et al. ............... 252/502 |
| 5,994,733 A | 11/1999 | Nishioka et al. |
| 5,997,832 A | 12/1999 | Lieber et al. ............... 423/249 |
| 6,025,618 A | 2/2000 | Chen ............... 257/295 |
| 6,031,711 A | 2/2000 | Tennent et al. ............... 361/303 |
| 6,031,756 A | 2/2000 | Gimzewski et al. ........ 365/151 |
| 6,036,774 A | 3/2000 | Lieber et al. ............... 117/105 |
| 6,038,060 A | 3/2000 | Crowley ............... 359/328 |
| 6,038,637 A | 3/2000 | Berube et al. ............... 711/105 |
| 6,044,008 A | 3/2000 | Choi ............... 365/145 |
| 6,048,740 A | 4/2000 | Hsu et al. |
| 6,049,856 A | 4/2000 | Bolyn ............... 711/168 |
| 6,051,866 A | 4/2000 | Shaw et al. ............... 257/417 |
| 6,052,263 A | 4/2000 | Gill ............... 360/113 |
| 6,052,313 A | 4/2000 | Atsumi et al. |
| 6,057,637 A | 5/2000 | Zettl et al. |
| 6,060,724 A | 5/2000 | Flory et al. ............... 257/24 |
| 6,062,931 A | 5/2000 | Chuang et al. |
| 6,063,243 A | 5/2000 | Zettl et al. ............... 204/164 |
| 6,064,107 A | 5/2000 | Yeh et al. |
| 6,069,380 A | 5/2000 | Chou et al. ............... 257/315 |
| 6,072,718 A | 6/2000 | Abraham et al. ............ 365/173 |
| 6,083,624 A | 7/2000 | Hiura ............... 428/408 |
| 6,087,293 A | 7/2000 | Carnahan et al. |
| 6,088,760 A | 7/2000 | Walker et al. ............... 711/104 |
| 6,100,109 A | 8/2000 | Melzner et al. ............... 438/53 |
| 6,104,633 A | 8/2000 | Abraham et al. ............ 365/171 |
| 6,105,381 A | 8/2000 | Ghoshal ............... 62/259.2 |
| 6,108,725 A | 8/2000 | Chatter ............... 710/56 |
| 6,128,214 A | 10/2000 | Kuekes et al. ............... 365/151 |
| 6,136,160 A | 10/2000 | Hrkut et al. .......... 204/192.16 |
| 6,138,219 A | 10/2000 | Soman et al. ............... 711/149 |
| 6,144,481 A | 11/2000 | Kowarz et al. ............... 359/291 |
| 6,146,227 A | 11/2000 | Mancevski ............... 445/24 |
| 6,156,256 A | 12/2000 | Kennel ............... 264/461 |
| 6,159,620 A | 12/2000 | Heath et al. ............... 428/615 |
| 6,159,742 A | 12/2000 | Lieber et al. ............... 436/164 |
| 6,165,890 A | 12/2000 | Kohl et al. |
| 6,166,948 A | 12/2000 | Parkin et al. ............... 365/173 |
| 6,177,703 B1 | 1/2001 | Cunningham |
| 6,183,714 B1 | 2/2001 | Smalley et al. ............ 423/447.3 |
| 6,187,823 B1 | 2/2001 | Haddon et al. ............... 516/32 |
| 6,190,634 B1 | 2/2001 | Lieber et al. ............... 423/439 |
| 6,198,655 B1 | 3/2001 | Heath et al. ............... 365/151 |
| 6,203,814 B1 | 3/2001 | Fisher et al. ............... 424/443 |
| 6,203,864 B1 | 3/2001 | Zhang et al. ............... 427/592 |
| 6,212,597 B1 | 4/2001 | Conlin et al. ............... 711/105 |
| 6,219,212 B1 | 4/2001 | Gill et al. ............... 360/324.2 |
| 6,221,330 B1 | 4/2001 | Moy et al. ............... 423/447.3 |
| 6,226,722 B1 | 5/2001 | Shippy et al. ............... 711/168 |
| 6,231,744 B1 | 5/2001 | Ying et al. ............... 205/324 |
| 6,231,980 B1 | 5/2001 | Cohen et al. ............... 428/402 |
| 6,232,706 B1 | 5/2001 | Dai et al. ............... 313/309 |
| 6,233,665 B1 | 5/2001 | Bolyn ............... 711/168 |
| 6,237,130 B1 | 5/2001 | Soman et al. ............... 716/10 |
| 6,239,547 B1 | 5/2001 | Uemura et al. ............... 313/495 |
| 6,250,984 B1 | 6/2001 | Jin et al. ............... 445/51 |
| 6,256,767 B1 | 7/2001 | Kuekes et al. |
| 6,259,277 B1 | 7/2001 | Tour et al. ............... 326/136 |
| 6,262,469 B1 | 7/2001 | Le et al. |
| 6,265,333 B1 | 7/2001 | Dzenis et al. |
| 6,277,318 B1 * | 8/2001 | Bower et al. ............... 264/346 |
| 6,300,205 B1 | 10/2001 | Fulford et al. |
| 6,314,019 B1 | 11/2001 | Kuekes et al. |
| 6,320,428 B1 | 11/2001 | Atsumi et al. |
| 6,322,713 B1 | 11/2001 | Choi et al. |
| 6,325,909 B1 | 12/2001 | Li et al. |
| 6,331,209 B1 | 12/2001 | Jang et al. |
| 6,333,016 B1 | 12/2001 | Resasco et al. ............ 423/447.3 |
| 6,340,822 B1 | 1/2002 | Brown et al. |
| 6,342,276 B1 * | 1/2002 | You ............... 427/555 |
| 6,346,413 B1 | 2/2002 | Fodor et al. |
| 6,348,295 B1 | 2/2002 | Griffith et al. |
| 6,348,700 B1 | 2/2002 | Ellenbogen et al. |
| 6,350,488 B1 | 2/2002 | Lee et al. |
| 6,354,133 B1 | 3/2002 | Yedur et al. ............... 73/1.89 |
| 6,358,756 B1 | 3/2002 | Sandhu et al. |
| 6,361,861 B2 | 3/2002 | Gao et al. |
| 6,362,073 B2 | 3/2002 | Kim |
| 6,376,787 B1 | 4/2002 | Martin et al. |
| 6,380,434 B1 | 4/2002 | Chiang |
| 6,394,158 B1 | 5/2002 | Momeni et al. |
| 6,400,088 B1 | 6/2002 | Livingston et al. |

| | | |
|---|---|---|
| 6,400,091 B1 | 6/2002 | Deguchi et al. |
| 6,406,776 B1 | 6/2002 | D'Evelyn |
| 6,407,443 B2 | 6/2002 | Chen et al. |
| 6,409,567 B1 | 6/2002 | Amey et al. |
| 6,413,487 B1 | 7/2002 | Resasco et al. .......... 423/447.3 |
| 6,417,606 B1 | 7/2002 | Nakamoto et al. |
| 6,420,726 B2 | 7/2002 | Choi et al. |
| 6,421,271 B1 | 7/2002 | Gogl et al. |
| 6,422,450 B1 | 7/2002 | Zhou et al. |
| 6,423,583 B1 | 7/2002 | Avouris et al. |
| 6,426,134 B1 | 7/2002 | Lavin et al. |
| 6,426,687 B1 | 7/2002 | Osborn |
| 6,432,740 B1 | 8/2002 | Chen |
| 6,440,761 B1 | 8/2002 | Choi |
| 6,443,901 B1 | 9/2002 | Fraser ...................... 500/459 |
| 6,445,006 B1 | 9/2002 | Brandes et al. .............. 257/76 |
| 6,495,116 B1 | 12/2002 | Herman .................. 423/447.3 |
| 6,495,258 B1 | 12/2002 | Chen et al. ................. 428/408 |
| 6,515,339 B2 | 2/2003 | Shin et al. ................. 257/368 |
| 6,518,156 B1 | 2/2003 | Chen et al. |
| 6,528,020 B1 | 3/2003 | Dai et al. |
| 6,533,620 B2 | 3/2003 | Franzen et al. |
| 6,541,309 B2 | 4/2003 | Chen ........................ 438/118 |
| 6,548,841 B2 | 4/2003 | Frazier et al. |
| 6,559,468 B1 | 5/2003 | Kuekes et al. |
| 6,566,983 B2 | 5/2003 | Shin ......................... 333/193 |
| 6,574,130 B2 | 6/2003 | Segal et al. ................. 365/129 |
| 6,586,965 B2 | 7/2003 | Kuekes ....................... 326/37 |
| 6,595,405 B2 | 7/2003 | Terunuma et al. |
| 6,611,033 B2 | 8/2003 | Hsu et al. .................. 257/414 |
| 6,625,047 B2 | 9/2003 | Coleman, Jr. |
| 6,630,772 B1 * | 10/2003 | Bower et al. ............... 313/311 |
| 6,641,793 B2 * | 11/2003 | Haddon et al. .......... 423/447.2 |
| 6,642,639 B2 | 11/2003 | Choi et al. |
| 6,643,165 B2 | 11/2003 | Segal et al. |
| 6,645,628 B2 | 11/2003 | Shiffler, Jr. et al. |
| 6,658,634 B1 | 12/2003 | Goodnow et al. |
| 6,673,424 B1 | 1/2004 | Lindsay et al. |
| 6,705,152 B2 | 3/2004 | Routkevitch et al. |
| 6,706,402 B2 | 3/2004 | Rueckes et al. |
| 6,707,098 B2 | 3/2004 | Hofmann et al. |
| 6,709,566 B2 | 3/2004 | Cumings et al. |
| 6,743,408 B2 | 6/2004 | Lieber et al. |
| 6,750,471 B2 | 6/2004 | Bethune et al. |
| 6,759,693 B2 | 7/2004 | Vogeli et al. |
| 6,774,052 B2 | 8/2004 | Vogeli et al. |
| 6,781,166 B2 | 8/2004 | Lieber et al. |
| 6,784,028 B2 | 8/2004 | Rueckes et al. |
| 6,803,840 B2 | 10/2004 | Hunt et al. |
| 6,808,746 B1 | 10/2004 | Dai et al. |
| 6,809,462 B2 | 10/2004 | Pelrine et al. |
| 6,809,465 B2 | 10/2004 | Jin |
| 6,833,558 B2 | 12/2004 | Lee et al. |
| 6,835,591 B2 * | 12/2004 | Rueckes et al. .............. 438/99 |
| 6,858,197 B1 | 2/2005 | Delzeit |
| 6,863,942 B2 | 3/2005 | Ren et al. |
| 6,896,864 B2 * | 5/2005 | Clarke .................... 423/447.1 |
| 6,911,682 B2 | 6/2005 | Rueckes et al. |
| 6,918,284 B2 | 7/2005 | Snow et al. |
| 6,919,284 B2 | 7/2005 | Yamamoto et al. |
| 6,919,529 B2 | 7/2005 | Franzen et al. |
| 6,919,730 B2 | 7/2005 | Cole et al. |
| 6,919,740 B2 | 7/2005 | Snider |
| 6,921,575 B2 * | 7/2005 | Horiuchi et al. ............. 428/367 |
| 6,924,538 B2 | 8/2005 | Jaiprakash et al. |
| 6,946,410 B2 | 9/2005 | French et al. |
| 6,955,937 B1 | 10/2005 | Burke et al. |
| 6,969,651 B1 | 11/2005 | Lu et al. |
| 7,015,500 B2 | 3/2006 | Choi et al. |
| 7,048,999 B2 | 5/2006 | Smalley et al. |
| 7,056,758 B2 * | 6/2006 | Segal et al. ................... 438/50 |
| 2003/0132823 A | 7/1703 | Hyman et al. |
| 2001/0004929 A1 | 6/2001 | Han et al. ..................... 216/4 |
| 2001/0023123 A1 | 9/2001 | Kim |
| 2001/0023986 A1 | 9/2001 | Mancevski |
| 2002/0048679 A1 * | 4/2002 | Lohner et al. .............. 428/447 |
| 2002/0055010 A1 | 5/2002 | Gao et al. |
| 2002/0061441 A1 | 5/2002 | Ogura et al. |
| 2002/0068170 A1 | 6/2002 | Smalley et al. |
| 2002/0081380 A1 | 6/2002 | Dillon et al. |
| 2002/0081787 A1 | 6/2002 | Kohl et al. |
| 2002/0088938 A1 | 7/2002 | Colbert et al. |
| 2002/0090331 A1 | 7/2002 | Smalley et al. |
| 2002/0092983 A1 | 7/2002 | Colbert et al. |
| 2002/0092984 A1 | 7/2002 | Colbert et al. |
| 2002/0096634 A1 | 7/2002 | Colbert et al. |
| 2002/0098135 A1 | 7/2002 | Smalley et al. |
| 2002/0102193 A1 | 8/2002 | Smalley et al. |
| 2002/0102194 A1 | 8/2002 | Smalley et al. |
| 2002/0102196 A1 | 8/2002 | Smalley et al. |
| 2002/0102353 A1 | 8/2002 | Mauthner et al. |
| 2002/0112814 A1 | 8/2002 | Hafner et al. ............. 156/272.2 |
| 2002/0125805 A1 | 9/2002 | Hsu ........................... 313/309 |
| 2002/0130311 A1 * | 9/2002 | Lieber et al. .................. 257/1 |
| 2002/0130353 A1 | 9/2002 | Lieber et al. ................ 257/315 |
| 2002/0136896 A1 | 9/2002 | Takikawa et al. |
| 2002/0160111 A1 | 10/2002 | Sun et al. ................. 427/248.1 |
| 2002/0172639 A1 | 11/2002 | Horiuchi .................. 423/477.2 |
| 2002/0172963 A1 | 11/2002 | Kelley et al. |
| 2002/0173083 A1 | 11/2002 | Avouls et al. .............. 438/129 |
| 2002/0175323 A1 | 11/2002 | Guillom et al. ............... 357/10 |
| 2002/0175390 A1 | 11/2002 | Goldstein et al. |
| 2002/0179434 A1 | 12/2002 | Dai et al. ................... 204/242 |
| 2003/0004058 A1 | 1/2003 | Li et al. ..................... 502/258 |
| 2003/0021141 A1 | 1/2003 | Segal et al. |
| 2003/0021966 A1 | 1/2003 | Segal et al. ................. 428/209 |
| 2003/0022428 A1 | 1/2003 | Segal et al. |
| 2003/0042834 A1 | 3/2003 | Dean et al. |
| 2003/0091825 A1 | 5/2003 | Shiffler et al. |
| 2003/0108480 A1 | 6/2003 | Baker et al. ............... 432/447.3 |
| 2003/0118727 A1 | 6/2003 | Ting et al. |
| 2003/0122111 A1 | 7/2003 | Glatkowski |
| 2003/0124325 A1 | 7/2003 | Rueckes et al. |
| 2003/0124837 A1 | 7/2003 | Rueckes et al. |
| 2003/0165074 A1 | 9/2003 | Segal et al. |
| 2003/0177450 A1 | 9/2003 | Nugent |
| 2003/0180472 A1 * | 9/2003 | Zhou et al. ................ 427/430.1 |
| 2003/0198812 A1 | 10/2003 | Rueckes et al. |
| 2003/0199172 A1 | 10/2003 | Rueckes et al. |
| 2003/0200521 A1 | 10/2003 | DeHon et al. |
| 2003/0206436 A1 | 11/2003 | Eaton et al. |
| 2003/0234407 A1 | 12/2003 | Vogeli et al. |
| 2003/0236000 A1 | 12/2003 | Vogeli et al. |
| 2004/0007528 A1 | 1/2004 | Bakajin et al. |
| 2004/0023514 A1 | 2/2004 | Moriya et al. |
| 2004/0041154 A1 | 3/2004 | Watanabe et al. |
| 2004/0071949 A1 | 4/2004 | Glatkowski et al. |
| 2004/0075159 A1 | 4/2004 | Vogeti |
| 2004/0077107 A1 | 4/2004 | Vogeli |
| 2004/0085805 A1 | 5/2004 | Segal et al. |
| 2004/0087162 A1 | 5/2004 | Vogeli |
| 2004/0099438 A1 | 5/2004 | Arthur et al. |
| 2004/0159833 A1 | 8/2004 | Rueckes et al. |
| 2004/0164289 A1 | 8/2004 | Rueckes et al. |
| 2004/0175856 A1 | 9/2004 | Jaiprakash et al. |
| 2004/0181630 A1 | 9/2004 | Jaiprakash et al. |
| 2004/0191978 A1 | 9/2004 | Rueckes et al. |
| 2004/0214366 A1 | 10/2004 | Segal et al. |
| 2004/0214367 A1 | 10/2004 | Segal et al. |
| 2004/0238907 A1 | 12/2004 | Pinkerton et al. |
| 2004/0253167 A1 | 12/2004 | Silva et al. |
| 2004/0265550 A1 | 12/2004 | Glatkowski et al. |
| 2005/0007002 A1 | 1/2005 | Golovchenko et al. |
| 2005/0035344 A1 | 2/2005 | Bertin et al. |
| 2005/0035367 A1 | 2/2005 | Bertin et al. |
| 2005/0035786 A1 | 2/2005 | Bertin et al. |

| | | | | | | |
|---|---|---|---|---|---|---|
| 2005/0035787 A1 | 2/2005 | Bertin et al. | | EP | 0 613 130 A1 | 8/1994 |
| 2005/0036365 A1 | 2/2005 | Bertin et al. | | EP | 1096533 | 2/1995 |
| 2005/0037547 A1 | 2/2005 | Bertin et al. | | EP | 0 665 187 A1 | 8/1995 |
| 2005/0040874 A1 | 2/2005 | Allison et al. | | EP | 0 688 618 A2 | 8/1995 |
| 2005/0041465 A1 | 2/2005 | Rueckes et al. | | EP | 0 688 618 A3 | 8/1995 |
| 2005/0041466 A1 | 2/2005 | Rueckes et al. | | EP | 758028 A3 | 7/1996 |
| 2005/0047244 A1 | 3/2005 | Rueckes et al. | | EP | 1209123 A2 | 9/1996 |
| 2005/0052894 A1 | 3/2005 | Segal et al. | | EP | 0 665 187 B1 | 12/1997 |
| 2005/0053525 A1 | 3/2005 | Segal et al. | | EP | 0 947 466 A1 | 10/1999 |
| 2005/0056825 A1 | 3/2005 | Bertin et al. | | EP | 0 989 578 A3 | 3/2000 |
| 2005/0056866 A1 | 3/2005 | Bertin et al. | | EP | 0 989 579 A3 | 3/2000 |
| 2005/0056877 A1 | 3/2005 | Rueckes et al. | | EP | 0 945 402 A1 | 9/2000 |
| 2005/0058590 A1 | 3/2005 | Sen et al. | | EP | 1 046 613 A2 | 10/2000 |
| 2005/0058797 A1 | 3/2005 | Sen et al. | | EP | 1225613 A1 | 10/2000 |
| 2005/0058834 A1 | 3/2005 | Rueckes et al. | | EP | 1 052 520 A1 | 11/2000 |
| 2005/0059176 A1 | 3/2005 | Rueckes et al. | | EP | 1 054 249 A1 | 11/2000 |
| 2005/0059210 A1 | 3/2005 | Rueckes et al. | | EP | 1 059 266 A3 | 12/2000 |
| 2005/0062035 A1 | 3/2005 | Bertin et al. | | EP | 1 061 040 A1 | 12/2000 |
| 2005/0062062 A1 | 3/2005 | Bertin et al. | | EP | 1 061 043 A1 | 12/2000 |
| 2005/0062070 A1 | 3/2005 | Bertin et al. | | EP | 1 061 044 A1 | 12/2000 |
| 2005/0063210 A1 | 3/2005 | Segal et al. | | EP | 1 061 544 A1 | 12/2000 |
| 2005/0063244 A1 | 3/2005 | Bertin et al. | | EP | 1 061 555 A1 | 12/2000 |
| 2005/0065741 A1 | 3/2005 | Segal et al. | | EP | 1 069 206 A2 | 1/2001 |
| 2005/0068128 A1 | 3/2005 | Yip | | EP | 1 072 693 A1 | 1/2001 |
| 2005/0074926 A1 | 4/2005 | Bertin et al. | | EP | 1132920 A2 | 2/2001 |
| 2005/0095938 A1 | 5/2005 | Rosenberger et al. | | EP | 1 100 106 A2 | 5/2001 |
| 2005/0101112 A1 | 5/2005 | Rueckes et al. | | EP | 1 100 297 A2 | 5/2001 |
| 2005/0128788 A1 | 6/2005 | Segal et al. | | EP | 1096533 | 5/2001 |
| 2005/0174842 A1 | 8/2005 | Bertin et al. | | EP | 1205436 A1 | 11/2001 |
| 2005/0191495 A1 | 9/2005 | Rueckes et al. | | EP | 1186370 | 3/2002 |
| 2005/0237781 A1 | 10/2005 | Bertin et al. | | GB | 2364933 1 A | 7/2001 |
| 2005/0269553 A1 | 12/2005 | Sen et al. | | JP | 1146426 | 6/1989 |
| 2005/0269554 A1 | 12/2005 | Sen et al. | | JP | 11-011917 | 1/1999 |
| 2005/0270824 A1 | 12/2005 | Bertin et al. | | JP | 2001-035362 | 2/2001 |
| 2005/0279988 A1 | 12/2005 | Bertin | | JP | 2002-170480 | 6/2002 |
| 2005/0280436 A1 | 12/2005 | Bertin | | JP | 2004-090208 | 3/2004 |
| 2005/0281084 A1 | 12/2005 | Rueckes et al. | | WO | WO 95/02709 | 1/1995 |
| 2005/0282515 A1 | 12/2005 | Bertin | | WO | 2O 97/22971 | 12/1996 |
| 2005/0282516 A1 | 12/2005 | Bertin | | WO | W0 96/38410 | 12/1996 |
| 2006/0044035 A1 | 3/2006 | Bertin | | WO | WO 96/41043 | 12/1996 |
| 2006/0052509 A1 | 3/2006 | Saitoh | | WO | WO 97/09272 | 3/1997 |
| 2006/0061389 A1 | 3/2006 | Bertin | | WO | WO 97/31139 | 8/1997 |
| 2004/0104129 A1 | 5/2006 | Gu et al. | | WO | WO 97/43473 | 11/1997 |
| 2006/0125033 A1 | 6/2006 | Segal et al. | | WO | WO 98/26871 | 6/1998 |
| 2006/0128049 A1 | 6/2006 | Jaiprakash et al. | | WO | WO 98/39250 | 9/1998 |
| 2006/0183278 A1 | 8/2006 | Bertin et al. | | WO | WO 98/39251 | 9/1998 |
| 2006/0193093 A1 | 8/2006 | Bertin et al. | | WO | WO 98/42620 | 10/1998 |
| 2006/0204427 A1 | 9/2006 | Ghenclu et al. | | WO | WO-98/44593 | 10/1998 |
| 2006/0231865 A1 | 10/2006 | Rueckes et al. | | WO | WO 98/48456 | 10/1998 |
| 2006/0237805 A1 | 10/2006 | Segal et al. | | WO | WO 99/06618 | 2/1999 |
| 2006/0237857 A1 | 10/2006 | Bertin et al. | | WO | WO 00/09443 | 7/1999 |
| 2006/0250843 A1 | 11/2006 | Bertin et al. | | WO | WO 00/08650 | 8/1999 |
| 2006/0250856 A1 | 11/2006 | Bertin et al. | | WO | WO 99/47570 | 9/1999 |
| 2006/0255834 A1 | 11/2006 | Bertin et al. | | WO | WO 99/48810 | 9/1999 |
| 2006/0276056 A1 | 12/2006 | Ward et al. | | WO | WO 99/58748 | 11/1999 |
| 2007/0015303 A1 | 1/2007 | Bertin et al. | | WO | WO 99/65821 | 12/1999 |
| | | | | WO | WO 00/09443 | 2/2000 |
| FOREIGN PATENT DOCUMENTS | | | | WO | WO 00/17101 | 3/2000 |
| | | | | WO | WO 00/19494 | 4/2000 |
| DE | 19504967 | 8/1996 | | WO | WO 00/63115 | 4/2000 |
| DE | 19644121 | 5/1997 | | WO | WO 00/73204 | 5/2000 |
| DE | 19929179 | 1/2001 | | WO | WO 01/03208 | 6/2000 |
| EP | 0 217 023 A2 | 4/1987 | | WO | WO 00/44094 | 7/2000 |
| EP | 0 269 225 A2 | 6/1988 | | WO | 2O 00/48195 | 8/2000 |
| EP | 0 269 225 A3 | 6/1988 | | WO | WO-00/9841 | 8/2000 |
| EP | 441409 A3 | 7/1988 | | WO | WO 01/18246 | 8/2000 |
| EP | 441409 B1 | 7/1988 | | WO | WO 01/23303 | 8/2000 |
| EP | 0 269 716 A2 | 12/1988 | | WO | WO 00/63115 | 10/2000 |
| EP | 0 296 716 A3 | 12/1988 | | WO | WO 00/73204 | 12/2000 |
| EP | 0 315 392 A2 | 5/1989 | | WO | WO 01/03208 | 1/2001 |
| EP | 0 315 392 A3 | 5/1989 | | WO | WO 01/03208 A1 * | 1/2001 |
| EP | 426282 B1 | 8/1990 | | WO | WO 02/37500 | 5/2001 |
| EP | 0262282 | 5/1991 | | WO | WO 01/44796 | 6/2001 |

| | | |
|---|---|---|
| WO | WO 02/19420 | 8/2001 |
| WO | WO 02/38496 | 11/2001 |
| WO | WO 02/42204 | 11/2001 |
| WO | WO 02/48701 | 12/2001 |
| WO | WO 02/048822 | 12/2001 |
| WO | WO 02/054505 | 12/2001 |
| WO | 2O 02/060813 | 1/2002 |
| WO | WO 02/059898 | 1/2002 |
| WO | WO 02/060812 | 1/2002 |
| WO | WO-03/091486 | 11/2003 |
| WO | WO-04/039893 | 5/2004 |
| WO | WO-04/065655 | 8/2004 |
| WO | WO-04/065657 | 8/2004 |
| WO | WO-04/065671 | 8/2004 |

OTHER PUBLICATIONS

"Double Sided 4Mb SRAM Coupled Cap PBGA Card Assembly Guide." International Business Machines Crop. (IBM), 1998.
Tyagi et al. "A 130nm Generation Logic Technololgy Featuring 70nm Transistors, Dual Vt Transistors and 6 Layers of Cu Interconnects." Portland Technology Development.
"Preliminary: 8Mb (256K×36 & 512K×18) and 4Mb (128K×36 & 256K×18) [IBM0418A8CBLBB, IBM0418A4CBLBB, IBM0436A8CBLBB, IBM0436A4CBLBB]." International Business Machines Corp. (IBM), 1998.
Wei, Chengyu et al. "Temperature and Stain-Rate Dependent Plastic Deformation of Carbon Nanotube."
"Package Mechanicals for USAR ICs." USAR Systems, Inc., 1998.
Dipert, Brian. "Exotic Memories, Diverse Approaches." EDN Magazine, Apr. 26, 2001, 56-70.
Duan, Xiangfeng. "Indium Phosphide Nanowires as Building Blocks for Nanoscale Electronic and Optoelectronic Devices," Nature (2001); 409: 66-69.
Yang. "A High Performance 180 nm Generation Logic Technology." Portland Technology Development.
Dai, Hongjie. "Controlled Chemical Routes to Nanotube Architectures, Physics, and Devices." The Journal of Physical Chemistry B (1999); 103: 11246-11255.
Callaby, D. Roy et al. "Solid State Memory Study Final Report." National Media Lab, Feb. 1994.
Cui, Yi. "Doping and Electrical Transport in Silicon Nanowires." The Journal of Physical Chemistry B (2000); vol. 104, No. 22: 5213-5216.
Li, Mingtao et al. "Direct Three-dimensional Patterning Using Nanoimprint Lithography." Applied Physics Letters (2000); vol. 78, No. 21: 3322-3324.
"8 Mb Synchronous Communication SRAM (IBM0418A86LQKA, IBM0418A86SQKA, IBM0436A861QKA, IBM436A86SQKA)." International Business Machines Corp. (IBM), 1999.
Dipert, Brian. "Memory Cards: Designing with a Full Deck." EDN Magazine. May 25, 2000.
Schönenberger, Christian et al. "Physics of Multiwall Carbon Nanotubes." Physics World. Apr. 4, 2000.
Whatmore, Roger W. "Nanotechnology." Ingenia. Feb. 2000.
"Nanochip NC800SX, 0.8 Gbyte Molecular Memory IC (R/W), Nanochip NC200SX, 0.2 Gbyte Molecular Memory IC (R/W), Nanochip NCM4510SX, Molecular Array Read/write Engine, Low Voltage Thermal Actuated, Dynamic Media Series M2, Nanochip NC4525DX, A/D-D/A Interface, Preliminary Specifications, Advance Information, (C) 1996-2000 Nanochip Document NCM2230500."
Odom, Teri Wang et al. "Atomic Structure and Electronic Properties of Single-Walled Carbon Nanotubes." Nature (1998); 391: 62-64.
Ouyang, Min. "Atomically Resolved Single-Walled Carbon Nanotube Intramolecular Junctions." Science (2001); 291: 97-100.
Odom, Teri Wang et al. "Magnetic Clusters on Single-Walled Carbon Nanotubes: The Kondo Effect in a One-Dimensional Host." Science (2000); 290: 1549-1552.
Wong, Eric et al. "Nanobeam Mechanics: Elasticity, Strength, and Toughness of Nanorods and Nanotubes." Science (1997); 277: 1971-1975.

Hu, Jiangtao et al. "Controlled Growth and Electrical Properties of Heterojunctions of Carbon Nanotubes and Silicon Nanowires." Nature (1999); 399: 48-51.
Rueckers, Thomas et al. "Carbon Nanotube-Based Nonvolatile Random Access Memory for Molecular Computing." Science (2000); 289: 97-7.
Kim, Philip et al. "Nanotube Nanotweezers." Science (1999); 286: 2148-2150.
Huang, Yu et al. "Directed Assembly of One-Dimensional Nanostructures into Functional Networks." Science (2001); 291: 630-33.
cUI, yI ET AL. "Functional Nanoscale Electronic Devices Assembled Using Silicon Nanowire Building Blocks." Science (2001); 291: 851-53.
Oullette, Jennifer. "Exploiting Molecular Self-Assembly." The Industrial Physicist. American Institute of Physics, Dec. 2000.
Peng, Shu et al. "Chemical Control of Nanotube Electronics," Nanotechnology (2000); 11: 57-60.
"The Ultimate Memory Guide," Kingston Technology (1998).
Morales, Alfredo et al. "A Laser Ablation Method for the Synthesis of Crystalline Semiconductor Nanowires." Science (1998); 279: 208-11.
Franklin, Nathan R. and Hongjie Dai, "An Enhanced CVD Approach to Extensive Nanotube Networks with Directionality," Advanced Materials (2000): 890-894.
Kong, Jing; Chongwu Zhou; Erhan Yenilmez; Hongjie Dai. "Alkaline metal -doped n-type semiconducting nanotubes as quantum dots." ApplieDPhysics Letters (Dec. 11, 2000): 3977-3979.
Tombler, Thomas W.; Chongwu Zhou; Jing Kong; Hongjie Dai. "Gating Individual nanotubes and crossed with scanning probes," Applied Physics Letters (Apr. 24, 2000): 2412-2414.
Zhou, Chongwu: et al. "Electrical measurements of individual semiconducting single-walled carbon nanotubes of various diameters." Applied Physics Letters (Mar. 20, 2000): 1597-1599.
Zhang, Y. and Hongjie Dai. "Formation of metal nanowires on suspended single-walled carbon nanotubes." Applied Physics Letters (Nov. 6, 2000): 3015-3017.
Chen, Robert J. et al. "Molecular photodesorption from single-walled carbon nanotubes." Applied Physics Letters (Oct. 1, 2001): 2258-2260.
Zhang, Y.et al. "Electric-field-directed growth of aligned single-walled carbon nanotubes." Applied Physics Letters (Nov. 5, 2001): 3155-3157.
Zhang, Y. et al. "Metal coating on suspended carbon nanotubes and its Implication to metal-tube interaction." Chemical Physics Letters (Nov. 24, 2000): 35-41.
Chen, Robert J. et al. "Noncovalent Sidewall Functionalization of Single-Walled Carbon Nanotubes for Protein Immobilization." American Chemical Society (2001): 3838-3839.
Li, Yiming et al. "Growth of Single-Walled Carbon Nanotubes from Discrete Catalytic Nanoparticles of Various Sizes." American Chemical Society (2001).
Cassell, Alan M. et al. "Large Scale CVD Synthesis of Single-Walled Carbon Nanotubes." American Chemical Society (1999): 6484-6492.
Fan, Shoushan et al. "Carbon nanotube arrays on silicon substrates and their possible application." Physica E (2000): 179-183.
Liu, Lei et al. "Controllable Reversibility of an sp2 to sp3 Transition of a single Wall Nanotube under the Manipulation of an AFM Tip." Physical Review Letters (May 22, 2000): 4950-4953.
Kong, Jing et al. "Quantum Interference and Ballistic Ballistic Transmission in Nanotube Electron Waveguides." Physical Review Letters Sep. 2001); 87, 106801(4).
Liu, C. et al. "Synthesis of Macroscopically Long Ropes of Well-Aligned Singel-Walled Carbon Nanotubes." Advanced Materials (Aug. 16, 2000); 12, 1190-1192.
Kiang, Ching-Hwa. "Growth of Large-Diameter Single-Walled Carbon Nanotubes." American Chemical Society (2000); 104, 2454-2456.
Cheung. Chin Li et al. "Growth and fabrication with single-walled carbon nanotube probe microscopy tips." Applied Physics Letters (2000); 76, 3136-3138.

Bozovic, Dolores et al. "Electronic properties of mechanically induced kinds on single-walled carbon nanotubes." *Applied Physics Letters* (Jun. 4, 2001); 78, 3693-3695.

Hafner, Jason H. et al. "High-Yield Assembly of Individual Single-Walled Carbon Nanotube Tips for Scanning Prone Microscopies." *The Journal of Physical Chemistry* (Feb. 1, 2001); 105, 743-746.

Hafner, J.H. et al. "Structural and functional Imaging with carbon nanotube AFM probes." *Progress in Biophysics & Molecular Biology* (2001); 77, 73-110.

Jorio, A. et al. "Joint density of electronic states for one isolated single-wall carbon nanotube studied by resonant Raman scattering." *Physical Review B* (2001); 63: 24541(4).

Filho, A. G. Souza et al. "Electronic transition energy Eii for an isolated (n, m) single-wall carbon nanotube obtained by anti-Stokes resonant Raman intensity ratio." *Physical Review* (2002); 63, 241404(4).

Saito, R. et al. "Chirality-dependent G-band Raman Intensity of carbon nanotubes." *Physical Review* (2001); 64, 085312(7).

Jorio, A. et al. "Structural (n, m) Determination of Isolated Single-Wall Carbon Nanotubes by Resonant Raman Scattering." *Physical Review Letters* (Feb. 5, 2001); 86, 1118-1121.

Woolley, Adam T. et al. "Structural biology with carbon nanotube AFM probes." *Chemistry & Biology* (2000); 7, R193-204.

Li, Yan et al. "Preparation of Nonodispersed Fe-Mo Nanoparticles as the Catalyst for CVD Synthesis of Carbon Nanotubes." *Chemical Material* (2001): 13; 1008-1014.

Rao, C. N. R. et al. "Nanotubes." *CHEMPHYCHEM* (2001); 2, 78-105.

Nerushev, Oleg A. et al. "Carbon nanotube films obtained by thermal chemical vapor deposition." *Journal of Chemistry Materials* (2001); 11, 1122-1132.

Flahaut, E. et al. "Synthesis of single-walled carbon nanotube-Co-MgO composite powders and extraction of the nanotubes." *Journal of Chemical Materials* (2000); 10, 249-252.

Dresselhaus, Mildred S. and Morinobu Endo. "Relation of Carbon Nanotubes to Other Carbon Materials." *Topics in applied Physics* (2001); 80, 1-9.

Dresselhaus, Mildred S. and Morinobu Endo. "Relation of Carbon Nanotubes to Other Carbon Materials." *Topics in Applied Physics* (2001); 80, 11-28.

Dal, Hongjie. "Nanotube Growth and Characterization." *Topics in Applied Physics* (2001); 80, 29-53.

Charlier, Jean-Chrisophe and sumio Lijima. "Growth Mechanisms of Carbon Nanotubes." *Topics in Applied Physics* (2001); 80, 55-81.

Tenne, Richard and Alex K. Zettl. "Nanotubes from Inorganic Materials." *Topics in applied Physics* (2001); 80, 81-112.

Louie Steven G. "Electronic Properties, Junctions, and Defects of Carbon Nanotubes." *Topics in applied Physics* (2001); 80, 113-145.

Yao, Zhen et al. "Electrical Transport Through Single-Wall Carbon Nanotubes." *Topics in Applied Physics* (2001); 80, 147-171.

Odom, Teri Wang et al. "Scanning Probe Microscopy Studies of Carbon Nanotubes." *topics in Applied Physics* ((2001); 80, 173-211.

Saito, Riichiro and Hiromichi Kataura. "Optical Porperties and Raman Spectroscopy of Carbon Nanotubes." *topics in Applied Physics* (2001); 80, 213-247.

Fink, Joerg H. and Philippe Lambin. "Electron Spectroscopy Studies of Carbon Nanotubes." *Topics in applied Physics* (2001); 80, 247-272.

Hone, James. "Phonons and Thermal Properties of Carbon Nanotubes." *Topics of Applied Physics* (2001); 80, 273-286.

Yakobson, Bois I. And Phaedon Avouris. "Mechanical Properties of Carbon Nanotubes." *Topics in Applied Physics* (2001); 80, 287-327.

Forro, Laszio and Christian Schoenenberger. "Physical Properties of Multi-wall Nanotubes." *Topics in Applied Physics* (2001); 80, 329-391.

Ajayan, Pullckel M. and Otto Z. Zhou. "Application of Carbon Nanotubes." *Topic in Applied Physics* (2001); 80, 391-425.

Kong, J. et al. "Synthesis, integration, and electrical properties of individual single-walled carbon nanotubes." *Applied Physics A* (1999); 69, 305-308.

Dai, Hongjie et al. "Exploiting the properties of carbon nanotubes for nanolithography." *Applied Physics Letters* (Sep. 14, 1998); 73, 1508-1510.

Soh, Hyongsok T. et al. "Integrated nanotube circuits," *Applied Physics Letters* (Aug. 2, 1999); 75, 627-629.

Bozier, C.O., et al., "Fabrication and Microwave Performance of the Permeable Base Transistor," *IEEE Tech. Dig. Int. Electron Devices Meeting* (1979) 384.

Cheng, H. M. et al. "Large scale and low-cost synthesis of single-walled carbon nanotubes by the catalytic pyrolysis of hydrocarbons." *Applied Physics Letters* (Jun. 22, 1998); 72, 3282-3284.

Shim, Moonsub et al. "Polymer Functionalization for Air-Stable n-Type Carbon Nanotube Field-Effect Transistors." *Journal of American Chemical Society* (2001); 123, 11512-11513.

Haddon, R. C. "C70 Thin Film Transistors." *Journal of the American Chemical Society* (1999); 118, 3041-3042.

Hafner, Jason H. et al. "Direct Growth of Single-Walled Carbon Nanotube Scanning Probe Microscopy Tips." *Journal of the American Chemical Society* (1999); 121, 9750-9751.

Hafner, Jason H. et al. "Growth of nanotubes for probe microscopy tips." *Scientific Correspondence* (Apr. 29, 1999); 398, 761, 762.

Bekyarova, E. et al. "Oxidation and Porosity Evaluation of Budlike Single-Wall Carbon Nanohorn Aggregates." *American Chemical Society* (2002).

Hafner, Jason H. et al. "Catalytic growth of single-wall carbon nanotubes from metal particles." *Chemical Physics Letters* (Oct. 30, 1998); 296, 195-202.

Cheng, H. M. et al. "Large-scale and low-cost synthesis of single-walled carbon nanotubes by the catalyst pyrolysis of hydrocarbons." *Applied Physics Letters* (Jun. 22, 1998); 72, 3282-3284.

Li, Yan et al. "Preparation of Nondispersed Fe-Mo Nanoparticles as the Catalyst for CVD Synthesis of Carbon Nanotubes." *Chemical Material* (2001); 13, 1008-1014.

Kiang, Ching-Hwa. "Growth of Large-Diameter Singel-Walled Carbon Nanotubes." *Journal of Physical Chemistry A.* (2000); 104, 2454-2456.

Nerushev, Oleg A. et al. "Carbon nanotube films obtained by thermal chemical vapour deposition." *Journal of Material Chemistry* (2001); 11, 1122-1132.

Kong, J. et al. "Synthesis, integration, and electrical properties of individual single-walled carbon nanotubes." *Applied Physics A* (1999); 69 305-308.

Zhou, Chongwu et al. "Electrical measurements of individual semiconducting single-walled carbon nanotubes of various diameters." *Applied Physics Letters* (Mar. 20, 2000); 76, 1597-1599.

Yu, et al., *J. Phys. Chem. B,* 105:6831-6837 (2001).

Berber, S., *Phys. Rev. Lett,* 84, 4613 (2000).

Bahr, Jeffrey L. and James. M. Tour. "Highly Functionalized Carbon Nanotubes Using in Situ Generated Diazonium Compounds." *Chemical Materials* (2001); 13, 3823-3824.

Pelgney, Alain et al. "A Study of the Formation of Single- and Double-Walled Carbon Nanotubes by a CVD Method." *Journal of Physical Chemistry B* (2001); 105, 9699-9710.

Yao, B. D. and N. Wang. "Carbon Nanotube Arrays Prepared by MWCVD." *Journal of Physical Chemistry* (2001); 105, 11395-11398.

Ago, Hiroki et al. "Gas-Phase Synthesis of Sigle-wall Carbon Nanotubes from Colloidal Solution of Metal Nanoparticles." *Journal of Physical Chemistry B* (Nov. 1, 2001); 105, 10453-10456.

Li, Yiming et al. "Growth of Single-Walled Carbon Nanotubes from Discrete Catalytic Nanoparticles of Various Sizes." *Journal of Physical Chemistry B* (2001); 105, 11424-11431.

Ng, Hou Tee et al. "Soft-Lithography-Mediated Chemical Vapor Deposition of Architectured Carbon Nanotube Networks on Elastomeric Polymer." *American Chemical Society* (2001).

Derycke, V. et al. "Carbon Nanotube Inter-and Intramolecular Logic Gates." *Nano Letters* (Sep. 2001); 1, 453-456.

Erkoc et al., *Int. J. Modem Phys. C,* 12:865-870 (2001).

Benerjee, Sarbajit and Stanislaus S. Wong. "Functionalization of Carbon Nanotubes with a Metal-Containing Molecular Complex." *Nano Letters* (2001); O, A-E.

Reynoso, J. 391PGA Drawings (3): Project No. 32639103. *Kyocera America, Inc.* (Apr. 12, 1994).

Diehl, Michael R. et al. "Self-Assembled, Deterministic Carbon Nanotube Wiring Networks." *Angew. Chemical International Edition* (2002); 41, 353-356.

Table of Contents for Semiconductor Consulting Services (1999).

Sidorov, S. N. et al. "Cobalt Nanoparticle Formation In the Pores of Hyper-Cross-Linked Polystyrene." *Chemical Materials* (1999); 11, 3210-3215.

Brown, David A. et al. "Kinetics of Inron(III) Chelation from Polynuclear Oxo-Hydroxy Aggregates by Hydroxamic Acids." *Inorganic Chemistry* (1999); 38, 5198-5202.

Douglas, Trevor and Vistoria T. Stark. "Nanophase Cobalt Oxyhydroxide Mineral Synthesized within the Protein Cage of Ferritin." *Inorganic Chemistry* (2000); 39, 1828-1830.

Hatzikonstantinidou et al., Phys. Scripta 54: 226-229 (1994).

Cao, Anyuan et al. "Macroscopic Three-Dimensional Arrays of Fe Nanoparticles Supported in Aligned Carbon Nanotubes." *The Journal of Physical Chemistry B* (2001); 105, 11937-11940.

Li, Shoutian et al. "Semiconductor Nanoparticles in Contact: Quenching of the Photoluminescence from Silison Nanocrystals by $WO_3$ nanoparticles Suspended in Solution." *The Journal of Physical Chemistry B* (1998); 102, 7319-7322.

Zhang, Shengjun et al. "Select Pathways to Caron Nanotube Film Growth." *Advanced Materials* (Dec. 3, 2001); 13, 1767-1770.

Wei, B. Q. et al. "Organized assembly of carbon nanotubes." *Nature* (Apr. 4, 2002); 416, 495-496.

Zhao, Y.-P. et al. "Frequency-dependent electrical transport in carbon nanotubes." *Physical Reveiw B* (2001); 64, 201402(4).

Zhu, H. W. et al. "Direct Synthesis of Long Singel-Walled Carbon Nanotube Strands." *Science* (May 3, 2002); 296, 884-886.

Ajayan, P. M. et al. "Nanotubes in a Flash—Ignition and Reconstruction." *Science* (Apr. 26, 2002); 296, 705.

Franklin, Nathan R. et al. "Patterned growth of single-walled carbon nanotubes on full 4-inch wafers." *Aplied Physics Letters* (Dec. 31, 2001); 79, 4571-4573.

Fan, Shoushan et al. "Self-Oriented Regular Arrays of Carbon Nanotubes and Their Field Emission Properties." *Science* (Jan. 22, 1999); 283, 512-514.

Sohn, Jung Inn, et al., "Patterned selective growth of carbon nanotubes and large field emission from vertically well-aligned carbon nanotube field emitter arrays," *Appl. Phys. Letters* (Feb. 12, 2001); 78, 901-903.

Postma, Henk W. C. et al. "Manlpulation and Imaging of Individual Single-Walled Carbon Nanotubes with an Atomic Force Microscope." *Advanced Materials* (Sep. 1, 2000); 12, 1299-1302.

Chem, J. et al., "Large On-Off Ratios and Negative Differential Resistance in a Molecular Electronic Device," *Science*, vol. 286, Nov. 19, 1999, pp. 1550-151.

Collier, C.P., et al., "Electronically Configurable Molecular-based Logic Gates," *Science*, vol. 285, Jul. 16, 1999, pp. 391-394.

"IBM Builds Tiny Transistor that Beats Silicon", *Technology–Reuters,* Yahoo, May 16, 2002.

Yao, Z., et al, *Phys. Rev. Lett*, 84, 2941 (2000).

Tans, Sander J., "Room-temperature transistor based on a single carbon nanotube," Nature, May 1998, vol. 393, pp. 49-52.

Dillon, Anne C., "A Simple and Complete Purification of Single-Walled Carbon Nanotube Materials," Advanced Materials, 1999, vol. 11, pp. 1354-1358.

Cleland, A.N., "Single-crystal aluminum nitride nanomechanical resonators," Applied Physics Letters, Sep. 24, 2001, vol. 79, pp. 2070-2072.

Ramsperger, U., "Fabrication and lateral electronic transport measurements of gold nanowires," Applied Physics Letters, Jan. 1, 2001, vol. 78, pp. 85-87.

Calleja, M., "Fabrication of gold nanowires on insulating substrates by field-induced mass.

Kluth, P., "Fabrication of epitaxial $CoSi_2$ nanowires," Applied Physics Letters, Aug. 6, 2001, vol. 79, pp. 824-826.

Zhang, Y., "Formation of metal nanowires on suspended single-walled carbon nanotubes," Applies Physics Letters, Nov. 6, 2000, vol. 77, pp. 3015-3017.

Berry, A.D., "Fabrication of GaAs and InAs wires in nanochannel gas," Applied Physics Letters, Nov. 4, 1996, vol. 69, pp. 2846-2848.

Li, Jian-Long, "Spontaneous formation of ordered indium nanowire array on Si(000)," Applied Physics Letters, Oct. 22, 2001, vol. 79, pp. 2826-2828.

Jorritsma, J., "Fabrication of large arrays of metallic nanowires on V-grooved substrates," Applied Physics Letters, Sep. 4, 1995, vol. 67, pp. 1489-1491.

Sekiba, Daiichiro, "Fabrication of stable nanopatterns on metals," Applied Physics Letters, Sep. 30, 2002, vol. 81, pp. 2632-2634.

Yin, A. J., "Fabrication of highly ordered metallic nanowire arrays by electrodeposition," Applied Physics Letters, Aug. 31, 2001, vol. 79, pp. 1039-1041.

He, J. Z., "Dispersion, refinement, and manipulation of single silicon nanowires," Applied Physics Letters, Mar. 11, 2002, vol. 80, pp. 1812-1814.

Franklin, Nathan R., "Integration of suspended carbon nanotube arrays into electronic devices and electromechanical systems," Applied Physics Letters, Jul. 29, 2002, vol. 81, pp. 913-915.

Homma, Yoshikazu, "Growth of suspended carbon nanotube networks on 100-nm-scale silicon pilliars," Applied Physics Letters, Sep. 16, 2002, vol. 81, pp. 2261-2263.

Yenilmez, Erhan, "Wafer scale production of carbon nanotube scanning probe tips for atomic force microscopy," Applied Physics Letters, Mar. 25, 2002, vol. 80, pp. 2225-2227.

Sax, Harald, "Polysilicon Overfill Etch Back Using Wet Chemical Spin-process Technology," 7 pgs.

Dinaro, Joanna, "Analysis of an Elementary Reaction Mechanism for Benzene Oxidation in Supercritical Water, Combustion Institute," 2000, vol. 28, pp. 1529-1536.

Monthioux, M., "Sensitivity of single-wall carbon nanotubes to chemical processing: an electron microscopy investigation," Carbon, 2001, vol. 39, pp. 1251-1272.

Hou, P. X., "Multi-stepp purification of carbon nanotubes," 2002 Elsevier Science Ltd., Mar. 8, 2001, vol. 40, pp. 81-85.

Avouris, P., "Carbon nanotube electronics," Carbon, 2002, vol. 40, pp. 429-445.

Chen, Bin, "Heterogeneous Single-Walled Carbon Nanotube Catalyst Discovery and Optimization," Chemical Materials, Dec. 7, 2001, vol. 14, pp. 1891-1896.

Maurin, I., "Carbon Miscibility in the Boron Layers of the $MgB_2$ Superconductor," Chemical Materials, 2002, pp. A-D.

Hyeon-Lee, Jingyu, "Aero-Sol-Gel Synthesis of Nnostructured Silica Powders," Chemical Materials, 1997, vol. 9, pp. 2400-2403.

McEuen, Paul L., Single-Walled Carbon Nanotube Electronics, to be published in the inaugural issue of the IEEE Transactions on Nanotechnology (2002), 9 pgs.

Dürkop, T., "Nanotubes are High Mobility Semiconductors," Department of Physics, University of Maryland, 4 pgs.

Choi, Hee Cheul, "Spontaneous Reduction of Metal Ions on the Sidewalls of Carbon Nanotubes," J. Amer. Chem. Soc., May 7, 2002, pp. A-B.

Bonard, J. et al., "Monodisperse Multiwall Carbon Nanotubes Obtained with Ferritin as Catalyst", Nano Letters, 2002, vol. 2, No. 6, 665-667.

Collins, P., "Engineering Carbon Nanotubes and Nanotube Circuits Using Electrical Breakdown", Science, vol. 292, Apr. 27, 2001, pp. 706-709.

Homma, Y., "Single-Walled Carbon Nanotube Growth on Silicon Substrates Using Nanoparticle Catalysts", Jpn. J. Appl. Phys., vol. 41 (2002), pp. L89-L91.

Snow, E.S. et al., "Random Networks of Carbon Nanotubes as an Electronic Materials." Applied Physics Letters, Mar. 31, 2003, vol. 82, No. 13, 2145-2147.

Bemholc et al., "Mechanical and Electrical Properties of Nanotubes", Annu. Rev. Mater. Res., 32 (2002) 347.

Kaneto, K., et al., "Electrical conductivities of multi-wall carbon nano tubes", Synthetic Metals, Elsevier Science S.A. (1999) vol. 103, pp. 2543-2546.

Ajayan, P.M. et al, "Nanometre-size tubes of carbon," Rep. Prog. Phys., 1997, vol. 60, pp. 1025-1062.

Bradley, K. et al., "Flexible Nanotube Electronics," *Nano Letters,* vol. 3, No. 10, pp. 1353-1355. 2003.

Casavant, M.J. et al, "Neat Macroscopic membranes of aligned carbon nanotubes," *Journal of Appl. Phys.,* Feb. 15, 2003, vol. 93, No. 4, pp. 2153-2156.

Chen, R.J. et al., "Noncovalent sidewall functionalization of single-walled carbon nanotubes for protein immobilization," *J. Am. Chem. Soc.*, vol. 123, p. 3838-3839, 2001.

Choi, W.B. et al, "Carbon-nanotube-based nonvolatile memory with oxide-nitride-oxide film and nanoscale channel," *Appl. Phys. Lett.*, Jan. 13, 2003, vol. 82, No. 2, pp. 275-277.

Cui, J.B. et al. "Carbon Nanotube Memory Devices of High Charge Storage Stability," *Appl. Phys. Lett.*, Oct. 21, 2002, vol. 81, No. 17, pp. 3260-3262.

Dequesnes, M. et al, "Simulation of carbon nanotube-based nanoelectromechanical switches," *Computational Nanoscience and Nanotechnology*, 2002, pp. 383-386.

Desai et al., "Freestanding Carbon Nanotube Specific Fabrication," Proc. of 2005 5th IEEE Conf., Nanotech., Nagoya, Japan, pp. 1-4, Jul. 2005.

Farajian, A. A. et al, "Electronic transport through bent carbon nanotubes: Nanoelectromechanical sensors and switches," *Phys. Rev. B*, 2003, vol. 67, pp. 205423-1-205423-6.

Filho, A. G. Souza et al. "Electronic transition energy $E_{ii}$ for an isolated $(n,m)$ single-wall carbon nanotube obtained by anti-Stokes/Stokes resonant Raman intensity ratio," Physical Review (2002); 63, 241404(4).

Fischer, J.E. et al, "Magnetically aligned single wall carbon nanotube films: Preferred orientation and anisotropic transport properties," *Journal of Appl. Phys.*, Feb. 15, 2003, vol. 93, No. 4, pp. 2157-2163.

Hafner, Jason H. et al. "Growth of nanotubes for probe microscopy tips," Scientific Correspondence (Apr. 29, 199); 398, 761-762.

Kaneto, K. et al., "Electrical conductivities of multi-wall carbon nanotubes," Synsthetic Metals, Elsevier Science S.A. (1999), vol. 103, pp. 2543-2546.

Kinaret, J.M. et al,, "A Carbon-nanotube-based nanorelay," *Applied Physics Letters*, Feb. 24, 2003, vol. 82, No. 8, pp. 1287-1289.

Lee, K.H. et al, "Control of growth orientation for carbon nanotubes," *Appl. Phys. Lett.*, Jan. 20, 2003, vol. 82, No. 3, pp. 448-450.

Li, Q., et al., "High-Density Growth of Single-Wall Carbon Nanotubes on Silicon by Fabrication of Nanosized Catalyst Thin Films," Chem. Mater. (2002), 14, 4262-4266; Published on web Sep. 11, 2002.

Martel, R., et al, "Carbon Nanotube Field-Effect Transistors and Logic Circuits," *DAC 2002*, Jun. 10-12, 2002, vol. 7.4, pp. 94-98.

O'Connell, Michael J., "Reversible water-solubilization of single-walled carbon nanotubes by polymer wrapping," Chemical Physics Letters, 2001, vol. 342, pp. 265-271.

Onoa, G.B. et al., "Bulk production of singly dispersed carbon nanotubes with prescribed lengths," *Nanotechnology*, vol. 16, pp. 2799-2803, 2005.

Shim, Moonsub et al. "Polymer Functionalization for Air-Stable n-Type Carbon Nanotube Field-Effect Transistors," Journal of American Chemical Society (2001) 123, 11512-11513.

Sreekumar, T.V. et al, "Single-2111 Carbon Nanotube Films," *Chem. Mater.*, 2003, vol. 15, pp. 175-178.

Stadermann, M. et al., "Nanoscale study of conduction through carbon nanotube networks," *Phys. Rev. B 69*, 201402(R), 2004.

Tour, J.M. et al, "NanoCell Electronic Memories," *J. Am. Chem. Soc.*, 2003, vol. 125, pp. 13279-13283.

Verissimo-Alves, M. et al, "Electromechanical effects in carbon nanotubes: Ab initio and analytical tight-binding calculations," *Phys. Rev. B.*, 2003, vol. 67, pp. 161401-1-161401-4.

Wolf, S., "Silicon Processing for the VLSI Era; vol. 2—Process Integration Multi-Level-Interconnect Technology for VLSI and ULSI," *Section 4.3 Materials for Multilevel Interconnect Technologies, Lattice Press*, Sunset Beach, 1990, pp. 189-191.

Wolf, S., "Silicon Processing for the VLSI Era; vol. 2—Process Integration," Section 4.7 Manufacturing Yield and Reliability Issues of VLSI Interconnects, Lattice Press, Sunset Beach, 1990, pp. 260-273.

Yao, B. D. and et al. "Carbon Nanotube Arrays Prepared by MWCVD," Journal of Physical Chemistry (2001); 105, 11395-11398.

Yu, Z. et al., "(n,m) Structural Assignments and Chirality Dependence in Single-Wall Carbon Nanotube Raman Scattering," J. Phys. Chem. B, 105:6831-6837 (2001).

Zhan, W. et al, "Microelectrochemical Logic Circuits," *J. Am. Chem. Soc.*, 2003, vol. 125, pp. 9934-9935.

Zhang, Y. et al., "Formation of metal nanowires on suspended single-walled carbon nanotubes," *Appl. Phys. Lett.*, vol. 77, No. 19, p. 3015-3017, Nov. 2000.

Zheng, Bo, "Efficient CVD Growth of Single-Walled Carbon Nanotubes on Surfaces Using Carbon Monoxide Precursor," Nano Letters, vol. 0, No. 0, A-D, p. 3.1, 2002.

Kong, J., et al., "Chemical Vapor Disposition of Methane for Single-Walled Carbon Nanotubes," Chemical Physics Letters, 292, 567, 1998.

Li., Y., et al., "Growth of Single-Walled Carbon Nanotubes from Discrete Catalytic Nanoparticles of Various Sizes." *The Journal of Physical Chemistry B* (2001); 105, 11424.

Dai, Hongjie. "Controlled Chemical Routes to Nanotube Architectures, Physics, and Devices." *the Journal of Physical Chemistry B* (1999); 103: 11246-11255.

Colomer, J.-F., et al., "Characterizartion of Single-Walled Carbon Nanotubes Produced by CCVD Method." *Chemical Physics Letters* (2001); 345, 11-17.

Li, Y. et al., "Preparation of Monodispersed Fe-Mo Nanoparticles as the Catalyst for CVD Synthesis of Carbon Nanotubes." Chem. Mater., 12. 1008, 2001.

Cassell, A., et al., "Large Scale Synthesis of Single-Walled Carbon Nanotubes." *The Journal of Physical Chemistry B* (1999); vol. 103, No. 22: 6484-6492.

Cassell, A., et al., "Directed Growth of Free-Standing Single-Walled Carbon Nanotubes." *Journal of the American Chemical Society* (1999); vol. 121, 7975-7976.

Delzeit, L., et al., "Multilayered Metal Catalysts for Controlling the Density of Single-walled Carbon Nanotube Growth." Chemical Physics Letters, 348, 368, 2001.

Wei, Y., et al., "Effect of Catalyst Film Thickness on Carbon Nanotube Growth by Selective Area Chemical Vapor Deposition." *Applied Physics Letters* (2001); vol. 78, No. 10: 1394-1396.

Su., M., et al., "A Scalabel Method for the Synthesis of Single-Walled Carbon Nanotubes with High Catalyst Productivity." *Chemical Physics Letters* (2000); vol. 322, 231-326.

Harutyunyan, A., et al., "CVD Synthesis of Single Wall Carbon Nanotubes under 'Soft' Conditions." *NanoLetters* vol. 2c No. 5 525 (2002); Published on web Mar. 27, 2002.

Li, Q., et al., "High-Density Growth of Singel-Wall Carbon Nanotubes on Silicon by Fabrication of Nanosized Catalyst Thin Films." *Chem. Mater.* (2002), 14, 4262; Published on web Aug. 11, 2002.

Homma, Y., et al., "Growth of Suspended Carbon Nanotube Networks on 100nm-Scale Silicon Pillars." *Applied Physics Letters.* (2002); vol. 81 No. 12, 2261-2263.

Javey, A., et al., "Carbon Nanotube Transistor Arrays for Multistage Complementary Logic and Ring Oscillators." *Nano Letters* (2002); vol. 2 No. 9 929-932. Published on web Jul. 31, 2002.

Kong, J., et al., "Syntheses of Individual Single-Walled carbon Nanotubes on Patterned Wafers." *Nature* (1998); 395: 878-881.

Chen, B., et al., "Heterogeneous Single-Walled Carbon Nanotube Catalyst Discovery and Optimization." *Chem. Mater.* (2002); vol. 14, 1891-1896.

Yenilmez, E., et al., "Wafer Scale Production of carbon Nanotube Scanning Probe Tips for Atomic Force Microscopy." *Applied Physics Letters.* (2002); vol. 80 No. 12, 2225-2227.

Peigney, A., et al., "A Study of the Formation of Single-and-Double-Walled carbon Nanotubes by a CVD Method." *The Journal of Physical Chemistry B* (2001); 105: 9699-9710.

Franklin, N., et al., "Integration of Suspended carbon Nanotube Arrays into Electronic Devices and Electroechanical Systems." *Applied Physics Letters* (2002); vol. 81 No. 5, 913-905.

Collins, P., et al., "Engineering Carbon Naotubes and Nanotube Circuits Using Electrical Breakdown." Science (2001); 292: 706-709.

Kim, W., et al., "Synthesis of Ultralong and High Percentage of Semiconduction Single-walled Carbon Nanotubes." *Nano Letters* (2002); vol. 2 No. 7 703-708. Published on web Jun 1, 2002.

Reuckes, T., et al., "Carbon Nanotube-Based Nonvolatile Random Access Memory for Molecular Computing." *Science,* vol 289, 97-97, Jul 7, 2000.

Liu, et al., "Organizing Single-Walled Carbon Nanotubes on Gold Using a Wet Chemical Selt-Assembling Technique, Langmuir," Apr. 18, 2000, vol. 16, No. 8, 3659-3573.

Soh, et al., "Integrated Nanotube Circuits: controlled growth and ohmic contacting of singel-walled carbon nanotubes", Applied Physics Letters, Aug. 2, 1999, vol. 75, No. 5, 627-629.

Zheng et al, "Chemical Vapor Deposition Growth of Well-Aligned Carbon Nanotube Patterns on Cubic Mesoporous Silica Films by Soft Lithography", Chemistry of Materials, Jun. 9, 2001, vol. 13, 2240-2242.

Huang, et al., "Patterned Growth of Well-Aligned Carbon Nanotubes: A Soft-Lithographic Approach", The Journal of Physical Chemistry B., Mar. 16, 2000, vol. 104, No. 10, 2193-2196.

Chattopadhyay, et al., "Metal-Assisted Organization of Shortened Carbon Nanotubes in Monolayer and Mulilayer Forest Assembles", Journal of the American Chemical Society, Aug. 28, 2001, vol. 123, 9451-9452.

Snow, E.S. et al., "Chemical Detection with a Single-Walled Carbon Nanotube Capacitor", Science, Mar. 25, 2005, pp. 1942-1945, vol. 307.

Snow, E.S. et al., "Chemical Detection Using Single-Walled Carbon Nanotubes", Naval Research Laboratory, Washington, DC 20375, pp. 376-379.

Deng, S. Z., "Synthesis of silicon carbide nanowires in a catalyst-assisted process," Chemical Physics Letters, Apr. 26, 2002, vol. 356, pp. 511-514.

Zhang, R. Q., "Silicon nanotubes: Why not?," Chemical Physics Letters, 2002, vol. 364, pp. 251-258.

Lei, Y., "Fabrication, characterization and Raman strudy of $TiO_2$ nanowire arrays prepared by anodic oxidative hydrolysis of $TiCl_3$," Chemical Physics Letters, 2001, vol. 338, pp. 231-236.

Zheng, M. J., "Fabrication and optical properties of large4-scale uniform zinc oxide nanowire arrays by one-step electrochemical deposition technique," Chemical Physics Letters, 2002, vol. 363, pp. 123-128.

Huang, Houjin, "Purification and alignment of arc-synthesis single-walled carbon nanotube bundles," Chemical Physics Letters,2002, vol. 356, pp. 567-572.

Kong, Jing, "Chemical vapor deposition of methane for single-walled carbon nanotubes," Chemical Physics Letters, 1998, vol. 292, pp. 567-574.

Bergbreiter, David E., "Using Soluble Polymers To Recover Catlysts and Ligands," Chemical Reviews, Mar. 5, 2002, pp. A-AM.

Roucoux, Alain, "Reduced Transition Metal Colloids: A Novel Family of Reusable Catalysts?," Chemical Reviews, Jan. 30, 2002, pp. A-V.

Yoshida, Jun-ichi, "Tag Strategy for separation and Recovery," Chemical Reviews, Mar. 18, 2002, pp. A-X.

De Vos, Dirk E., "Ordered Mesoporous and Microporous Molecular Sieves Functionalized with transition Metal Complexes as Catalysts for Selective Organic Transformations," Chemical Reviews, Jan. 31, 2002, pp. A-Z.

Connelly, Neil G., "Chemical Redox Agents for Organometallic Chemistry," Chemical Reviews, Jan. 9, 1996, vol. 96, pp. 877-910.

Dequesnes, Marc, "Calculation of pull-in voltages for carbon-nanotube-based nanoelectromechanical switches," Nanotechnology, Jan. 22, 2002, vol. 13, pp. 120-131.

Serp, Philippe, "Chemical Vapor Deposition Methods for the Controlled Preparation of Supported Catalytic Materials," Chemical Reviews, Apr. 10, 2002, pp. A-AR.

Diehl, Michael R., "Self-Assembled, Deterministic Carbon Nanotube Wiring Networks," Angew. Chem. Int. Ed., 200 vol. 41, pp. 353-356.

Wind, S.J., "Localized and Directed Lateral Growth of Carbon Nanotubes from a Porous Template," IBM T.J. Watson Research Center, 17 pgs.

Wind, S. J., "Fabrication and Electrical Characterization of Top Gate Single-Wall Carbon Nanotube Field-Effect Transistors," IBM T. J. Watson Research Center, 14 pgs.

Harutyunyan, Avetik R., "CVD Synthesis of Single Wall Carbon Nanotubes under "Soft" Conditions," Nano Letters, Feb. 25, 2002, pgs. A-F.

Massot, L., "Electrodeposition of carbon films from molten alkaline fluoride media," Electrochimica Acta, Jan. 28, 2002, vol. 47, pp. 1949-1957.

Heinze, S., "Carbon Nanotubes as Schottky Barrier Transistors," Physical Review Letters, Sep. 2, 2002, vol. 89, pp. 106801-1 through 106801-4.

Duan, Xiangfeng, "Indium phosphide nanowires as building blocks for nanoscale electronic and optoelectronic devices," Nature, Jan. 4, 2001, vol. 409, pp. 66-69.

Chen, Robert J., "Noncovalent Sidewall Functionalization of Single-Walled Carbon Nanotubes for Protein Immobilization," J. Amer. Chem. Soc., 2001, vol. 123, pp. 3838-3839.

Puntes, Victor F., "Synthesis of hcp-Co Nanodisks," J. Amer. Chem. Soc., 2002, vol. 124, pp. 12874-12880.

An, Lei, "Synthesis of Nearly Uniform Single-Walled Carbon Nanotubes Using Identical Metal-Containing Molecular Nanoclusters as Catalysts," J. Amer. Chem. Soc., 2002, vol. (?), total of 4 pgs.

Cassell, Alan M., "Directed Growth of Free-Standing Single-Walled Carbon Nanotubes," American Chemical Society, Jun. 21, 1999, vol. 121, pp. 7975-7976.

Bahr, Jeffrey L., "Functionalization of Carbon Nanotubes by Electrochemical Reduction of Aryl Diazonium Salts: A Bucky Paper Electrode," American Chemical Society, 2001, vol. 123, pp. 6536-6542.

Fruchart, O., "Vertical self-organization of epitaxial magnetic nanostructures," Journal of Magnetism and Magnetic Materials, 2002, vol. 239, pp. 224-227.

Zhang, J., "Fabrication and photoluminescence of ordered GaN nanowire arrays," Journal of Chemical Physics, Oct. 1, 2001, vol. 115, pp. 5714-5717.

Dubois, S., "Fabrication and properties of arrays of superconducting nanowires," Journal of Materials Research Mar. 1999, vol. 14, pp. 665-671.

Liu, Z.Q., "Synthesis of $\alpha$-$SIO_2$ nanowires using Au nanoparticle catalysts of a silicon substrate," Journal of Materials Research, Mar. 2001, vol. 16, pp. 683-686.

Lei, Y, Fabrication, characterization, and photoluminescence properties of highly ordered $TiO_2$ nanowire arrays, J. Material Research, Apr. 2001, vol. 16, pp. 1138-1144.

Li, Y., "Fabrication of Highly ordered ZnO nanowire arrays in anodic alumina membranes," J. Materials Research, Nov. 2000, vol. 15, p. 2305-2308.

Sellmyer, D.J., "Magnetism of Fe, Co and Ni nanowires in self-assembled arrays," J. of Physics: Condensed Matter, (2000) vol. 13, pp. R433-R460.

Blick, R.H., "Nanosiructural silicon for studying fundamental aspects of nanomechanics," J. of Physics: Condensed Matter, (2002), pp. R905-R945.

Ciraci, S., "Quantum effects in electrical and thermal transport through nanowires," J. of Physics: Condensed Matter, (2001), pp. R537-R568.

Yu, Jae-Young, "Silicon Nanowires: Preparation, Device, Fabrication, and Transport Properties," J. Phys. Chem. B 2000, vol. 104, pp. 11864-11870.

Yu, Zhonghua, "(n, m) Structural Assignments and Chirality Dependence in Single-Wall Carbon Nanotube Raman Scattering," J. Phys. Chem. B 2001, vol. 105, pp. 6831-6837.

Wang, Y.W., "Fabrication of Ordered Ferromagnetic-Nonmagnetic Alloy Nanowire Arrays and their Magnetic Property Dependence on Annealling Temperature," J. Phys. Chem. B 2002, vol. 106, pp. 2502-2507.

Murphy, Robert, "High-Yield Nondestructive Purification and Quantification Method for Multiwalled Carbon Nanotubes," J. Phys. Chem. B 2002, vol. 106, pp. 3087-3091.

Li, C.P., "Silicon Nanowires Wrapped with Au Film," J. Phys. Chem. B 2002, vol. 106, pp. 6980-6984.

Steueman, David W., "Interactions between Conjugated Polymers and Single-Walled Carbon Nanotubes," J. Phys. Chem. B 2002, vol. 106, pp. 3124-3130.
Li, Jun, "Novel Three-Dimensional Electrodes: Electrochemical Properties of Carbon Nanotube Ensembles," J. Phys. Chem. B 2002, pp. A-G.
Cassell, Alan M., "Large Scale CVD Synthesis of Single-Walled Carbor Nanotubes," J. Phys. Chem. B 1999, vol. 103, pp. 6484-6492.
Dal, Hongju, "Controlled Chemical Routes to Nanotube Architectures, Physics, and Devices," J. Phys. Chem. B 1999, vol. 103, pp. 11246-11255.
Chiang, I.W., "Purification and Characterization of Single-Walled Carbon Nanotubes (SWNTs) Obtained from the Gas-Phase Decomposition of CO (HiPco Process)," J. Phys. Chem. B2001, vol. 105, pp. 8297-8301.
Tulchinsky, D.A., "Fabrication and domain Imaging of Iron magnetic nanowire arrays," J. Vac. Sci. Technol., May/Jun. 1998, A 16(3), pp. 1817-1819.
Yun, Wan Soo, "Fabrication of metal nanowire using carbon nanotube as a mask," J. Vac. Sci. Technol., Jul./Aug. 2000, A 18(4), pp. 1329-1332.
Batra, Inder P., "Quantum transport through one-dimensional aluminum wires," J. Vac. Sci. Technol., May/Jun. 2002, B 20(3), pp. 812-817.
Legrand, B., "Silicon nanowires with sub 10 nm lateral dimensions: From atomic force microscope lithography based fabrication to electrical measurements," J. Vac. Sci. Technol., May/Jun. 2002, B 20(3), PGS.862-870.
Tsutsumi, Toshiyuki, "Fabrication technology of ultrafine $SiO_2$ masks and Si nanowires using oxidation of vertical sidewalls of a poly-Si layer," J. Vac. Sci. Technol., Jan./Feb. 1999, B 17(1), pp. 77-81.
Namatsu, Hideo, "Fabrication of one-dimensional nanowire structures utilizing crystallographic orientation in silicon and their conductance characteristics," J. Vac. Sci. Technol., Sep./Oct. 1997, B 15(5), PP. 1688-1696.
Namatsu, Hideo, "Fabrication of thickness-controlled silicon nanowires and their characteristics," J. Vac. Sci. Technol., Nov./Dec. 1995, B 13(6), pp. 2166-2169.
Cassell, Alan M., "Combinatorial Optimization of Heterogeneous Catalysts Used in the Growth of Carbon Nanotubes," Langmuir 2001, vol. 17, pp. 260-264.
Lewenstein, Justin C. High-Yield Selective Placement of Carbon Nanotubes on Pre-Patterned Electrodes, Nano Letters., 2002, vol. 2, No. 5, pp. 443-446.
Martino, Anthony, "Catalyst Testing of Highly dispersed Metal Nanoparticles for Coal Liquefaction and Coat/Waste Copressing," Catalysts and Chemical Technologies Department, Sandia National Laboratories, pp. 1-7.
Peng, X.S., "Electrochemical fabrication of ordered $Ag_2S$ nanowire arrays," Materials Research Bulletin, 2002, No. 37, pp. 1369-1375.
Robinson, L.A. W., "Self-aligned electrodes for suspended carbon nanotube structures," Microelectronics Research Centre, Cavendish Laboratory, University of Cambridge and Hitachi Cambridge Laboratory, pp. 1-2.
Moore, Gordon E., "Cramming more components into Integrated circuits," Electronics, Apr. 19, 1965, vol. 38, No. 8(4), 4 pgs.
Fran, Hongyou, "Multiphased assembly of nanoporous silica particles," Journal of Non-Crystalline Solids (2001) vol. 285, pp. 71-78.
Franklin, Nathan R., "Integration of suspended carbon nanotube arrays into electronic devices and electromechanical systems," Applied Physics Letters, Jul. 29, 2002, vol. 81, No. 5, 913-915.
Kong, Jing, "Synthesis of Individual single-walled carbon nanotubes on patterned silicon wafers," Nature, Oct. 29, 1998, vol. 395, pp. 878-881.
Duan, Xiangfeng, "Nonvolatile Memory and Programmable Logic from Molecule-Gated Nanowires," Nano Letters, 2002, pp. A-D.
Fuhrer, M.S., "High-Mobility Nanotube Transistor Memory," Nano Letters, 202, vol. 2, No. 7, pp. 755-759.

Radosavljević, M., "Nonvolatile Molecular Memory Elements Based on Ambipolar Nanotube Field Effect Transitors," Nano Letters, 2002, vol. 2, pp. 761-764.
Derycke, V., "Catalyst-Free Growth of Ordered Single-Walled Carbon Nanotube Networks," Nano Letters, 2002, pp. A-D.
Joselevich, Emesto, "Vectorial Growth of Metallic and Semiconducting Single-Wall Carbon Nanotubes," Nano Letters, xxxx, vol. O, pp. A-E.
Javey, Ali, "Carbon Nanotube Transistor Arrays for Multistage Complementary Logic and Ring Oscillators," Nano Letters, 2002, pp. A-D.
Robertson, John, "Section 11. Non-Crystalline Carbon, Properties and Prospects for Non-Crystalline Carbons," Journal of Non-Crystalline Solids 299-302, 2002, pp. 798-804.
Ci, Lijie, "Double Wall Carbon Nanotubes Promoted by Sulfur in a Floating Iron Catalyst CVD System," Chemical Physics Letters 359, Jun. 13, 2002, pp. 63-67.
Gromov, A., "Purification of Carbon Nanotubes," Caramel Workshop, Jan. 23, 2002, pp. 1-13.
Cui, Yi, "Functional Nanoscale Electronic Devices Assembled Using Silicon Nanowire Building Blocks," Science, Feb. 2, 2001, vol. 291, pp. 851-853.
Wang, Suhua, Thermal Oxidation of $Cu_2S$ Nanowires: a Template Method for the Fabrication of Mesoscopic $Cu_xO$ (x= 1,2) Wires, Phys. Chem. Chem. Phys., 2002, vol. 4, pp. 3425-3429.
Untiedt, C., "Fabrication and Characterization of Metallic Nanowires," Physical Review B, Jul. 15, 1997, vol. 56, No. 4, pp. 2154-2160.
Marsen, Bjorn, "Fullerene-Structured Nanowires of Silicon," Physical Review B, Oct. 15, 1999, vol. 60, No. 16, pp. 11593-11600.
Berber, Savas, "Unusually High Thermal Conductivity of Carbon Nanotubes," Physical Review Letters, May 15, 2000, vol. 84, No. 20, pp. 4613-4616.
Yao, Zhen, "High-Field Electrical Transport in a Single-Wall Carbon Nanotubes," Physical Review Letters, Mar. 27, 2000, vol. 84, No. 13, pp. 2641-2944.
Zhang, Y.F., "Liquid Phase Synethesis of Carbon Nanotubes," Physica B 323, 2002, pp. 293-295.
Dresselhaus, M.S., "Raman Spectroscopy on One Isolated Carbon Nanotube," Physica B 323, 2002, pp. 15-20.
Heinze, S., "Carbon Nanotubes as schottky Barrier Transistors," Physical Review Letters, Sep. 2, 2002, vol. 89, No. 10, 106801-1-106801-4.
Fu, Qiang, "Electrodeposition of Carbon Films from Various Organic Liquids," Surface & Coatings Technology 124, 2000, pp. 196-200.
Hemadl, K., "Reactivity of Different Kinds of Carbon During Oxidative Purification of Catalytically Prepared Carbon Nanotubes,", Solid State Ionics 141-142, 2001, pp. 203-209.
Colomer, J. F., "Different Purification Methods of Carbon Nanotubes Produced by Catalytic Synthesis," Synthetic Metals 103, 1999, pp. 2482-2483.
Dalton, A.B., "A Functional Conjugated Polymer to Process, Purify and Selectively Interact with Single Wall Carbon Nanotubes," Synthetic Metals 121, 2001, pp. 1217-1218.
Tat, Kerk Wal, "Preparation and Characterization of Cobalt/Silica Core-Shell Magnetic Nanoparticles," Dept. Chem., National University of Singapore 2000/2001, pp. 1-5.
Shipley, Microposit® XP-90104A E-Beam Resist, Preliminary Product Information, pp. 1-2.
Smalley, R. E., Foreword (Publicaton unknown), Jan. 2001.
Dresselhaus, Mildred S., Preface (Publication unknown) Jan. 2001.
Advanced Semconductor Engineering, Inc., Substrate Design 420L BGA 35*35, Dwg. No. K-1-0420, 2 pages.
Integrated Device Technology, Inc., DA Package Design, Sep. 25, 1997, 2 pages.
Integrated Device Technology, Inc. BG Package Outline, Feb. 18, 1994.
Pimenta, M.A., "Diameter dependence of the Raman D-band in isolated single-2qll carbon nanotubes," Physical Review B, vol. 64 pp. 04140-1-04140-4.
Duan, Xiangfeng, Nonvolatile Memory and Programmable Logic from Molecule-Gated Nanowires, Nano Letters, Mar. 2002, pp. 1-4.

Introduction and Historical Perspective, Chapter 1, pp. 1-48.

Modem CMOS Technology, Chapter 2, pp. 49-92.

Crystal Growth, Wafer Fabrication and Basic Properties of Silicon Wafers, Chapter 2, pp. 93-149.

Kong, J., et al., "Chemical Vapor Disposition of Methane for Single-Walled Carbon Nanotubes." Chemical Physics Letters, 292, 567, 1998.

Li., Y., et al., "Growth of Single-Walled Carbon Nanotubes from Discrete Catalytic Nanoparticles of Various Sizes." *The Journal of Physical Chemistry B* (2001); 105, 11424.

Dai, Hongjie. "Controlled Chemical Routes to Nanotube Architectures, Physics, and Devices." *The Journal of Physical Chemistry B* (1999); 103: 11246-11255.

Colomer, J.-F., et al., "Characterization of Single-Walled Carbon Nanotubes Produced by CCVD Methos." *Chemical Physics Letters* (2001); 345, 11-17.

Li, Y. et al., "Preparation of Monodispersed fe-Mo Nanoparticles as the Catalyst for CVD Synthesis of Carbon Nanotubes." Chem. Mater., 12. 1008, 2001.

Cassell, A., et al., "Large Scale Synthesis of Single-Walled Carbon Nanotubes." *The Journal of Physical Chemistry B* (1999); vol. 103, No. 22: 6484-6492.

Cassell, A., et al., "Directed Growth of Free-Standing Single-Walled Carbon Nanotubes." *Journal of the American Chemical Society* (1999); vol. 121, 7975-7976.

Delzeit, L., et al., "Multilayered Metal Catalysts for Controlling the Density of Single-walled Carbon Nanotube Growth." Chemical Physics Letters, 348, 368, 2001.

Wei, Y., et al., "Effect of Catalyst Film Thickness on Carbon Nanotube Growth by Selective Area Chemical Vapor Deposition." *Applied Physics Letters* (2001); vol. 78, No. 10: 1394-1396.

Su., M., et al., "A Scalable Method for the Synthesis of Single-Walled Carbon Nanotubes with High Catalyst Productivity." *Chemical Physics Letters* (2000); vol. 322, 321-326.

Harutyunyan, A., et al., "CVD Synthesis of Single Wall Carbon Nanotubes under 'Soft' Conditions," *Nano Letters* vol. 2c No. 5 525 (2002); Published on web Mar. 27, 2002.

Li, Q., et al., "High-Density Growth of Single-Wall Carbon Nanotubes on Silicon by Fabrication of Nanosized Catalyst Thin Films." *chem. Mater.* (2002), 14, 4262; Published on web Sep. 11, 2002.

Homma, Y., et al., "Growth of Suspended Carbon Nanotube Networks on 100nm-Scale silicon Pillars." *Applied Physics Letters,* (2002); vol. 81 No. 12, 2261-2263.

Javey, A., et al., "Carbon Nanotube Transistor Arrays for Multistage Complementary Logic and Ring Oscillators." *Nano Letters* (2002); vol. 2 No. 9 929-932. Published on web Jul. 31, 2002.

Kong, J., et al., "Syntheses of Individual Single-Walled carbon Nanotubes on Patterned Wafers," *Nature* (1998); 395: 878-881.

Chen, B., et al., "Heterogeneous Single-Walled Carbon Nanotube Catalyst Discovery and Optimization." *Chem. Mater.* (2002); vol. 14, 1891-1896.

Yenilmez, E., et al., "Wafer Scale Production of Carbon Nanotube Scanning Probe Tips for Atomic Force Microscopy," *Applied Physics Letters*. (2002); vol. 80 No. 12, 2225-2227.

Peigney, A., et al., "A Study of the Formation of Single-and-Double-Walled carbon Nanotubes by a CVD Method." *The Journal of Physical Chemistry B* (2001); 105: 9699-9710.

Franklin, N., et al., "Integration of Suspended carbon Nanotube Arrays into Electronic Devices and Electrochanical Systems." *Applied Physics Letters* (2002); vol. 81 No. 5, 913-905.

Collins, P., et al., "Engineering Carbon Nanotubes and Nanotube Circuits Using Electrical Breakdown." Science (2001); 292: 706-709.

Kim, W., et al., "Synthesis of Ultralong and High Percentage of Semiconduction Single-walled Carbon Nanotubes." *Nano Letters* (2002); vol. 2 No. 7 703-708. Published on web Jun. 1, 2002.

Reuckes, T., et al., "Carbon Nanotube-Based Nonvolatile Random Access Memory for Molecular Computing." *Science,* vol. 289, 94-97, Jul. 7, 2000.

Liu, et al., "Organizing Single-Walled Carbon Nonotubes on Gold Using a Wet Chemical Self-Assembling Technique, Langmuir," Apr. 18, 2000, vol. 16, No. 8, 3659-3573.

Soh, et al., "Integrated Nanotube Circuits: controlled growth and ohmic contacting of single-walled carbon nanotubes", Applied Physics Letters, Aug. 2, 1999, vol. 75, No. 5, 627-629.

Zheng et al, "Chemical Vapor Deposition Growth of Well-Aligned Carbon Nanotube Patterns on Cubic Mesoporous Silica Films by Soft Lithography", Chemistry of Materials, Jun. 9, 2001, vol. 13, 2240-2242.

Huang, et al., "Patterned Growth of Well-Aligned Carbon Nanotubes: A Soft-Lithographic Approach", The Journal of Physical Chemistry B., Mar. 16, 2000, vol. 104, No. 10, 2193-2196.

Chattopadhyay, et al., "Metal-Assisted Organization of Shortened Carbon Nanotubes in Monolayer and Mulilayer Forest Assemblies", Journal of the American Chemical Society, Aug. 28, 2001, vol. 123, 9451-9452.

* cited by examiner

Figure 1B.1

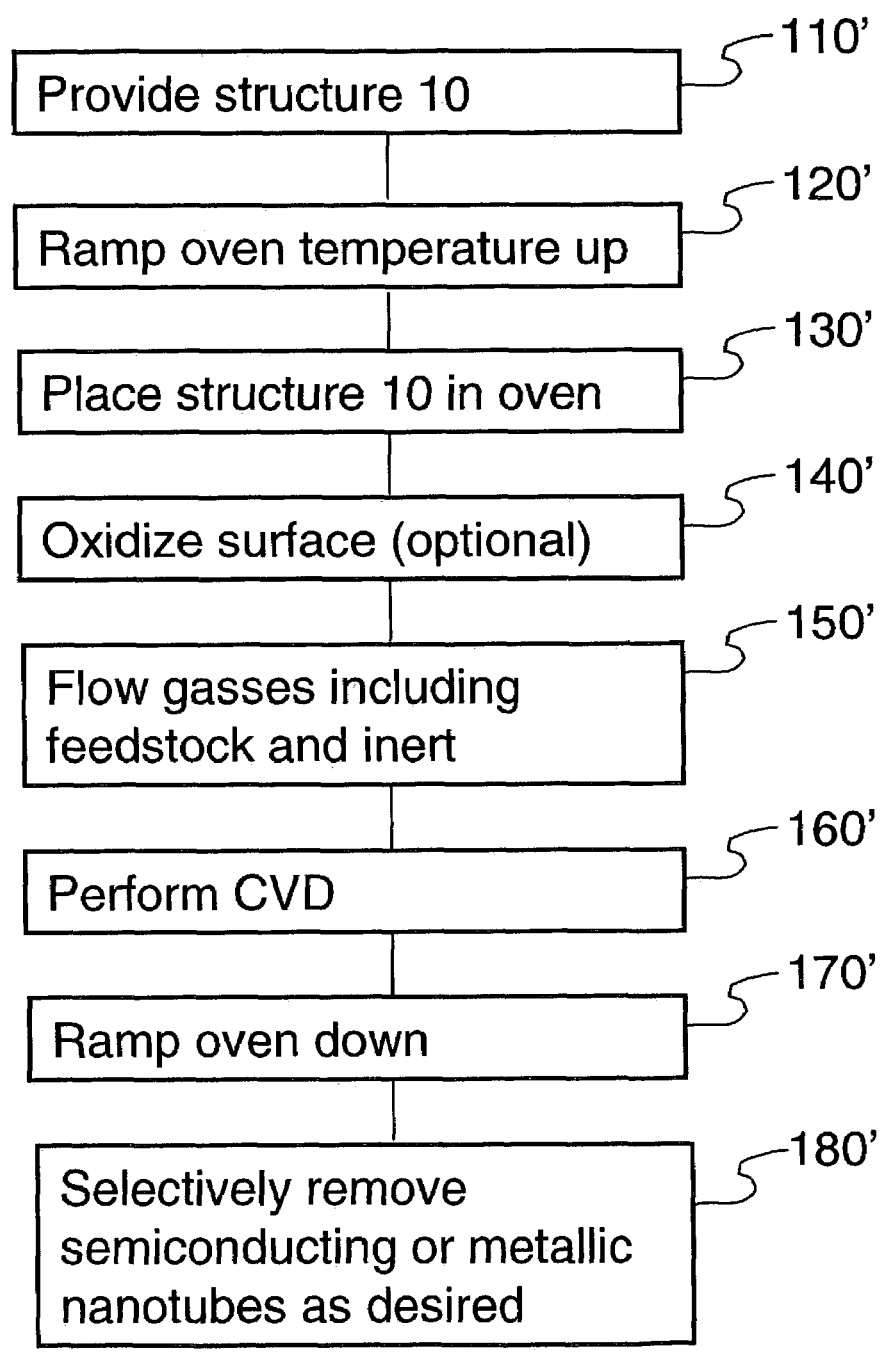
Figure 1B.2

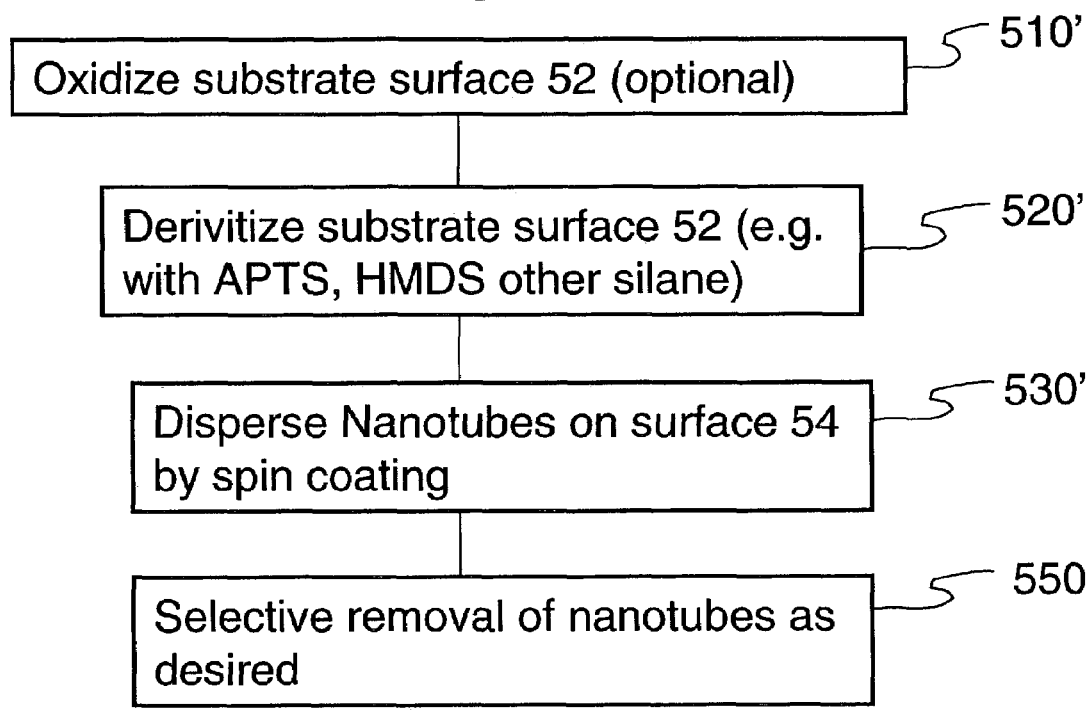

METHODS OF USING PRE-FORMED NANOTUBES TO MAKE CARBON NANOTUBE FILMS, LAYERS, FABRICS, RIBBONS, ELEMENTS AND ARTICLES

CROSS-REFERENCE TO RELATED APPLICATIONS

This application is a continuation-in-part of and claims priority under 35 U.S.C. § 120 to the following related application, which is assigned to the assignee of this application, and which is incorporated by reference in its entirety:

Nanotube Films and Articles (U.S. patent application Ser. No. 10/128,118, now U.S. Pat. No. 6,706,402) filed Apr. 23, 2002;

This application is related to the following applications, which are assigned to the assignee of this application, and which are incorporated by reference in their entireties:

Methods of Making Carbon Nanotube Films, Layers, Fabrics, Ribbons, Elements and Articles (U.S. patent application Ser. No. 10/341,005), filed on even date herewith; and Methods of Using Thin Metal Layers to Make Carbon Nanotube Films, Layers, Fabrics, Ribbons, Elements and Articles (U.S. patent application Ser. No. 10/341,055), filed on even date herewith; and Carbon Nanotube Films, Layers, Fabrics, Ribbons, Elements and Articles (U.S. patent application Ser. No. 10/341,130), filed on even date herewith.

BACKGROUND

1. Technical Field

The present invention relates generally to nanotube films, layers, and fabrics and methods of making same and, more specifically to carbon nanotube films, layers, and fabrics and methods of making same so that they form or may be made to form patterned ribbons, elements and articles of various shapes and characteristics.

2. Discussion of Related Art

Wire crossbar memory (MWCM) has been proposed. (See U.S. Pat. Nos. 6,128,214; 6,159,620; and 6,198,655.) These memory proposals envision molecules as bi-stable switches. Two wires (either a metal or semiconducting type) have a layer of molecules or molecule compounds sandwiched in between. Chemical assembly and electrochemical oxidation or reduction are used to generate an "on" or "off" state. This form of memory requires highly specialized wire junctions and may not retain non-volatility owing to the inherent instability found in redox processes.

More recently, memory devices have been proposed which use nanoscopic wires, such as single-walled carbon nanotubes, to form crossbar junctions to serve as memory cells. (See WO 01/03208, Nanoscopic Wire-Based Devices, Arrays, and Methods of Their Manufacture; and Thomas Rueckes et al., "Carbon Nanotube-Based Nonvolatile Random Access Memory for Molecular Computing," Science, vol. 289, pp. 94-97, 7 Jul., 2000.) Hereinafter these devices are called nanotube wire crossbar memories (NTWCMs). Under these proposals, individual single-walled nanotube wires suspended over other wires define memory cells. Electrical signals are written to one or both wires to cause them to physically attract or repel relative to one another. Each physical state (i.e., attracted or repelled wires) corresponds to an electrical state. Repelled wires are an open circuit junction. Attracted wires are a closed state forming a rectified junction. When electrical power is removed from the junction, the wires retain their physical (and thus electrical) state thereby forming a non-volatile memory cell.

The NTWCM proposals rely on directed growth or chemical self-assembly techniques to grow the individual nanotubes needed for the memory cells. These techniques are now believed to be difficult to employ at commercial scales using modern technology. Moreover, they may contain inherent limitations such as the length of the nanotubes that may be grown reliably using these techniques, and it may difficult to control the statistical variance of geometries of nanotube wires so grown. Improved memory cell designs are thus desired.

The reliable fabrication of electrically conductive, ultra-thin metallic layers and electrodes in the sub-10 nm regime is problematic. (See, e.g., S. Wolf, Silicon Processing for the VLSI era; Volume 2—Process Integration, Lattice Press, Sunset Beach, 1990.) Metal films in this size regime are usually non-continuous and not conductive over macroscopic distances. Furthermore, these sub-10 nm films are prone to thermal damage by electrical current, making them unsuitable for applications such as electrical interconnects in semiconductor devices. Thermal damage of thin metal interconnects caused by their low heat conductivities is one of the main factors inhibiting dramatic miniaturization and performance improvements of highly integrated semiconductor devices.

Conventional interconnect technologies have a tendency to suffer from thermal damage and metal diffusion eroding the performance of the semiconductor devices especially from degradation of the electrical properties. These effects become even more pronounced with size reduction in current generation 0.18 um and 0.13 um structures, e.g. by metal diffusion through ultra-thin gate oxide layers.

There is therefore a need in the art for conductive elements that may operate well in contexts having high current densities or in extreme thermal conditions. This includes circuit contexts with very small feature sizes but includes other high current density, extreme thermal environment contexts as well. There is also a need for conductive elements that will be less likely to diffuse undesirable amounts of contaminants into other circuit elements.

SUMMARY

The invention provides new methods of making carbon nanotube films, layers, fabrics, ribbons, elements and articles by using pre-formed nanotubes.

According to one aspect of the invention, a substrate is provided. Preformed nanotubes are applied to a surface of the substrate to create a non-woven fabric of carbon nanotubes. Portions of the non-woven fabric are selectively removed according to a defined pattern to create the article.

According to another aspect of the invention, a substrate is provided. Preformed nanotubes are applied to a surface of the substrate to create a non-woven fabric of carbon nanotubes wherein the non-woven fabric is primarily a monolayer of nanotubes in contact.

According to another aspect of the invention, the surface is functionalized to promote adhesion of the preformed nanotubes to the surface of the substrate.

According to another aspect of the invention, the surface is derivitized to chemically convert the surface state.

According to another aspect of the invention, the surface is oxidized to remove carbon and other impurities.

According to another aspect of the invention, the surface is reacted with a silane.

According to another aspect of the invention, the surface is exposed to 3-aminopropyltriethoxysilane (APTS).

According to another aspect of the invention, the surface is exposed to an approximately 1-50 molar solution of APTS.

According to another aspect of the invention, the surface is exposed to an approximately 13-28 molar solution of APTS.

According to another aspect of the invention, the solution of APTS includes hexane.

According to another aspect of the invention, the substrate is immersed in the solution of APTS for a predetermined time.

According to another aspect of the invention, silane is deposited on the surface as substantially a monolayer.

According to another aspect of the invention, the substrate is stored in hexane prior to the application of pre-formed nanotubes.

According to another aspect of the invention, the substrate is spun to disperse the pre-formed nanotubes.

According to another aspect of the invention, the pre-formed nanotubes are laser-ablated nanotubes.

According to another aspect of the invention, the pre-formed nanotubes are high pressure carbon monoxide decomposition nanotubes.

According to another aspect of the invention, the pre-formed nanotubes are single-walled nanotubes.

According to another aspect of the invention, the pre-formed nanotubes are multi-walled nanotubes.

According to another aspect of the invention, the nanotubes are mixed with a solvent at a concentration of about 100-500 µg/mL.

According to another aspect of the invention, the solvent is orthodichlorobenzene.

According to another aspect of the invention, the nanotubes in the solvent are caused to be dispersed.

According to another aspect of the invention, the solution of nanotubes and solvent are subjected to sonication.

According to another aspect of the invention, the nanotubes are mixed with a solvent at a concentration of about 10-200 µg/mL.

According to another aspect of the invention, the substrate is caused to spin at a predefined rate as a solution including nanotubes is deposited on the surface and wherein the surface continues to spin for a defined duration.

According to another aspect of the invention, the predefined rate is about 1000 rpm and the defined duration is about 30 seconds.

According to another aspect of the invention, the substrate is dried subsequent to the application of nanotubes.

According to another aspect of the invention, the application of nanotubes is accomplished by multiple spin coating operations of a solution of pre-formed nanotubes.

According to another aspect of the invention, between spin coating operations the substrate is dried of solvent.

According to another aspect of the invention, the application of nanotubes causes a sufficient density of nanotubes to yield a non-woven fabric characterized by a resistance of about 1-1000 k$\Omega$/□.

According to another aspect of the invention, the substrate with non-woven fabric are annealed.

According to another aspect of the invention, the carbon nanotubes of the non-woven fabric include metallic nanotubes and semiconducting nanotubes and the relative composition of metallic and semiconducting nanotubes in the fabric is controlled.

According to another aspect of the invention, the carbon nanotubes of the non-woven fabric include metallic nanotubes and semiconducting nanotubes and the method further includes selectively removing metallic nanotubes.

According to another aspect of the invention, the carbon nanotubes of the non-woven fabric include metallic nanotubes and semiconducting nanotubes and wherein the method further includes selectively removing semiconducting nanotubes.

According to another aspect of the invention, subsequent to selectively removing metallic nanotubes, a subsequent application of preformed nanotubes is made.

According to another aspect of the invention, the non-woven fabric is made to cover the surface of the substrate and is of substantially uniform density.

According to another aspect of the invention, the non-woven fabric is made to cover the surface of the substrate and is about 2 nm or less in thickness.

BRIEF DESCRIPTION OF THE DRAWINGS

In the Drawing,

FIGS. 5I-J illustrate exemplary methods of forming nanotube fabric by spin-coating preformed nanotubes in suspension.

DETAILED DESCRIPTION

Figure 1A:
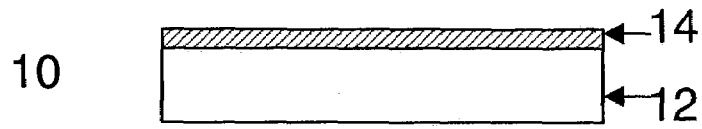
FIG. 1A shows a structure, according to certain embodiments of the invention, having a thin layer of metal catalyst that may be used in an exemplary method of growing nanofabric.
Figure 1A:
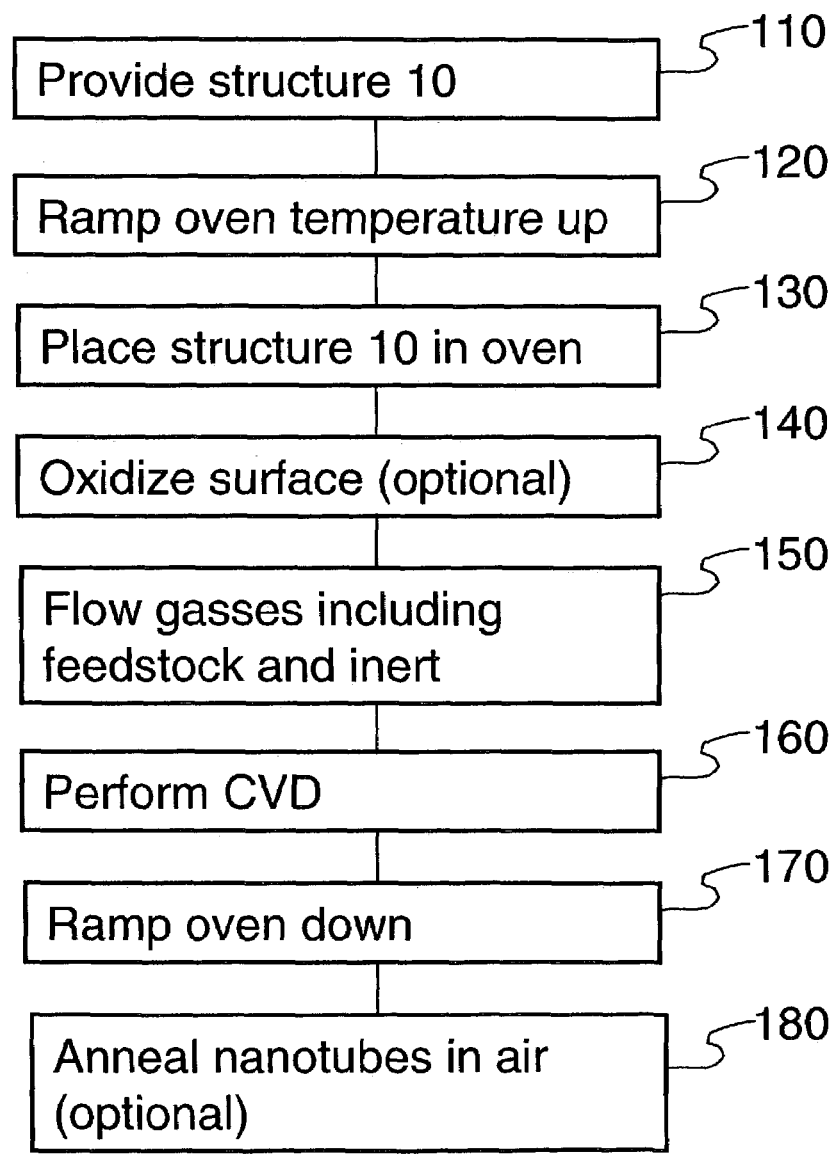

Preferred embodiments of the invention provide nanotube films, layers, or non-woven fabrics and methods of making same so that they form, or may be made to form, various useful patterned components, elements or articles. (Hereinafter "films," "layers," or "non-woven fabrics" are referred to as "fabrics" or "nanofabrics".) The components created from the nanofabrics retain desirable physical properties of the nanotubes and/or the nanofabrics from which they are formed. In addition, preferred embodiments allow modern manufacturing techniques (e.g., those used in semiconductor manufacture) to be readily employed to utilize the nanofabric articles and devices.

For example, the nanofabrics may be patterned into ribbons, which can be used to create non-volatile electromechanical memory cells. As explained in U.S. patent application Ser. Nos. 09/915,093 and 10/033,323 (incorporated by reference in their entireties), the ribbons may be used as a component of a non-volatile electromechanical memory cell. The deflected, physical state of the ribbon may be made to represent a corresponding information state. The deflected, physical state has non-volatile properties, meaning the ribbon retains its physical (and therefore informational) state even if power to the memory cell is removed. The nanofabric may also be formed into conductive traces or pads. As explained in U.S. patent application Ser. Nos. 10/128,118 and 10/175,586 (incorporated by reference in their entireties), the trace has advantageous electrical and thermal conductivity, allowing it to be used for extremely small feature sizes, or to be utilized as a transistor component, such as a gate or base of a transistor forming superior metal to semiconductor contacts. The nanofabrics may also be formed or patterned into shorter segments such as ribbons or patches. The shorter segments or patches allow facile interconnection of their nanotubes to vias, interconnects, traces or other structures useful in electronic devices. They may also be used to create new forms of electromechanical memory cells, for example, non-crossbar, embedded cells. The articles so formed help enable the generation of nanoelectronic devices and may also be used to assist in increasing the efficiency and performance of current electronic devices using a hybrid approach (e.g., using nanoribbon memory cells in conjunction with semiconductor addressing and processing circuitry).

Preferred nanofabrics have a plurality of nanotubes in contact so as to form a non-woven fabric. Gaps in the fabric, i.e., between nanotubes either laterally or vertically, may exist. The fabric preferably has a sufficient amount of nanotubes in contact so that at least one electrically conductive, semi-conductive or mixed conductive and semi-conductive pathway exists from a given point within a ribbon or article to another point within the ribbon or article (even after patterning of the nanofabric).

Though certain embodiments prefer single-walled nanotubes in the nanofabrics, multi-walled nanotubes may also be used. In addition, certain embodiments prefer nanofabrics that are primarily a monolayer with sporadic bilayers and trilayers, but other embodiments benefit from thicker fabrics with multiple layers.

To create a nanofabric, the technique chosen must result in a sufficient quantity of nanotubes in contact with other nanotubes which thereby matte as a result of the nanotubes' adhesion characteristics. Certain embodiments (e.g., memory cells) benefit when the nanofabric is very thin (e.g., less than 2 nm); for example, when the nanofabric is primarily a monolayer of nanotubes with sporadic overlapping (sometimes fabric will have portions that are bilayers or trilayers), or a multilayer fabric with relatively small diameter nanotubes. Moreover, many of these embodiments benefit when the nanotubes are single-walled nanotubes (SWNTs). Other embodiments (e.g., conductive traces) may benefit from thicker fabrics or multi-walled nanotubes (MWNTs).

The nanotubes have a resistance per square between 1-1000 k$\Omega$/□ (a lower resistance per square value is generally preferred) but can be tuned to have a resistance per square between 1 k$\Omega$/□-10 M$\Omega$/□ which is dependent upon the quality of nanotubes used and their electrical and mechanical characteristics. The porosity of the fabric can be tuned as well to generate low density fabrics with high porosity and high density fabrics with low porosity. The average length of a nanotube ranges between 50-1000 nm and 1-100 μm including single-walled nanotubes, multi-walled nanotubes or a mixture of both and can be controlled as is necessary for a particular application such as memory, switches, relays, chemical sensors, biosensors and resonators.

Certain preferred methods of constructing the nanofabrics involve growing nanotubes using chemical vapor deposition (CVD) processes in conjunction with various catalysts. Other preferred methods generate films using spin-coating techniques with preformed nanotubes. The fabrics may be patterned after being formed or they may be grown or formed in a predetermined pattern, e.g., by using patterned catalyst metal layers, nanoparticles or a combination thereof.

Growing Nanofabrics

Introduction

Carbon nanotubes can be grown on substrates whose surfaces contain certain metallic or oxide layers. The metallic or metal oxide layers allow metal-containing nanoparticles to be applied onto the substrate surface. Exemplary nanoparticles include metals, such as iron, cobalt, nickel, tungsten, molybdenum, rhenium and other transition metals, or metal oxides. The metals or metal oxides in these methods act as growth catalyst for carbon nanotubes.

The literature has documented research results regarding the growth of single-walled nanotubes (SWNTs) from pre-fabricated nanoparticles (see Kong, J., et al., Chemical Physics Letters, 292, 567, 1998; Li, Y., et al., Journal of Physical Chemistry B, 105, 11424, 2001; Dai, H., et al., Journal of Physical Chemistry B, 103, 11246, 1999; Colomer, J.-F., et al., Chemical Physics Letters, 345, 11, 2001; and Li, Y. and Liu, J., Chem. Mater., 13. 1008, 2001), catalyst solutions, e.g., "liquid catalysts" (see Cassell, A., et al., Journal of Physical Chemistry B, 103, 6484, 1999 and Cassell, A., et al., Journal Am. Chem. Soc., 121, 7975, 1999), and layered catalytic deposition (see Cassell, A., et al., Journal of Physical Chemistry B, 103, 6484, 1999). Metal oxides of various diameters may be used depending upon whether growth of single-walled nanotubes (SWNTs) or multi-walled nanotubes is desired. (See, e.g., Y. Li, W. Kim et al., Growth of Single-Walled Carbon Nanotubes From Discrete Catalytic Nanoparticles of Various Sizes, Journal of Physical Chem. B, 105, 11424, 22 Nov. 2001.) Bi-metallic catalyst nanoparticles (iron-molybdenum) have also been fabricated to assist in the production of carbon nanotubes (see Li, Y. and Liu, J., Chem. Mater., 13. 1008, 2001). These nanoparticles are usually dispersed randomly on a substrate or other support to produce nanotube growth. Typical liquid catalysts contain a mixture of chlorides or nitrates that have iron, cobalt, nickel, or molybdenum. These liquid catalysts are generated by soaking a pre-patterned 'stamp' onto a substrate. After stamping, the catalyst is calcinated or oxidized to burn off all the chlorides, nitrides, and other species leaving a random distribution of metal nanoparticles within a broad size regime. Yet another method of producing SWNTs involves the deposition of metal layers (See Delzeit, L., et al., Chemical Physics Letters, 348, 368, 2001). The metal layers may include a porous under-layer such as aluminum or iridium, a catalytic layer (iron, cobalt, nickel), and a co-catalyst layer, typically molybdenum. The catalyst nanoparticles required for nanotube formation are produced during the CVD process.

The inventors have discovered that the above techniques may be extended to create nanofabrics, which have important characteristics that may be controlled in the creation process. In addition, they have discovered new techniques to create nanofabrics. The fabrics can be assembled or grown (e.g., over an entire wafer surface) and then fabric may be selectively removed, e.g., by using lithographic patterning. In some embodiments, the fabric may be formed in a pattern; i.e., nanotube fabric will grow in places where desired and none need be removed subsequent to growth.

To grow nanofabrics, the metallic nanoparticles may be applied to the substrate surface in a variety of ways, including spin coating, application via aerosol, or by dipping the substrate into a solution that includes such nanoparticles. The metallic nanoparticles used as catalyst may also be applied to the substrate surface by deposition of a gas-phase metallic precursor such as any metallocene including ferrocene, molybdocene, cobaltocene and many other derivatives known in the literature to vaporize at relatively low temperatures, e.g. 25-600° C. (i.e., a low temperature relative to the temperatures at which carbon nanotube growth would occur using that metal as catalyst).

Once a catalyst has been applied to the surface, an appropriate feedstock gas is supplied to the substrate's environment using a CVD process and nanotubes are allowed to grow. Typical growth times range from under 1 minute to 60 minutes. A typical growth phase can be completed in less than ten minutes. Examples of appropriate feedstock gasses include, but are not limited to CO, $CH_4$, $C_2H_4$ and other carbon sources. The feedstock gas should be used at proper flow rates and at proper concentrations with inert gasses such as argon or nitrogen. Typical temperature regimes are about 600-1000° C.

Some factors influencing nanotube growth include catalyst composition, catalyst diameter, catalytic growth efficiency, temperature, CVD run time and choice of reagents including catalysts and feedstock gasses as well as reductants and inert carrier gasses, flow rates, ratios of gasses and mixtures and substrate type and composition.

The films generated by this method are typically characterized in bulk by resistance in ohms per square (2%) measurements that range from 1 to 1000 k$\Omega$/☐ or in some circumstances from 1 to 20 M$\Omega$/☐. This measurement can be used to describe the quality and density of the tubes in bulk growth where lower resistance per square indicates a denser fabric and a relatively high concentration of metallic nanotubes.

Thin Catalyst layers for Growth of Nanotubes

One preferred method of growing nanofabrics uses CVD techniques with substrates having a thin layer of metal catalyst on the substrate surface. The thin layers allow the catalyst to be easily removed in subsequent processing steps. Thicker catalyst layers may require more difficult processing steps.

FIG. 1A shows a cross-sectional view of an exemplary structure 10 having a substrate 12 and a thin metal catalyst layer 14 (shown here as one layer, though more than one layer may be employed). This figure is not to scale; the metal catalyst layer of typical embodiments is only about 1-2 nm thick.

An exemplary, non-limiting substrate 12 is made of silicon and has an upper layer of $SiO_2$ (not shown). The $SiO_2$ insulates the conductive nanotubes (once formed) from the underlying bulk silicon of substrate 12. Moreover, the upper layer of the substrate 12 may already have formed therein various elements that may be used together with the to-be-formed nanofabric articles to form circuits and the like, or the articles may be used as conductive connections between circuits formed on the substrate.

The metals that can be used as primary catalyst metals of layer 14 can be selected from a non-exclusive group known to produce SWNTs, such as iron, nickel, cobalt, and molybdenum. Metal layer 14 can also include metals that act in conjunction with primary catalysts as co-catalysts, such metals include, but are not limited to, aluminum, molybdenum, cobalt, or other co-catalyst metals. If multi-walled nanotubes (MWNTs) are desired, these and additional transition metals may be used in layer 14, such as yttrium, lanthamides and actinides.

The growth of nanotubes from deposited thin metal layers 14 typically involves the deposition by any physical vapor deposition technique of an aluminum layer, an iron layer, and/or a molybdenum layer, onto a substrate 12. (The aluminum layer generates a porous reactive support that aids in generation of carbon species which feed into the iron catalyst where growth of the nanotubes actually takes place. The molybdenum layer also serves as a site to reduce the carbon to a reactive form. The iron by itself can accomplish this reduction even but in some cases the rate is increased if the Mo and Al are present as well.) The thin metal layers 14 such as aluminum and molybdenum assist in the formation of SWNTs during CVD (when these three metals are used in concert, iron is the primary growth catalyst). These layers are extremely thin (e.g., 1-2 nm) and will diffuse or vaporize during CVD growth. Some of the particles created from such vaporization may be encapsulated by the eventually-grown nanotubes. (As the nanotubes are growing, the thin layers will diffuse. When layers are heated, they have a tendency to generate particles. Some of these particles will contain iron which will then be the site of the direct growth of carbon nanotubes. If in some instances the catalyst is very small, then the catalyst particle will be carried along as the nanotube grows. In other cases the catalyst particle will be larger and the nanotube will grow out from this end leaving the catalyst particle in place. Either way, if one looks at a transmission electron micrograph of a nanotube, one will almost always find at one end a nanoparticle, which acted as a catalyst.)

FIG. 1B.1 illustrates a way of forming nanofabrics utilizing a substrate with thin metal catalyst layer(s). First, an intermediate structure 10 is provided 110. The structure, as outlined above, includes a substrate 12 and a metal catalyst layer 14. A furnace is heated 120 to about 500° C. The structure 10 is placed 130 into the furnace. If desired, the metal layer 12 may be oxidized 140 in air. The oxidation can take place at 500° C. for 30 minutes. Oxidizing may be desired because it generates nanoparticles on the surface when metal atoms migrate and rearrange themselves. The temperature of the substrate 10 is ramped up to the CVD temperature and a flow of feedstock and inert gasses is provided 150. For example, hydrogen gas is mixed with an inert gas that has proper heat diffusion properties (typically argon or nitrogen). In some embodiments, the ratio of the gasses can be 1:5 hydrogen to inert gas (the ratio, however, should depend on the flow rate and types of gas introduced into the system upon reaching CVD temperature). For example, methane at a flow rate of 100-750 standard cubic centimeters per minute (sccm), or ethylene gas at 1.0-5.0 sccm may be used. The CVD run is performed 160 for some time typically between 1-10 minutes. (A CVD process or chemical vapor deposition involves in this case a carrier gas (argon), a reductant (hydrogen) and a carbon feedstock (methane, ethylene in combination or alone, or other gas)). The furnace is ramped down 170 to less than 200° C. in a flow of inert gas or gasses that have low or no reactivity with the carbon sources, such as argon or nitrogen. Depending on properties desired in the resulting nanotube fabric, the gas used could be air or oxygen at a lower temperature; such use would provide a final annealing 180 for nanotube adhesion and/or removal of amorphous carbon. As a result of the above, a nanofabric is created over substrate 12 and the thin metal layer 14 is substantially or totally vaporized.

The surface of the substrate 12 may have a defined pattern (e.g., a grating) on its surface. For example, the surface may have alternating regions of metal or semiconductor and insulator. The metal or semiconducting embedded materials may be partially or totally capped off by a sacrificial layer which can be removed later to provide a suspended nanotube nanoribbon structure. See U.S. patent application Ser. Nos. 09/915,093 and 10/033,323.

A defined thin metal layer pattern will determine the origination of nanotube growth. (That is, nanotube growth will originate from the catalyst regions rather than the interstitial regions which do not have catalyst. This characteristic may be exploited; i.e., depending on the ultimate use of the nanoribbons or nanofabric articles, a specific surface pattern may be desired (for example in a memory device). Moreover, the thin metal layer catalyst may be patterned to create a patterned growth of nanofabric. If the catalyst patterns are sufficiently far away from each other they may not require subsequent patterning.

Figure 2:
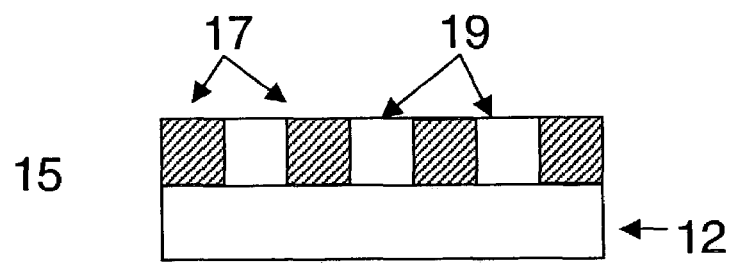
FIG. 2 is a cross-sectional view of an exemplary structure used to practice certain embodiments of the invention.

FIG. 2, for example, is a cross-sectional view of an exemplary structure 15 having a grating configuration. Surface metal regions 17 are separated from one another by insulating regions 19. The material of metal regions 17 may be selected from appropriate carbon nanotube growth catalysts, and the insulating regions 19 may be made from material that does not readily initiate carbon nanotube growth and genesis, such as silica. The separate metal catalyst layer regions 17 provide a region where nanotube growth originates.

The density of the nanotube ribbon may be controlled by altering such variables as catalyst composition and concentration, growth environment, including but not limited to growth time (e.g., less CVD run time yields less dense nanofabric), temperature, gas composition and concentration. Provided below are several exemplary ways of growing nanofabrics using the above principles.

EXAMPLE 1

Figure 1C:
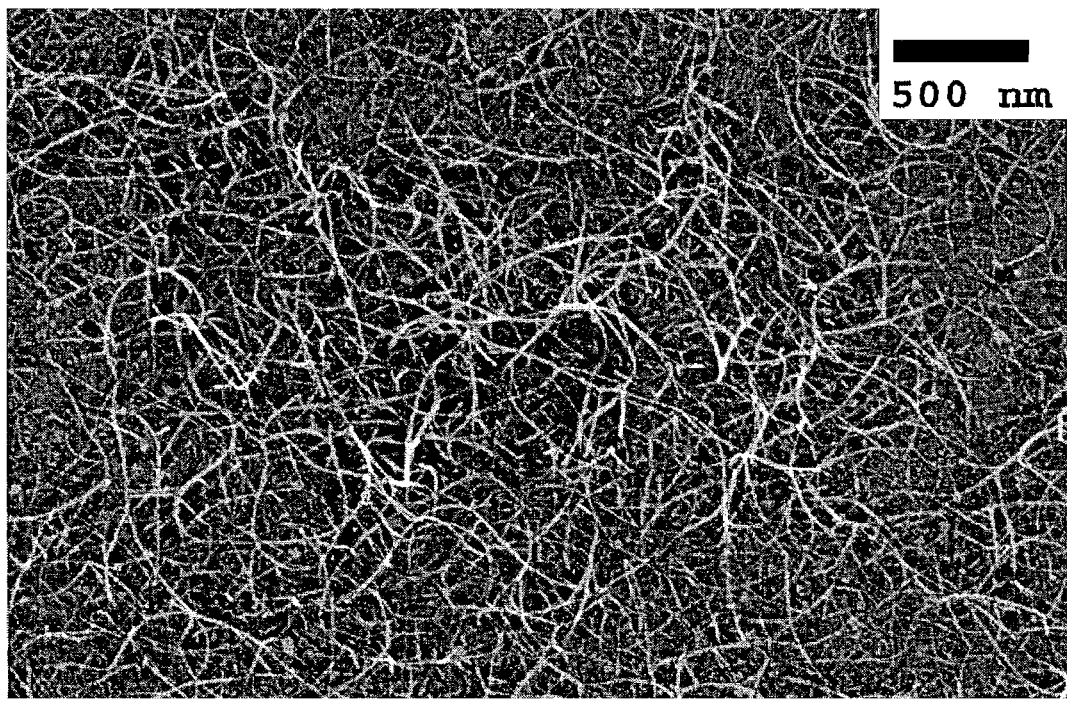
FIGS. 1C-1Z are micrographs of nanofabrics grown with exemplary processes according to certain embodiments of the invention.

Thin metal layers of aluminum, iron, and molybdenum (15 nm, 1 nm, and 2 nm, respectively) are sequentially deposited on a substrate. The substrate is placed in a tube furnace in which the temperature is ramped to 500° C. and held for thirty minutes, in an ambience of air. The temperature is then ramped to a CVD temperature of 850° C. in a flow of argon gas and hydrogen gas, at 100:400 sccm Ar:$H_2$ Upon reaching the CVD temperature, methane gas at a flow rate of 500 sccm is introduced into the furnace for a 1 minute growth time. Completing the CVD, the furnace is ramped down to below 200° C. in an argon atmosphere. FIG. 1C is a micrograph of a fabric made from this procedure.

EXAMPLE 2

Figure 1D:
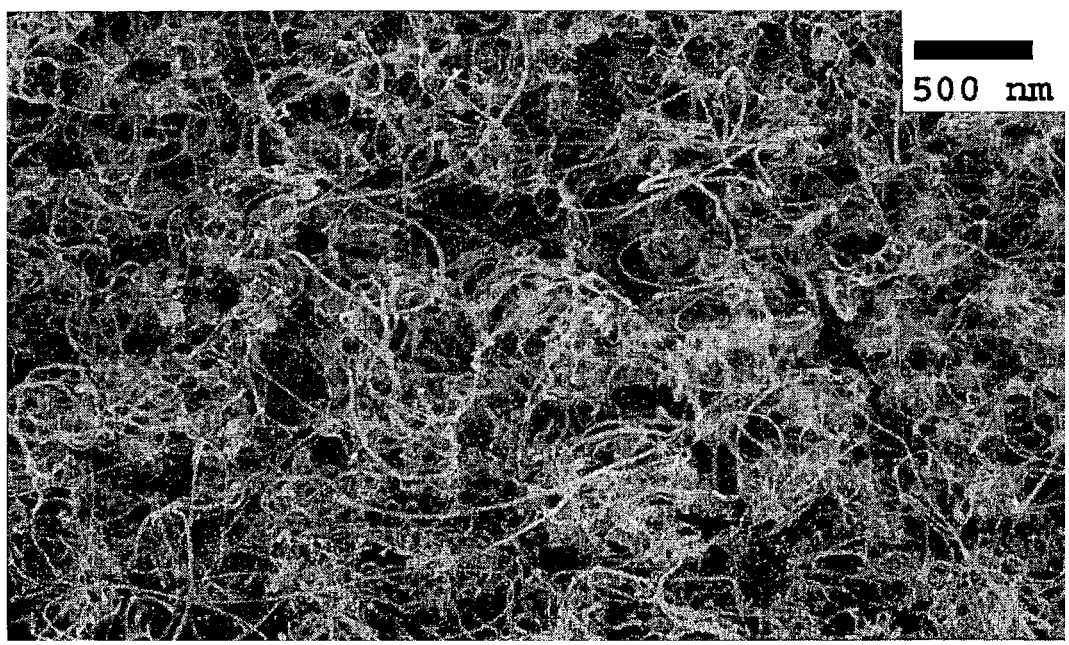
FIGS. 1B.1-1B.2 illustrate exemplary methods of growing nanotube fabric by CVD using the structure of FIG. 1A.

All parameters of example 1 are duplicated except in place of methane, ethylene is used at a flow rate of 5.0 sccm for 10 minutes, the CVD temperature is 800° C. The same types of metal layers are employed; however, the thicknesses of the metal layers used are 5 nm aluminum, 1 nm iron, and 2 nm molybdenum. FIG. 1D is a micrograph of the nanotube growth resulting from such use of ethylene.

EXAMPLES 3-6

Examples 3-6 show that the rate of methane gas flow affects the production of nanotube fabrics in typical CVD methods. From the micrographs one can see how the change in gas flow from 725 to 500 to 250 sccm affects the amount of growth. These examples show that the porosity and type of nanotubes grown may be controlled by changing specific parameters in the growth process. The growth of nanotubes is sustained over this range and can be finely controlled to generate primarily multilayer fabrics (750 sccm) to primarily monolayer fabrics (250 sccm). Reduction in gas flow to even lower levels is possible to assure primarily monolayer fabrics. An increase of the concentration would allow growth of fabrics with multilayers. Other parameters such as growth time and temperature can be controlled in concert with feedstock gas flow to provide more control over the fabric's characteristics.

Example 3

Figure 1E:
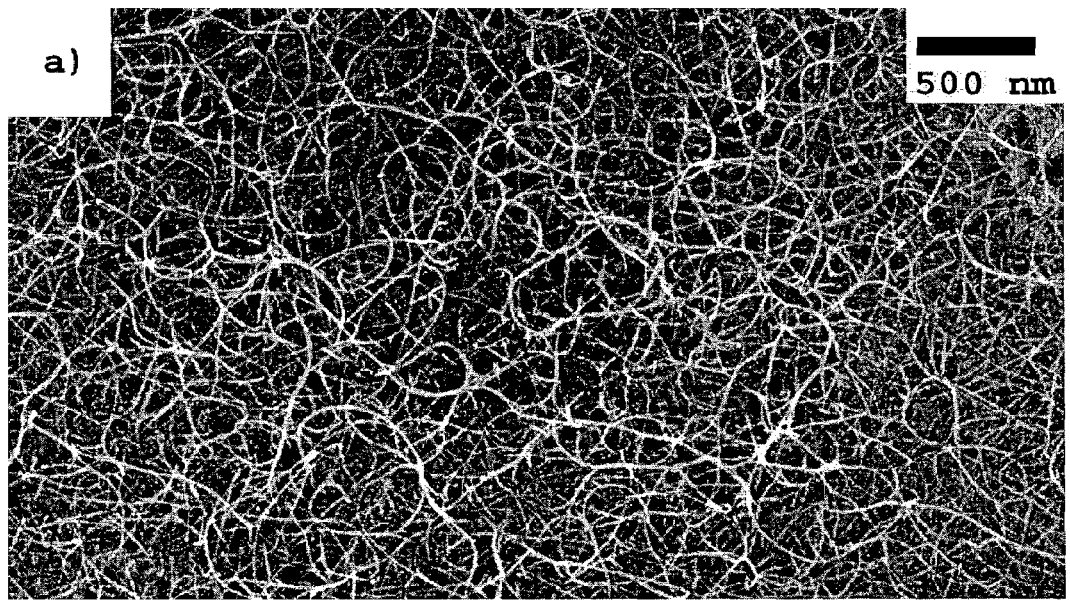

Methane is flowed at 725 sccm and the argon and hydrogen gas flow are kept constant at 100 sccm and 400 sccm, respectively. CVD is performed as above with the following parameters: the CVD is performed at 850° C. for 1 minute with the following metal layers: 15 nm aluminum, 1 nm iron and 2 nm molybdenum. FIG. 1E is a micrograph of the film which resulted from this procedure.

Example 4

Figure 1F:
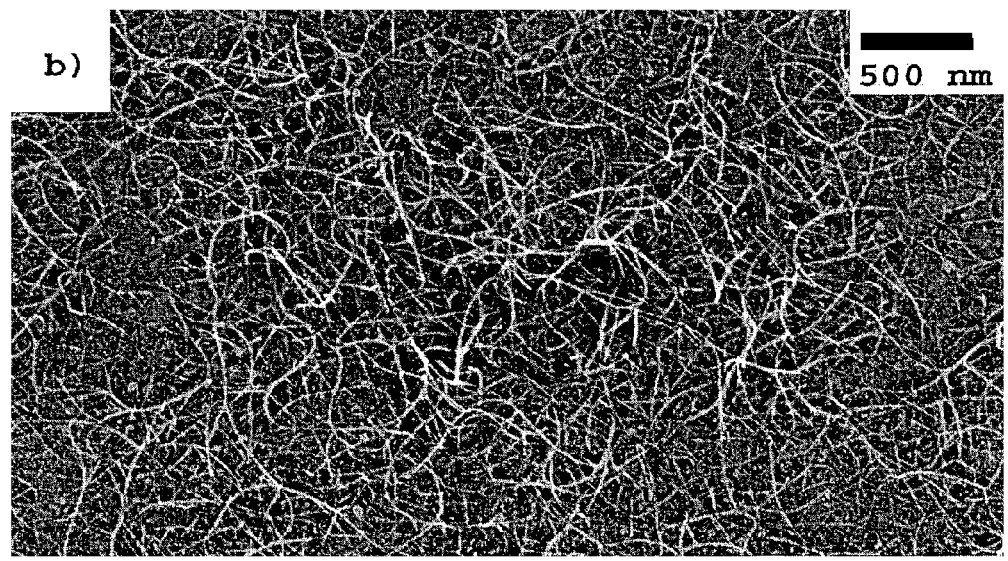

All parameters are kept the same as example 3 except methane gas flow is 500 sccm. FIG. 1F is a micrograph of the film which resulted from this procedure.

Example 5

Figure 1G:
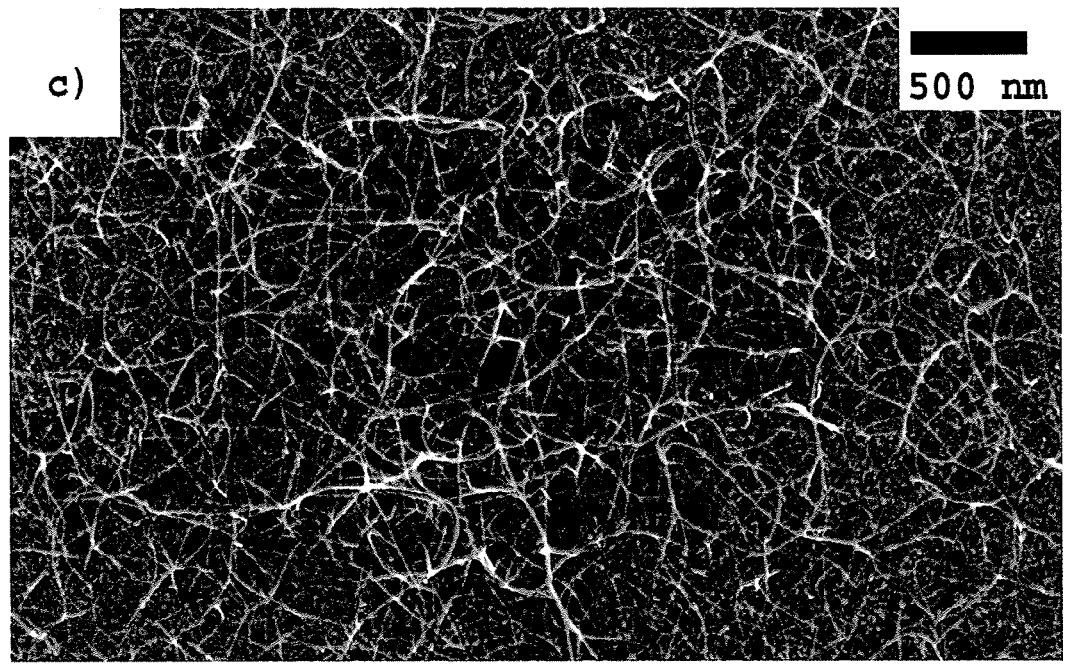

All parameters are kept the same as example 3 except methane gas flow is 250 sccm. FIG. 1G is a micrograph of the film which resulted from this procedure.

Example 6

Figure 1H:
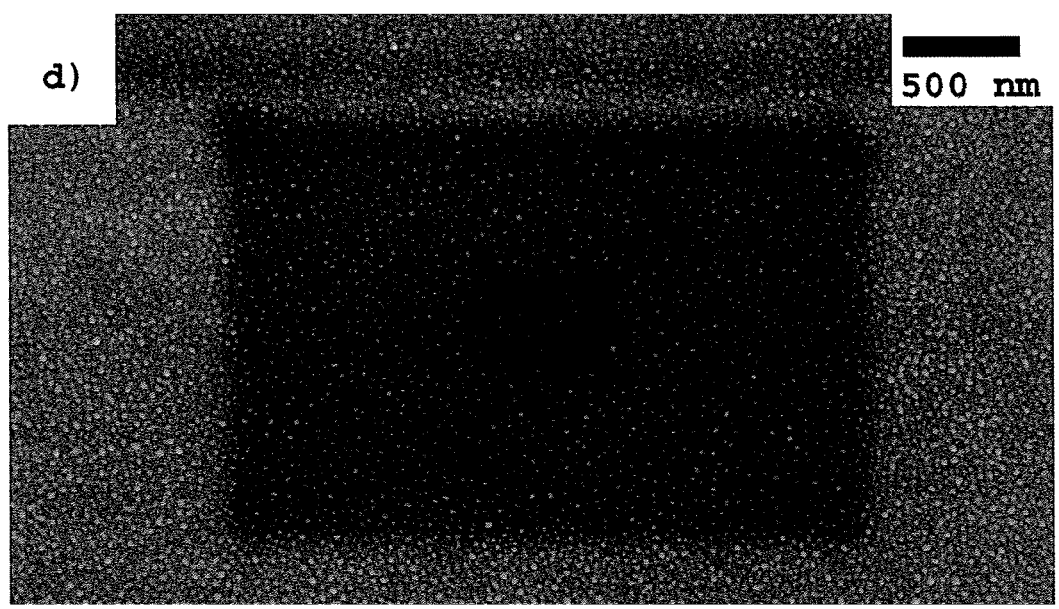

All parameters are kept the same as example 3 except methane gas flow is 100 sccm. FIG. 1H is a micrograph of the film which resulted from this procedure.

EXAMPLES 7-9

Examples 7-9 mirror examples 3-6 in that the flow rates of ethylene gas used are decreased in sequential CVD processes, while keeping all other variables constant. As above, all of these examples show fine control may be achieved over the growth density, nanotube porosity, nanotube length and the resistance per square values. (Resistance per square is used to assess in general the porosity of the nanotubes and/or their overall conductive quality.) Figures for examples 7-9, respectively, show fabrics corresponding to decreasing the gas flow. As flow decreases, the fabric density decreases and resistance increases.

Example 7

Figure 1I:
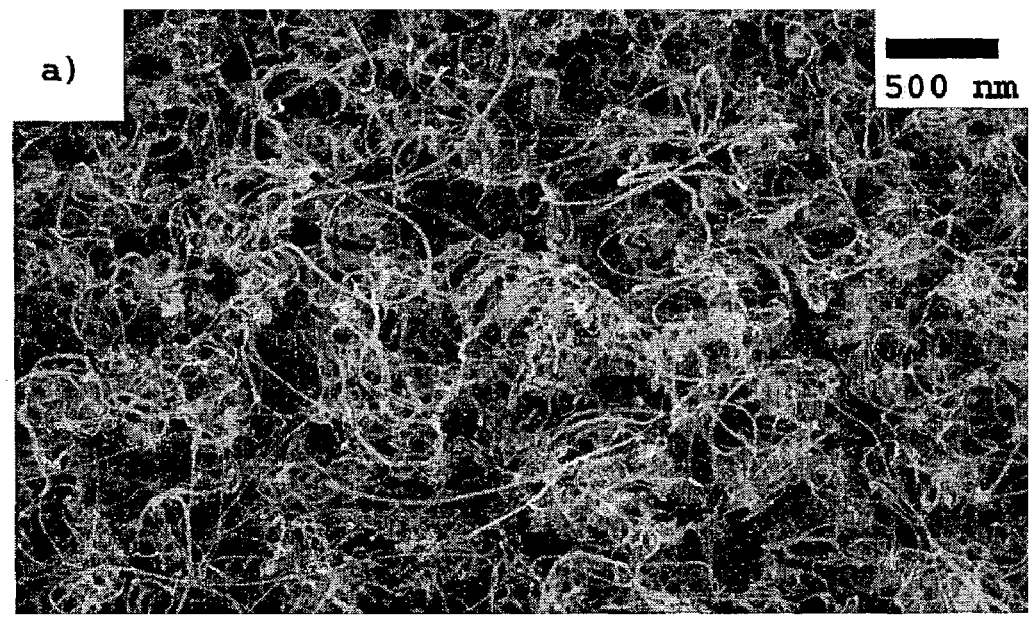

The argon flow and hydrogen flow are kept constant at 100 sccm and 400 sccm, respectively. Ethylene gas is flowed at 5.0 sccm. Metal layers are as follow: 5.0 nm aluminum, 1.0 nm iron and 2.0 nm molybdenum, the CVD temperature is 800° C., and is run for 10 minutes. FIG. 1I is a micrograph of the film, which resulted from this procedure.

Example 8

Figure 1J:
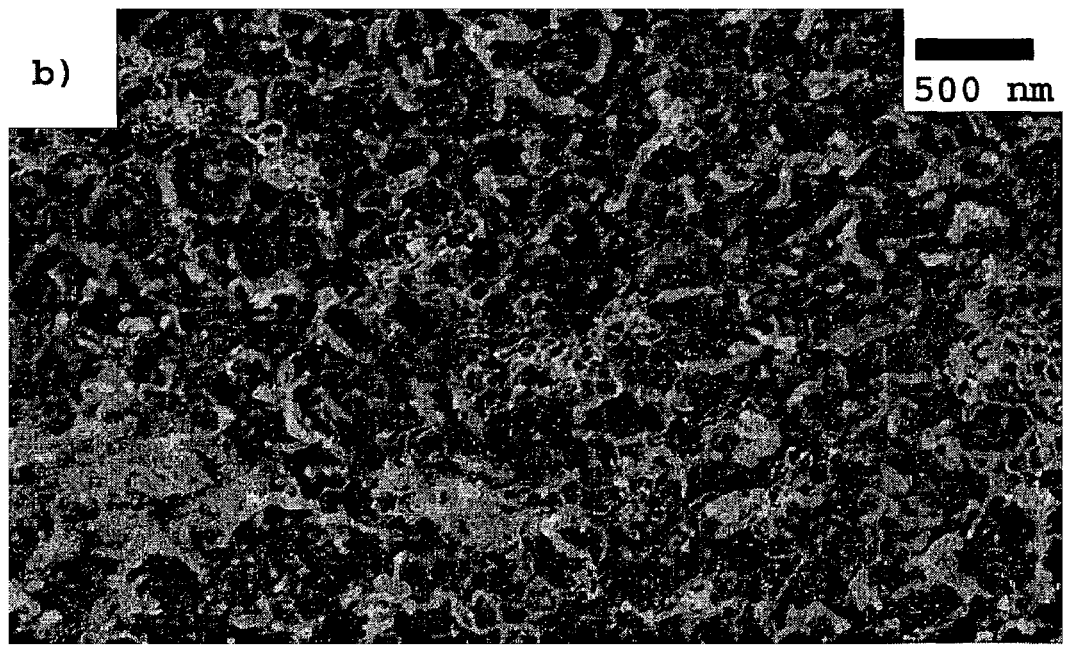

All parameters are kept the same as example 7 except ethylene gas flow is 2.5 sccm. FIG. 1J is a micrograph of the film which resulted from this procedure.

Example 9

Figure 1K:
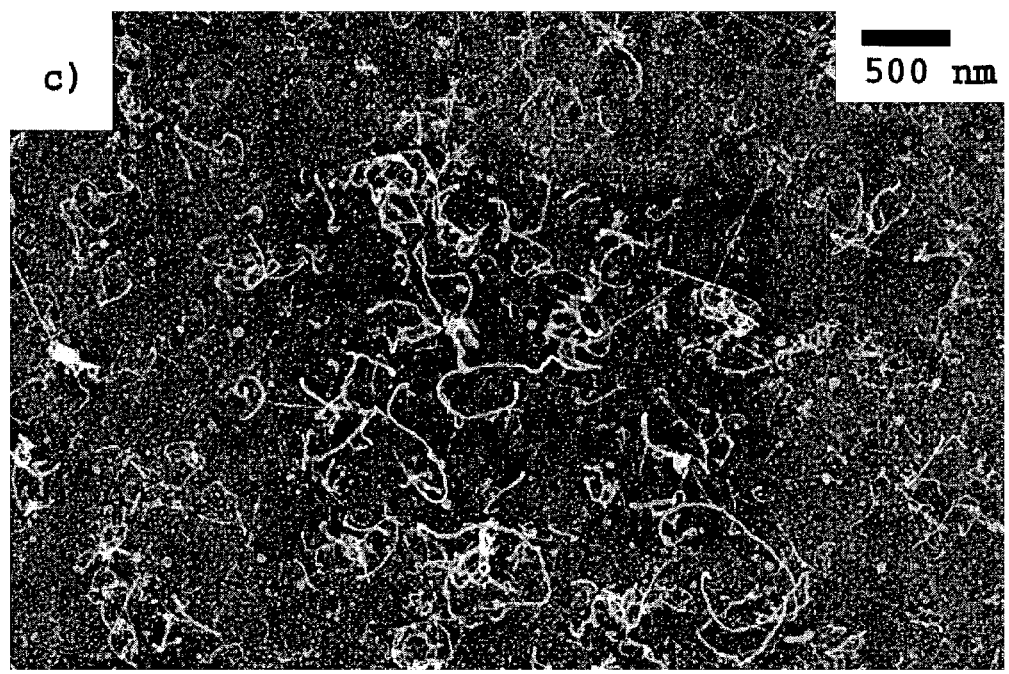

All parameters are kept the same as example 7 except ethylene gas flow is 1.0 sccm. FIG. 1K is a micrograph of the film which resulted from this procedure.

EXAMPLES 10-12

Examples 10-12 show the effects of reducing CVD temperatures while keeping all other parameters constant. The CVD methods are otherwise much the same as in example 1. These examples also show that fine control may be achieved in porosity, thickness and length of nanofabrics and nanotubes. Figures for examples 10-12, respectively, show fabrics corresponding to decreasing CVD temperatures. As the temperature decreases, the fabric density decreases, and the resistance increases.

Example 10

Figure 1L:
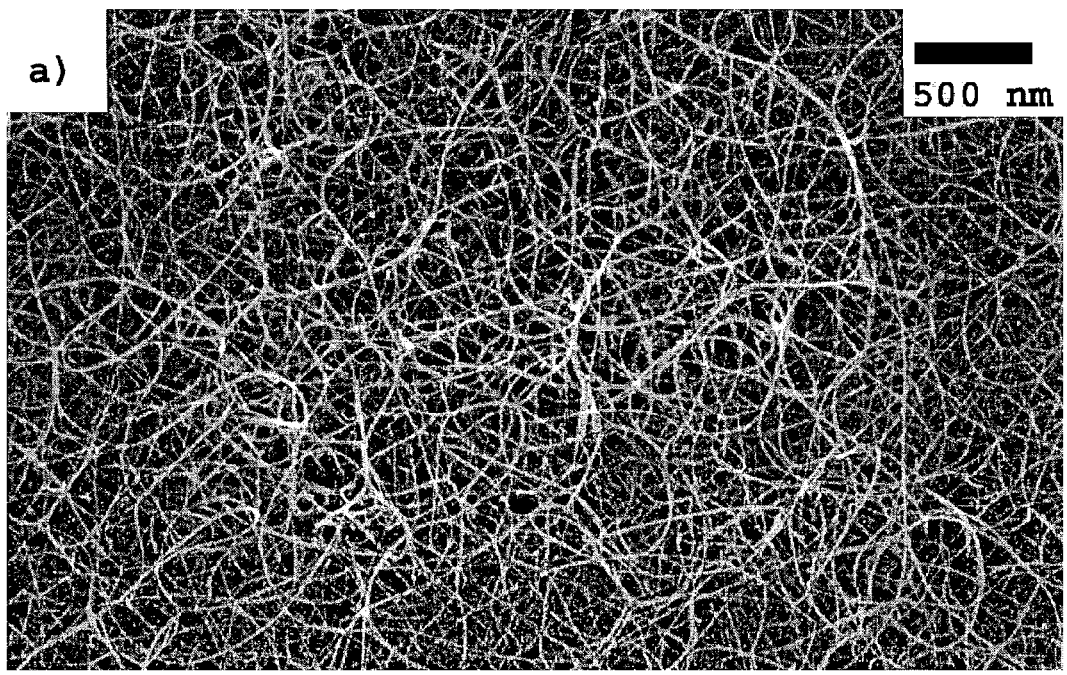

CVD is performed on a substrate of silicon coated with 15 nm aluminum, 1 nm iron and 2 nm molybdenum, using a 725 sccm flow of methane gas at 900° C. for ten minutes in Ar/H flow as above. FIG. 1L is a micrograph of the film which resulted from this procedure.

Example 11

Figure 1M:
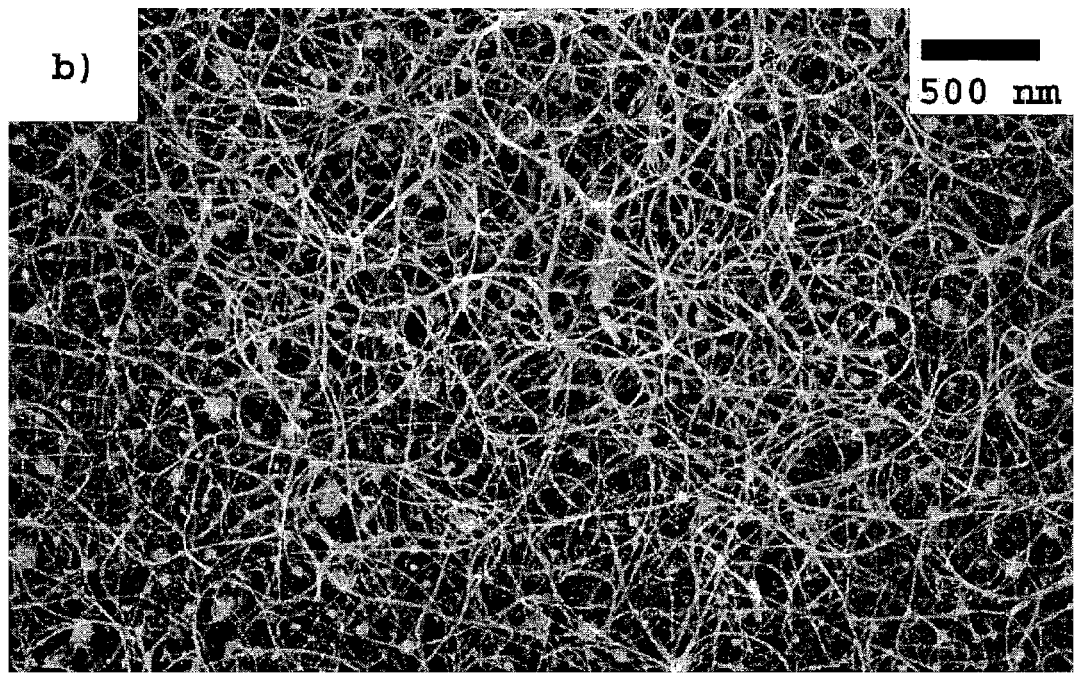

All parameters are kept the same as in example 10, except the CVD temperature is decreased to 850° C. FIG. 1M is a micrograph of the film which resulted from this procedure.

Example 12

Figure 1N:
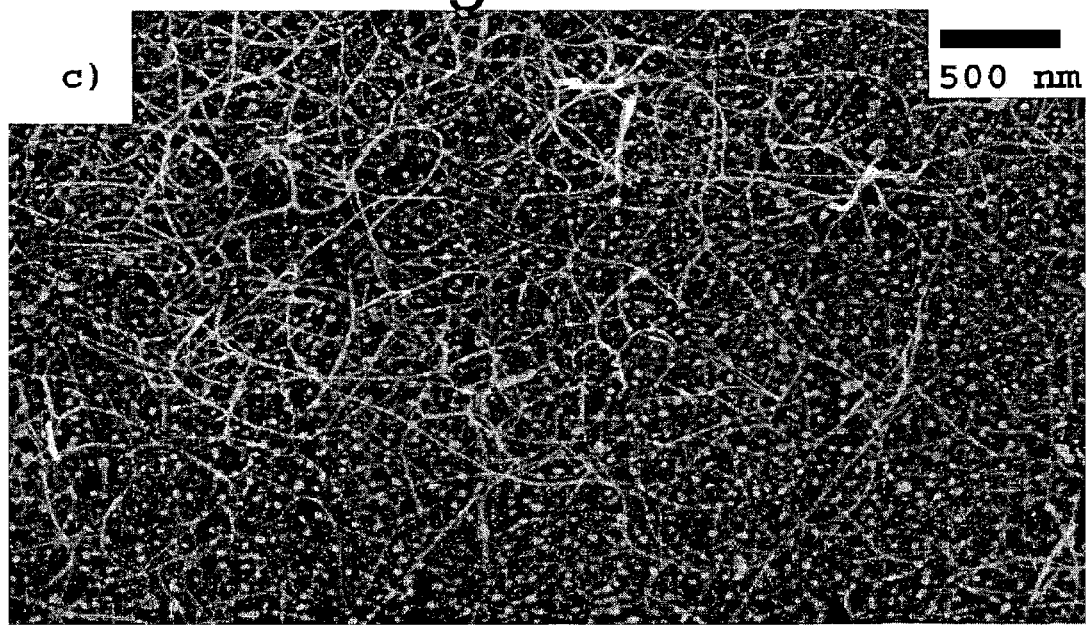

All parameters are kept the same as in example 10, except the CVD temperature is decreased to 800° C. FIG. 1N is a micrograph of the film which resulted from this procedure.

EXAMPLES 13-16

Figures for examples 13-16, respectively, show fabrics corresponding to decreasing CVD run time. As the run time decreases, the fabric density decreases, and the resistance increases.

Example 13

Figure 1O:
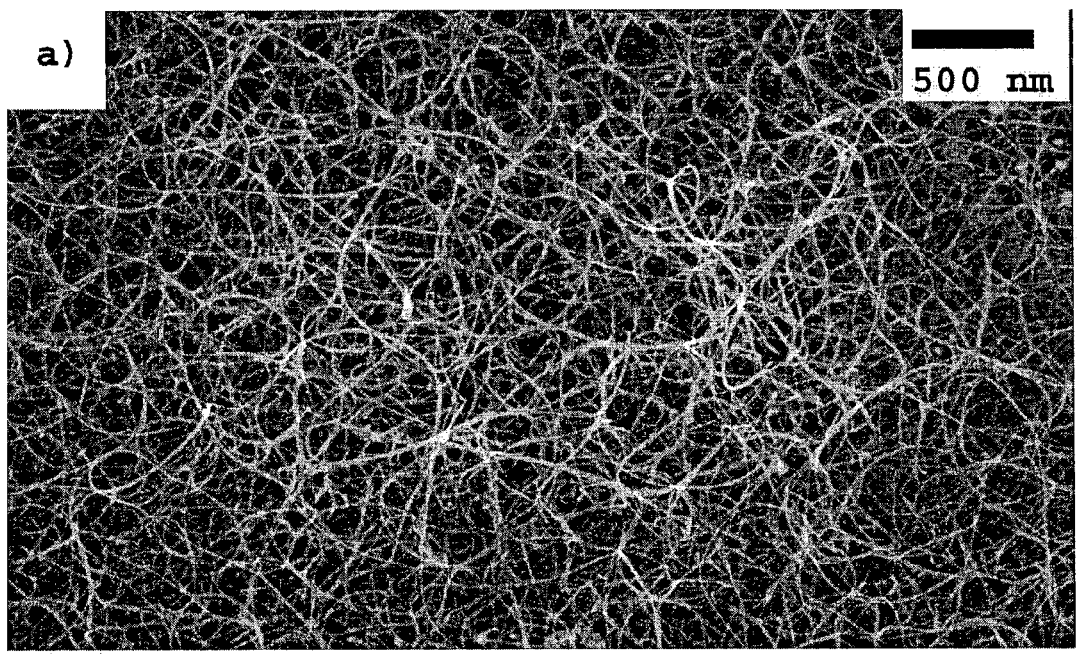

CVD is run for 10 minutes on a substrate of silicon coated with 15 nm aluminum, 1 nm iron, and 2 nm molybdenum at 850° C. in a 725 sccm flow of methane gas and 100:400 sccm Ar:H$_2$ as above. FIG. 1O is a micrograph of the film which resulted from this procedure.

Example 14

Figure 1P:
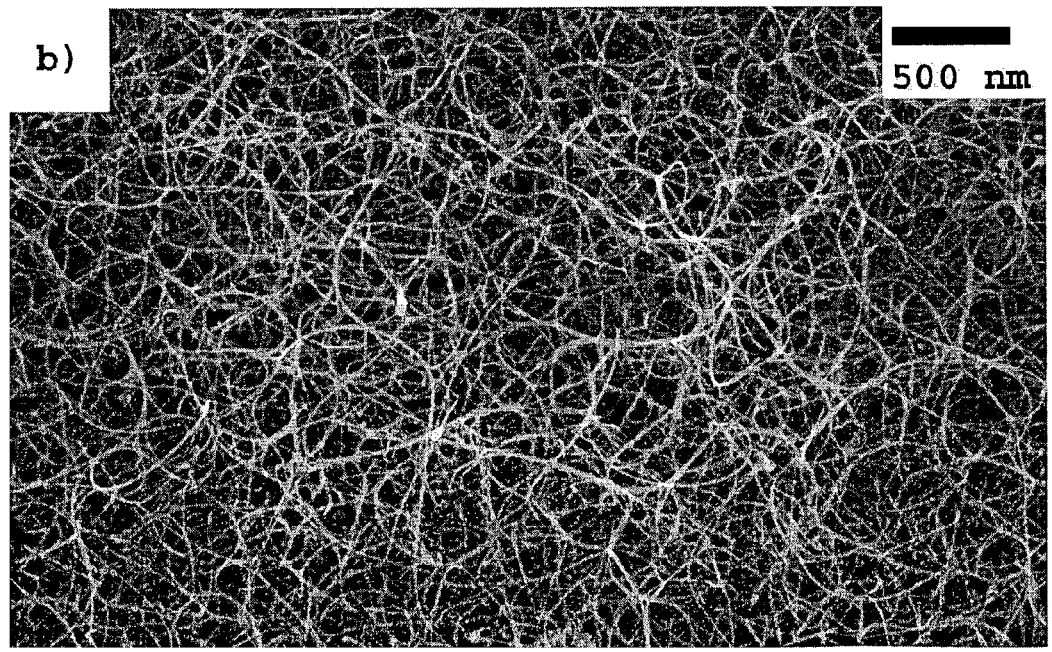

All parameters are kept the same as example 13, except the CVD run time is decreased to five minutes. FIG. 1P is a micrograph of the film which resulted from this procedure.

Example 15

Figure 1Q:
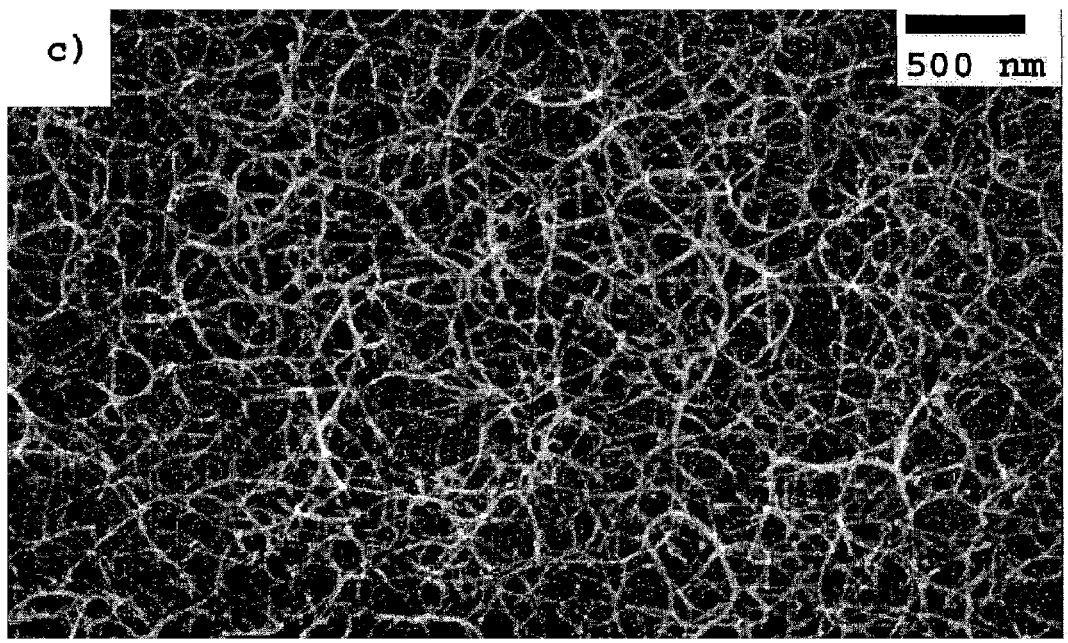

All parameters are kept the same as in example 13, except the CVD run time is decreased to two minutes. FIG. 1Q is a micrograph of the film which resulted from this procedure.

Example 16

Figure 1R:
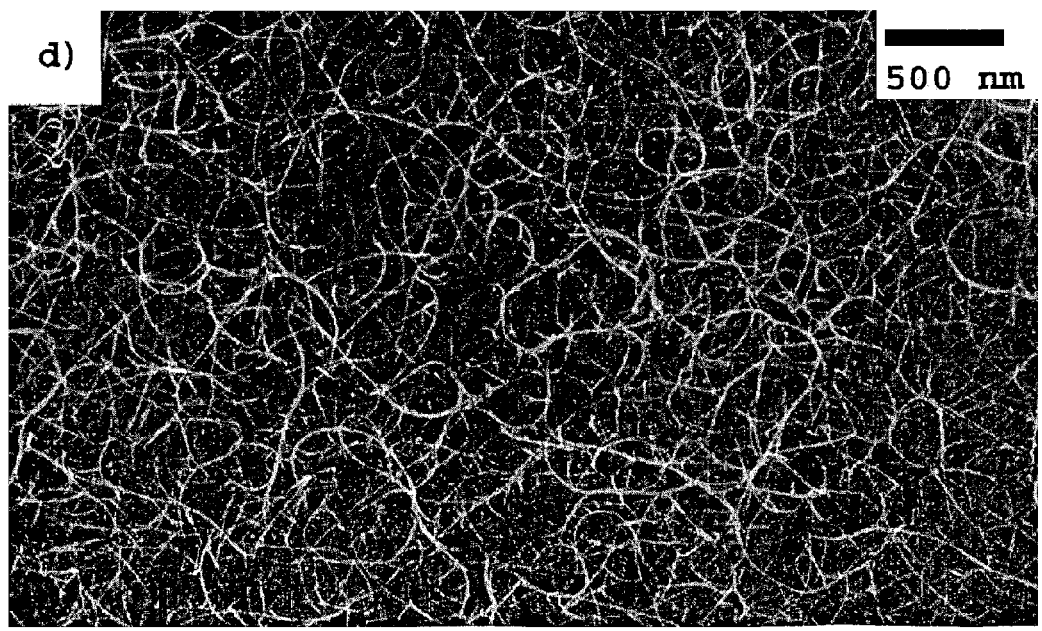

All parameters are kept the same as in example 13, except the CVD run time is decreased to one minute. FIG. 1R is a micrograph of the film which resulted from this procedure.

EXAMPLES 17-20

Examples 17-20 show the effect that varying the thicknesses of the aluminum metal layer has on the resulting films. As above, all of these examples show fine control may be achieved over the growth density, nanotube porosity, nanotube length and the resistance per square values. Figures for examples 17-20, respectively, show fabrics corresponding to decreasing thickness of the metal layer catalyst. As the thickness decreases, the fabric density decreases, and the resistance increases.

Example 17

Figure 1S:
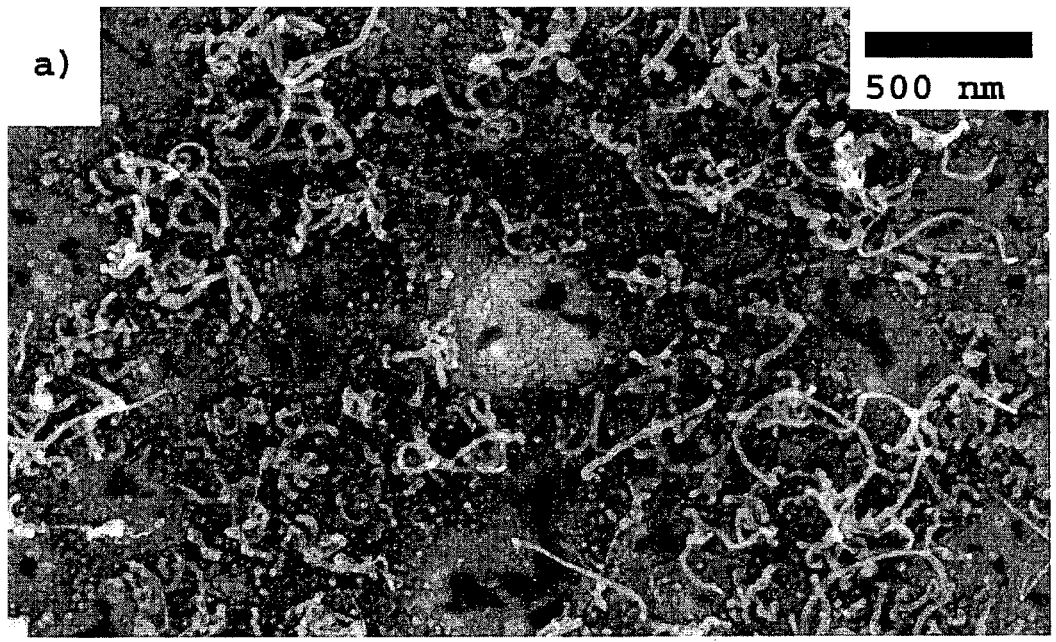

CVD is performed on a substrate of silicon coated with 25 nm aluminum, 1 nm iron and 2 nm molybdenum, using a 725 sccm flow of methane gas and the argon and hydrogen gas flow are kept constant at 100 sccm and 400 sccm, respectively, at 850° C. for ten minutes. FIG. 1S is a micrograph of the film which resulted from this procedure.

Example 18

Figure 1T:
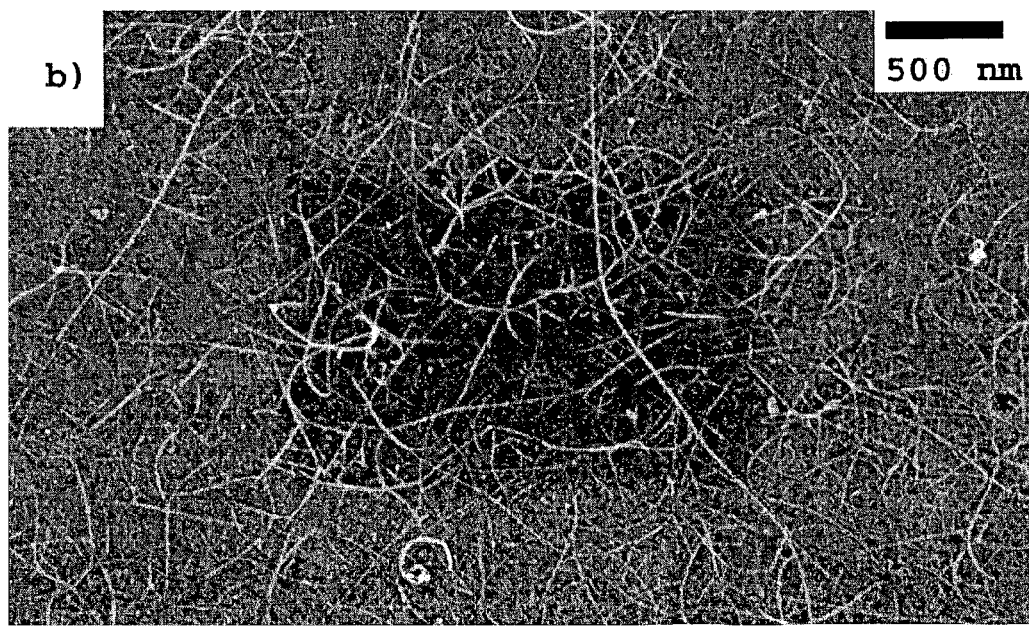

All parameters are kept the same as in example 17, except the thickness of the aluminum layer is decreased to 15 nm. FIG. 1T is a micrograph of the film which resulted from this procedure.

Example 19

Figure 1U:
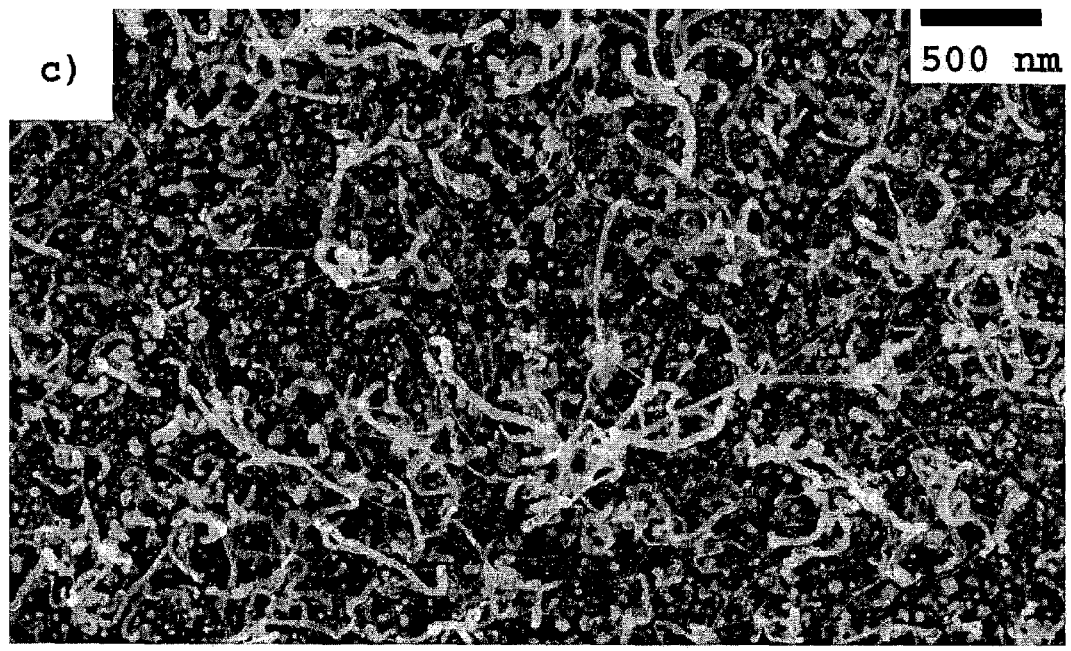

All parameters are kept the same as in example 17, except the thickness of the aluminum layer is decreased to 5 nm. FIG. 1U is a micrograph of the film which resulted from this procedure.

Example 20

Figure 1V:
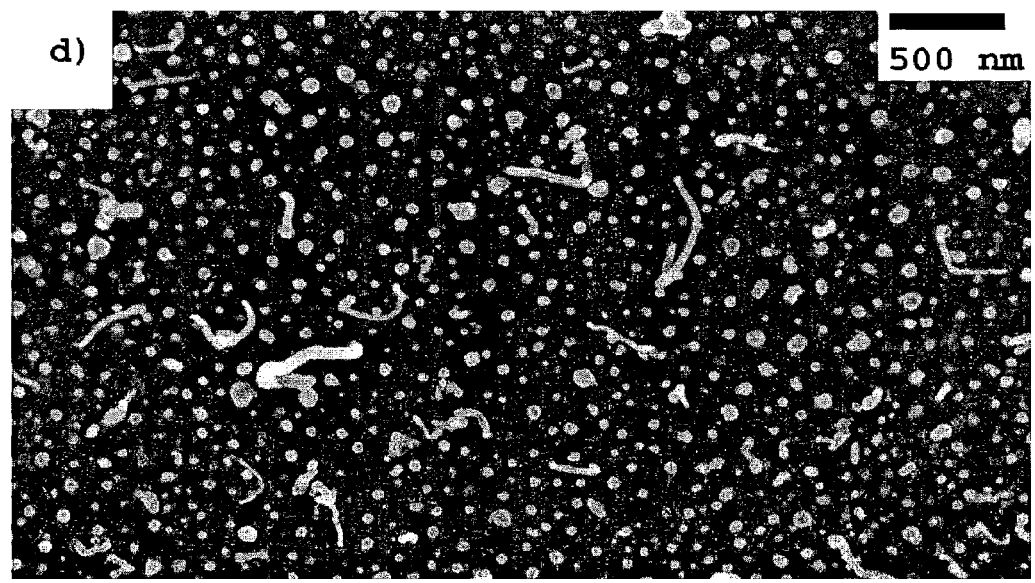

All parameters are kept the same as in example 17, except the thickness of the aluminum layer is decreased to 0 nm (no aluminum is deposited in this example). FIG. 1V is a micrograph of the film which resulted from this procedure.

EXAMPLES 21-22

Examples 21-22 show the results of altering thin metal layer thickness and using silicon dioxide as substrate. Altering the metal layer thickness allows tuning of the porosity and specifically the type of nanotubes. Thicker layers are more conducive to growing MWNTs while thinner layers grow better SWNTs and leave less residual metal because they are vaporized at the high temperatures of nanotube growth. Figures for examples 21-22, respectively, show fabrics corresponding to decreasing thickness of the metal layer catalyst. As the thickness decreases, the fabric density decreases, and the resistance increases.

Example 21

Figure 1W:
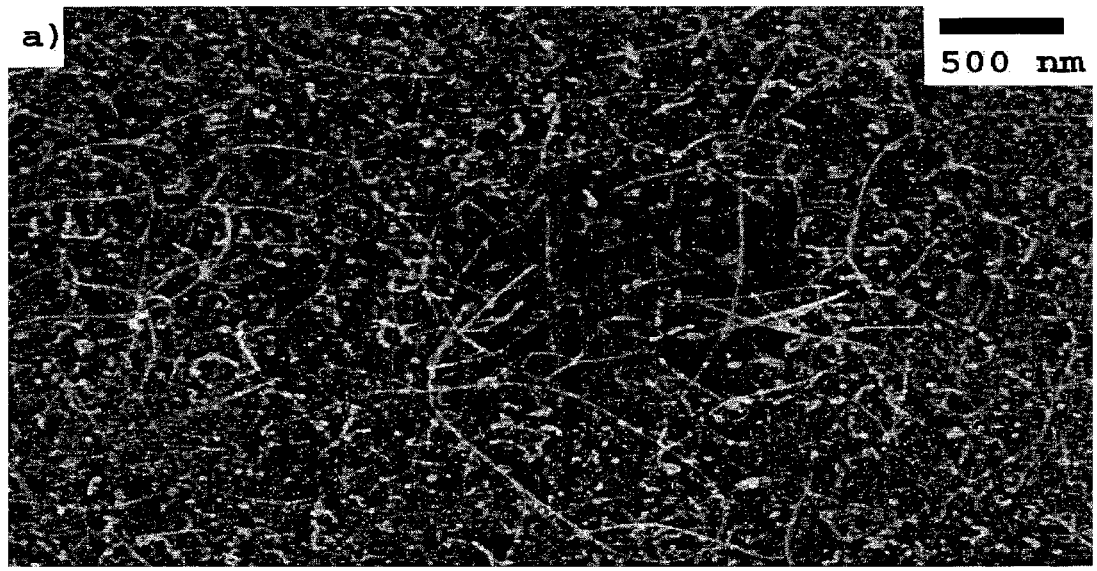

CVD is performed on a silicon dioxide substrate coated with thin metal layers; 2.0 nm aluminum, 0.5 nm iron and 1.0 nm molybdenum at 850° C. in a 500 sccm flow of methane gas in 100:400 sccm Ar:$H_2$ for one minute. FIG. 1W is a micrograph of the film which resulted from this procedure.

Example 22

Figure 1X:
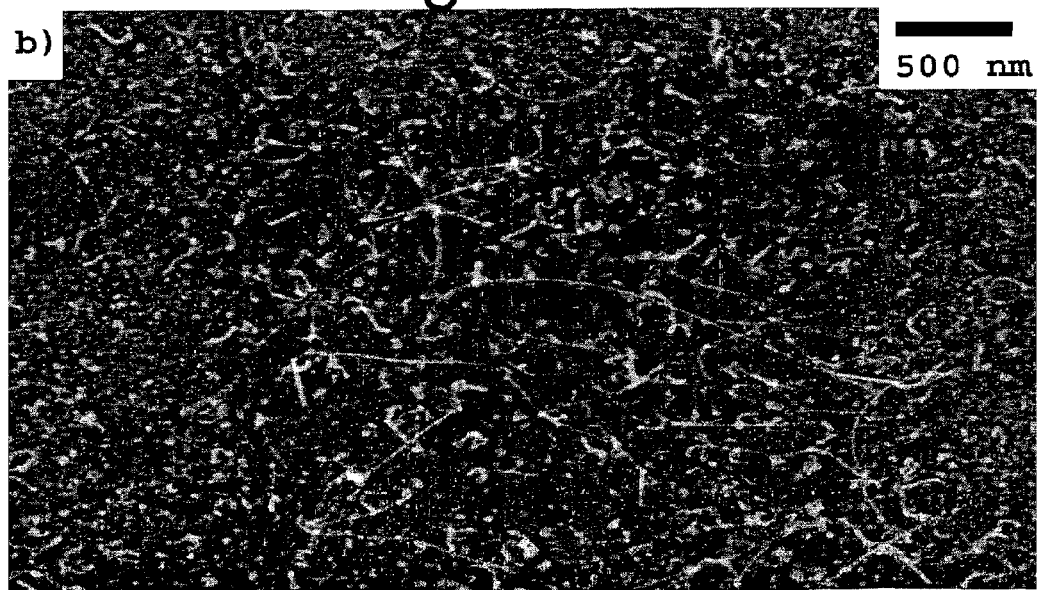

All parameters are kept the same as example 21, except thin metal layers of the following thicknesses; 1.0 nm aluminum, 0.5 nm iron and 1.0 nm molybdenum were used. FIG. 1X is a micrograph of the film which resulted from this procedure.

EXAMPLES 23-24

Examples 23 and 24 show the films that are grown by CVD on silicon and silicon dioxide substrates. These examples illustrate control over porosity even on different substrates. Here we have an example of a semiconducting substrate and an insulating substrate. Growth is achievable on a variety of substrate layers allowing ready integration into typical semiconductor process flows and ease of manufacture. Figures for example 23 and 24 show that the fabric density changes with the type of substrate, and thus resistance changes.

Example 23

Figure 1Y:
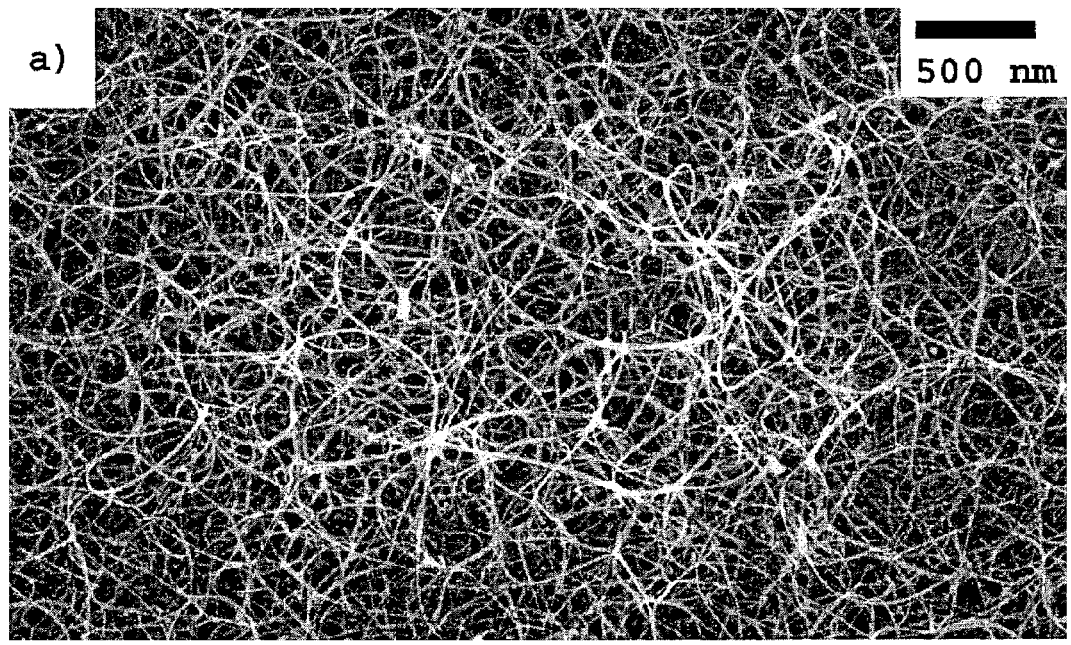

CVD is performed on a silicon substrate coated with thin metal layers; 15 nm aluminum, 1.0 nm iron and 2.0 nm molybdenum at 850° C. in a 500 sccm flow of methane gas for two minutes. FIG. 1Y is a micrograph of the film which resulted from this procedure.

Example 24

Figure 1Z:
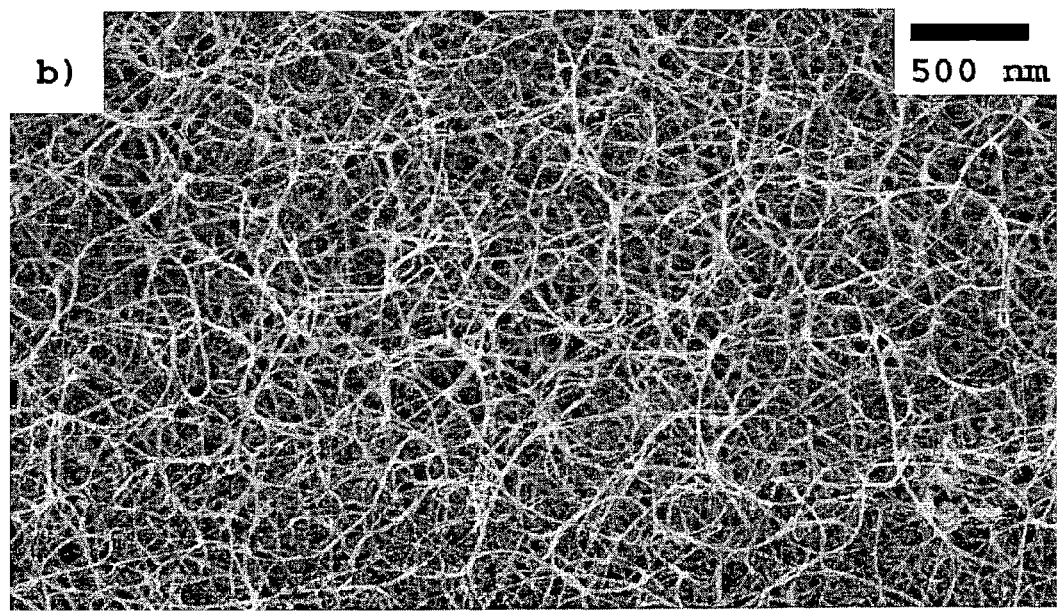

All parameters are kept the same as example 23, except silicon dioxide is used as substrate. FIG. 1Z is a micrograph of the film which resulted from this procedure.

Growing Nanofabrics with Nanoparticles

Another preferred method of growing nanofabrics uses metallic or metal oxide nanoparticles (e.g., iron oxide) as carbon nanotube growth catalyst. Metallic or metal-oxide nanoparticles have a narrow range of diameters. This narrow range can lead to more effective control over the diameter and type of nanotubes forming the eventual nanofabric. The surface of the substrate used can be derivitized to create a more hydrophobic or hydrophilic environment to promote better adhesion of the catalyst particles. The nature of the substrate allows control over the level of dispersion of the nanoparticles to a precision sufficient to generate monolayer nanotube fabrics.

Figure 3A:
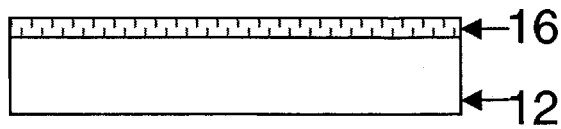
FIG. 3A shows a structure, according to certain embodiments of the invention, having a distribution of nanoparticles that may be used in an exemplary method of growing nanofabric.

FIG. 3A shows a cross-sectional view of an exemplary structure 20 used to grow nanofabrics. A substrate 12 has a distribution 16 of metallic or metal oxide nanoparticles thereon. (For simplicity, the figure shows the distribution as a continuous layer, though people skilled in the art will appreciate that in reality the structure 20 will have a distribution of relatively discrete nanoparticles.) The substrate surface used for generation of carbon nanotubes may be any material including, but not limited to, silicon, thermal oxide, silicon oxide, silicon nitride, tungsten, tungsten/titanium and other typical insulators, semiconductors and metallic surfaces commonly used in CMOS and semiconductor fabrication processes the surface may have electronic components and patterns already defined therein, as mentioned above, and the substrate may be functionalized or non-functionalized.

Figure 3B:
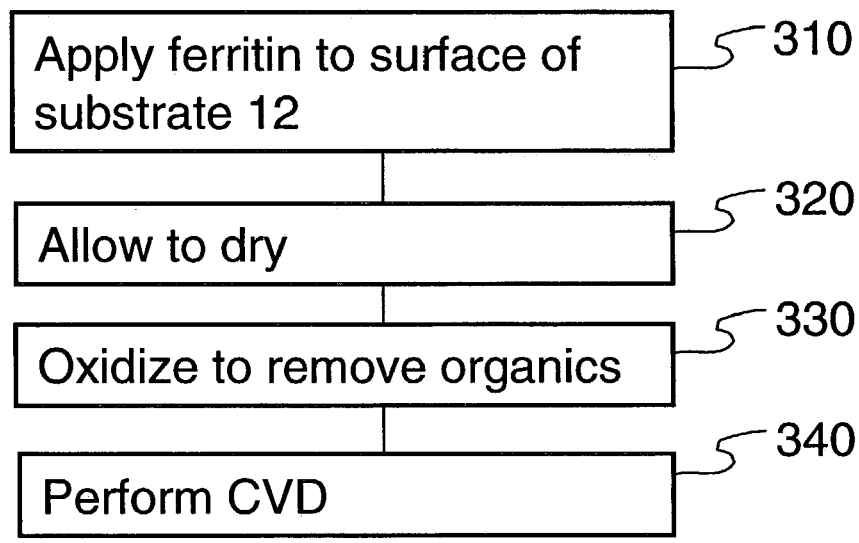
FIGS. 3B-C illustrate exemplary methods of growing nanotube fabric by CVD using the structure of FIG. 3A.

FIG. 3B illustrates a way of growing a nanofabric using a substrate coated with nanoparticles 16. A mixture of ferritin and water is created. For example, ferritin dissolved in deionized (DI) water at a typical concentration (1-1000 μM) (SIGMA catalog) is provided. The ferritin contains naturally encapsulated iron in an organic layer or shell, and can be processed so that the encapsulated iron may be used in subsequent nanotube generation. This shell is oxidized using air or oxygen oxidation or plasma ashing, which causes its removal leaving only an iron oxide nanoparticle. During CVD growth of nanotubes the iron oxide nanoparticles are reduced to leave metallic iron nanoparticles which catalyze the growth of nanotubes. The purpose of using ferritin or any appropriate nanoparticles is to cause the nanoparticles to be dispersed on the surface in an even fashion (monodisperse). Ferritin particles have a very narrow diameter range as do the nanoparticles discussed below.

The ferritin solution is applied 310 to a surface of substrate 12. Before application the substrate can be derivitized to make it more hydrophilic or hydrophobic in order to promote adhesion of the ferritin to the surface. The substrate is allowed to dry 320 (e.g. approximately five minutes has been found to be sufficient). This leaves a coating of ferritin on the surface of the substrate. The protein shells are then removed 330 from the ferritin particles. For example, the structure may be subjected to either an oxidation operation at 400-800° C. for about 15 minutes, or it may be subjected to a plasma ashing operation. The oxidation process removes substantially all of the proteinaceous shell from the ferritin, thereby leaving behind a coating 16 of nanoparticles of iron oxide. The nanoparticles are approximately two to five nanometers in diameter, or more particularly approximately three nanometers in diameter. (See Li, 46 Journal Physical Chem. above.) Once catalyst particles from ferritin are formed, CVD may be performed 340 to grow a nanofabric of nanotubes. The nanofabric may be grown, for example, over an entire wafer surface as a monolayer of contacting nanotubes. The above embodiment is conducive to growing a conductive (primarily) monolayer fabric with sufficient density to remain suspended over a switching junction.

Under yet other embodiments, metal ligand-catalyst precursor molecules are used to deposit metallic nanoparticles on a functionalized substrate surface to thereby help create growth of nanotubes. Typically, the formula of the metal/ligand complex will have a formula such as ML, in which M is a metal such as iron, cobalt, or nickel, and L is one or more organic ligands having an affinity for the metal. One general formula may be $C_xH_y$ (COOH), but other carbon, oxygen, nitrogen and/or sulfur-containing ligands are known and may be used. A metallic nanoparticle ligated to an organic moiety is deposited on a functionalized substrate surface. The surface is functionalized to optimize ligand bonding during spin coating, a procedure which may result in minimal deposition of untreated nanoparticles. Certain embodiments use a generic method to synthesize metallic nanoparticles with organic shells which have a very specific size regime for example 3-5 nm which can be monodisperse on a substrate.

Certain embodiments use prefabricated iron oxide particles as carbon nanotube growth catalyst. Iron oxide nanoparticles are applied to a substrate in a concentration sufficient to support the desired density of nanotube growth. The substrate is then subjected to a CVD operation as described herein. The substrate, optionally, can be dried and/or oxidized prior to beginning the CVD run. For example, iron oxide nanoparticles may be applied to a substrate surface by spin coating. In one embodiment, iron oxide is suspended in deionized water at a 1:10 ratio. The aqueous iron suspension is applied to a substrate surface, and the surface is spun at approximately 1000 rpm to distribute the suspension. The surface is then spun at 4000 rpm to dry the suspension. More than one application of iron oxide nanoparticles may be performed. The number of applications of iron oxide nanoparticles required will vary depending on the concentration of the suspension used, the desired resulting surface density of nanoparticles, the physical properties of the desired fabric, and the physical properties of the substrate used.

Figure 3C:
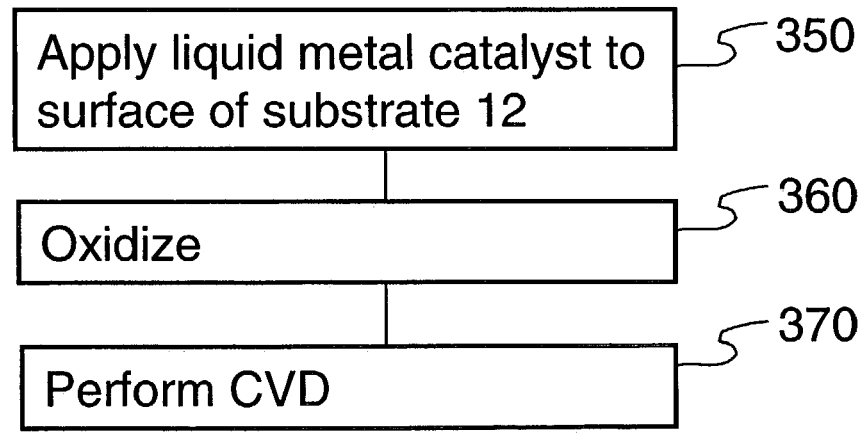

Under yet other embodiments, a liquid catalyst precursor suspension is used. FIG. 3C illustrates a way of growing a nanofabric using liquid metal catalyst. A liquid metal catalyst is created. For example, a dissolved metal catalyst, e.g., iron nitrate $(Fe(NO_3)_3)$, is mixed with methanol and applied onto a substrate 350. The substrate is oxidized 360, e.g., by ashing, thereby leaving a dispersion of iron oxide nanoparticles on the surface of the substrate. The substrate is then subjected to a CVD operation 370 to grow nanotubes. Provided below are several exemplary ways of growing nanofabrics using the above principles.

EXAMPLE 25

Figure 3D:
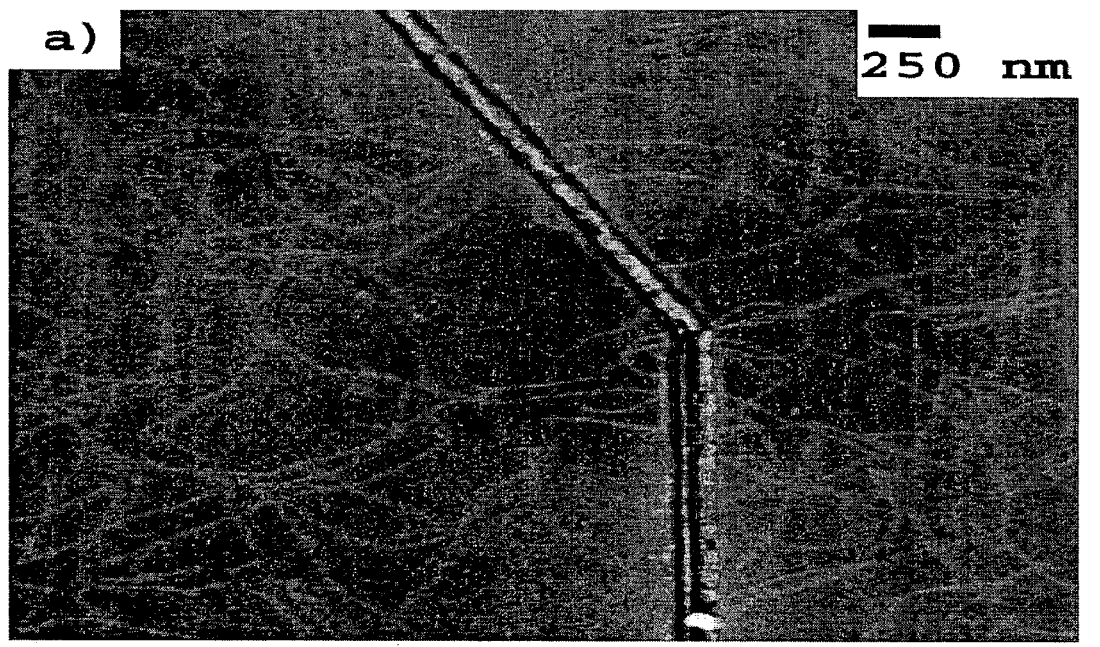
FIGS. 3D-3F are micrographs of nanofabrics grown with exemplary processes according to certain embodiments of the invention.

This is an example of nanoparticles using metal-ligand catalyst precursor molecules. HMDS (hexamethyldisilane) is spun onto a silicon dioxide substrate at 4000 rpm for one minute as an adhesion layer. Iron nanoparticles are made by dissolving $Fe(NO_3)_3$ in solution of a lauric acid in methanol at a ratio of 1:3.3 Fe: lauric acid. The nitrate solution is evacuated to pump off nitric acid, and the solvent. The dried iron nanoparticles are then added to 10 mL toluene and 10 mL isopropanol to resuspend the nanoparticles in solution. The Fe nanoparticle solution is then diluted 1:25 in isopropanol. The iron nanoparticles in a 1:25 iron nanoparticle solution in isopropanol is then deposited on the wafer by spinning at 1000 rpm for 30 seconds, then at 4000 rpm for 20 seconds. Two Fe nanoparticle applications are deposited and spun. The substrate is baked at 100° C. to remove the solvent, it is then ashed for 30 minutes in $O_2$ plasma, CVD is performed at 850° C. for ten minutes in a 500 sccm flow of methane and a 100:400 sccm flow of $Ar:H_2$. FIG. 3D is a micrograph of a nanofabric which resulted from this procedure. The nanoparticles in this embodiment can be tuned to a particular size by changing the organic ligand (analogous to the protein shell of ferritin) that is bound to the metal. Additionally, nanoparticles of different metal or metal oxide species may be mixed together in a solution and applied for use as catalyst, e.g., 50% Fe and 50% Co, or 33% Fe 33% Co and 33% Al, or any other appropriate combinations.

EXAMPLE 26

Figure 3E:
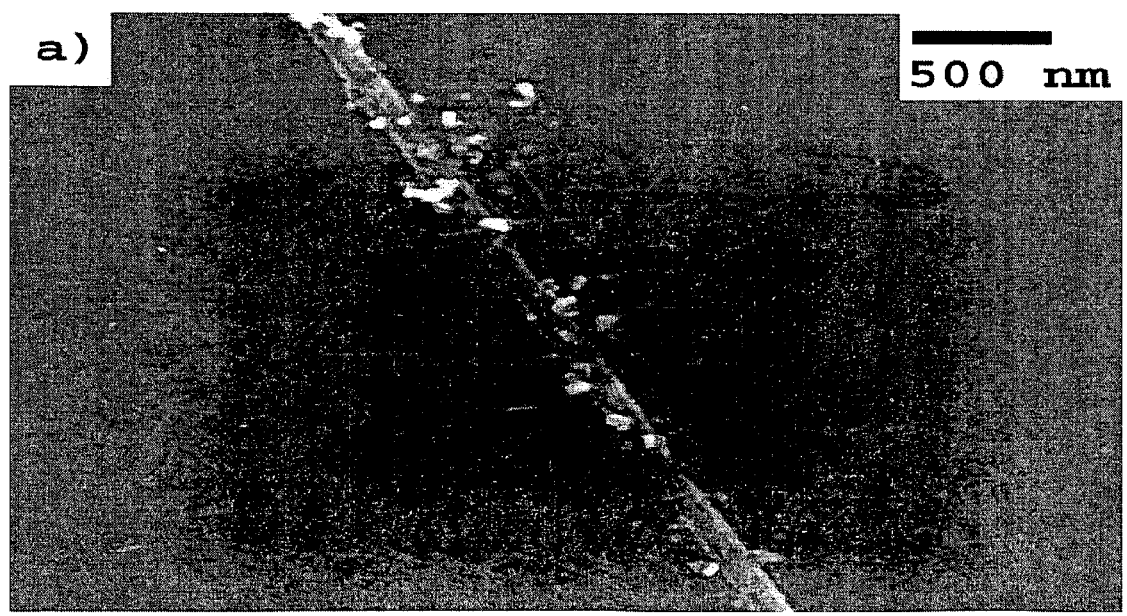

This is an example of iron nanoparticles in solution which are dispersed onto a silicon dioxide substrate and not spin coated on the surface. After the catalyst is dispersed onto the surface, the substrate is allowed to stand for 5 min., covered, and baked at 100° C. to remove solvent, and it is ashed. CVD is performed at 850° C. for ten minutes in a 500 sccm flow of methane and a 100:400 sccm flow of $Ar:H_2$. FIG. 3E is a micrograph of a nanofabric which resulted from this procedure.

EXAMPLE 27

Figure 3F:
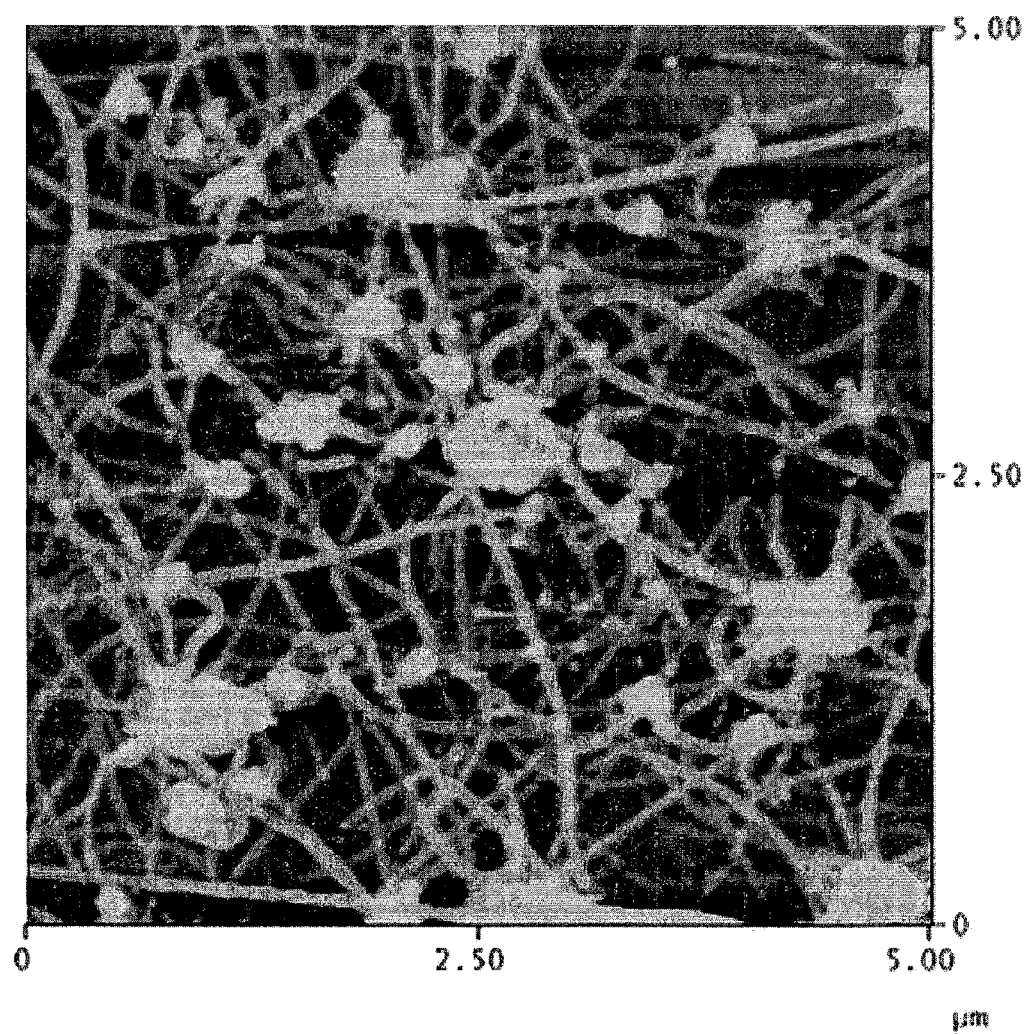

Example 27 demonstrates the growth of carbon nanotubes from a substrate with ferritin on the surface. The process involves the use of ferritin as a catalyst precursor. A 1:10 mixture of ferritin in deionized water is applied to a silica surface of a wafer. The wafer is dried, leaving a dispersed coating of ferritin on the surface of the substrate. The substrate is oxidized to remove all non-iron, organic matter and placed in the oven. The oven is ramped to 700° C. for 10 minutes in $Ar:H_2$, then it is ramped to 800° C. for seven minutes in $Ar:H_2$. CVD is performed at 800° C. with a 10 sccm flow of ethylene for 40 minutes in 600:400 sccm $Ar:H_2$. FIG. 3F shows a FESEM micrograph of carbon nanotubes grown using ferritin as catalyst precursor.

Growing Nanofabrics with a Combination of Nanoparticles and Thin Metal Layers Another preferred method of growing nanofabrics uses nanoparticles in conjunction with thin metal layers on a substrate surface. This method allows one to easily distribute catalyst particles while taking advantage of the ease of thin layer deposition and their properties in assisting the process of growing nanotubes. Recall that aluminum and molybdenum are useful in generating surface carbon precursors that grow nanotubes.

Figure 4A:
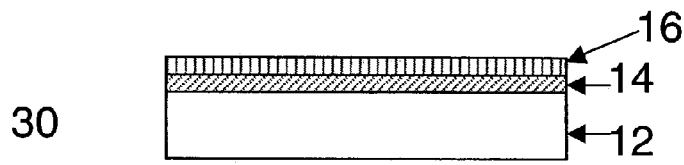
FIG. 4A shows a structure, according to certain embodiments of the invention, having a thin layer of metal catalyst and having a distribution of nanoparticles that may be used in an exemplary method of growing nanofabric.

FIG. 4A shows a cross-sectional view of an exemplary structure 30 used to grow nanofabrics. A substrate 12 has a thin layer 14 of metal catalyst and a distribution 16 of nanoparticles thereover. The substrate surface used for generation of carbon nanotubes may be any material including, but not limited to silicon or thermal oxide, e.g. silicon oxide, alumina. The uppermost layer can be an insulator, semiconductor or metal. Typical substrates which are of interest include silicon dioxide (SiO$_2$), silicon nitride (Si$_3$N$_4$), titanium, titanium/tungsten and others used in standard CMOS and semiconductor processing. The surface may have already formed therein various components and structures (e.g., gratings) of the aforementioned materials. In addition, the surface may be functionalized or non-functionalized.

Figure 4B:
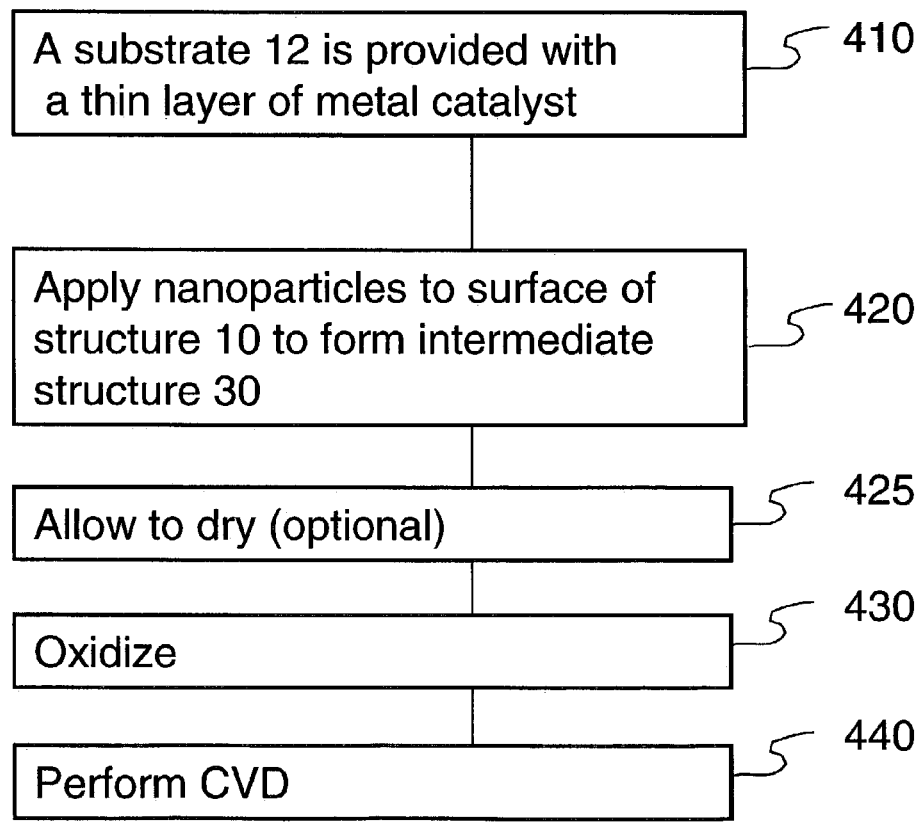
FIGS. 4B-D illustrate exemplary methods of growing nanotube fabric by CVD using the structure of FIG. 4A.

FIG. 4B illustrates a way of growing a nanofabric of carbon nanotubes (e.g., to cover a wafer surface) by using nanoparticles in conjunction with thin metal layers. First, a substrate 12 is provided and a thin layer of metal catalyst is provided 410 to at least selected regions of a wafer or perhaps an entire wafer surface, as described above. This forms layer 14 of metal catalyst. Thereafter, a distribution of nanoparticles 16 is applied 420 to the surface of layer 14. This may be done using any of the above methods of applying nanoparticles, e.g., spin coating suspensions of nanoparticles. Catalyst precursors such as ferritin, liquid metal catalyst precursor and metal ligand-catalyst precursor molecules may also be used in conjunction with thin metal layers on substrates to grow carbon nanotube fabrics. Depending on how the nanotubes are applied, the substrate may be dried (optionally) 425. The substrate is oxidized 430. Once so formed, the structure 30 may be subjected to a CVD process 440 to form a nanofabric.

Forming Nanofabrics With Pre-Formed Nanotubes

Introduction

One preferred method of forming a nanofabric uses spin coating techniques in conjunction with pre-formed nanotubes. Nanotubes should be sufficiently free of amorphous carbon if the nanotubes are to be used as electronic elements. Among other advantages, this technique is more conducive to semiconductor manufacturing environments than growth of nanotubes by CVD because it uses a room temperature process that does not contribute to the thermal budget of the standard CMOS process flows or semiconductor manufacturing methods. Additionally, the overall cost of this integration of nanotubes is very inexpensive.

Figure 5A:
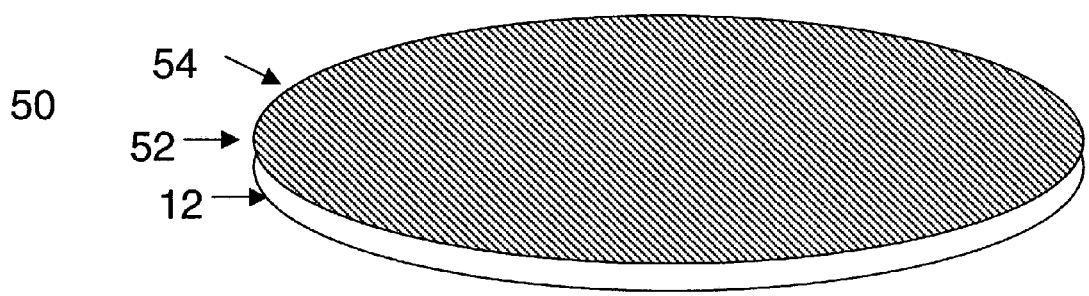
FIG. 5A shows a structure, according to certain embodiments of the invention, in which a nanofabric is formed over a substrate.

FIG. 5A shows an exemplary structure 50 having a wafer substrate 12 and a nanofabric 54 thereover. The nanofabric 54 may be made to cover an entire wafer surface.

An exemplary, non-limiting substrate 12 is like those described above. The substrate may be any material that will accept the deposition of nanotubes by spin coating, but preferably a material chosen from the group consisting of a thermal oxide or nitride, including but not limited to silicon dioxide, silicon nitride, alumina on silicon, or any combination of the following on silicon or silicon dioxide: aluminum, molybdenum, iron, titanium, platinum, and aluminum oxide, or any other substrate useful in the semiconductor industry.

Spin Coating Nanotubes on Functionalized Substrate Surfaces

Figure 5B:
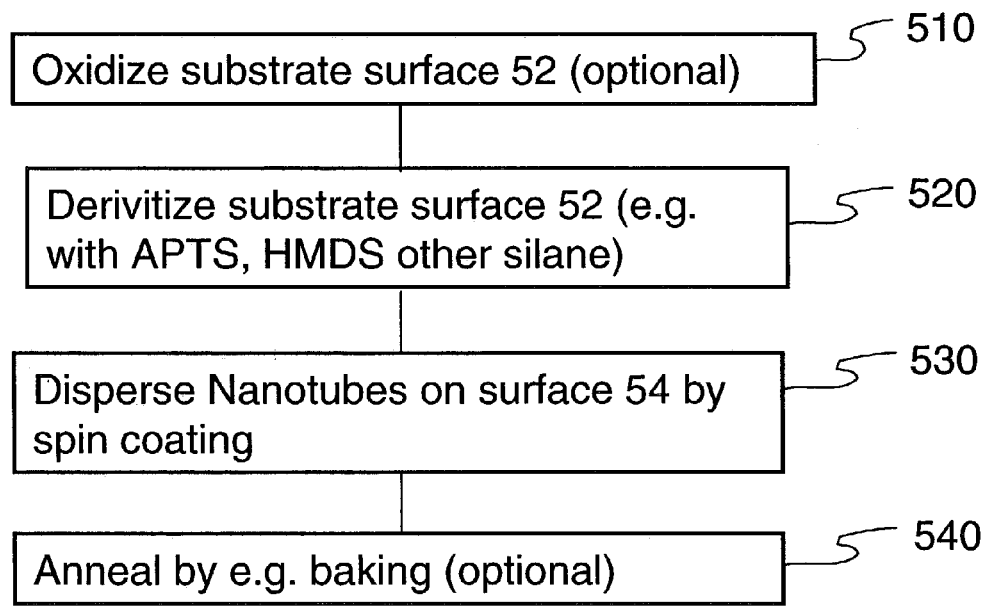
FIG. 5B illustrates an exemplary method of forming nanotube fabric by spin-coating preformed nanotubes in suspension.

FIG. 5B shows a way of making a fabric of nanotubes on a functionalized carbon nanotube growth substrate surface 52. The substrate surface 52 may be prepared for spin coating by functionalizing the surface. Specifically, functionalization of a wafer/substrate surface involves derivitizing the surface of the substrate. For example, one could chemically convert a hydrophilic to hydrophobic state or provide functional groups such as amines, carboxylic acids, thiols or sulphonates to alter the surface characteristics of the substrate. Functionalization may include the optional primary step 510 of oxidizing or ashing the substrate in oxygen plasma to remove carbon and other impurities from the substrate surface and to provide a uniformly reactive, oxidized surface which is then reacted with a silane. One such polymer that may be used is 3-aminopropyltriethoxysilane (APTS). The substrate surface 52 may be derivitized 520 prior to application of a nanotube suspension to enhance bonding of the nanotubes. The inventors foresee that any reactive silane could be used in functionalization of such a surface. In a particular, non-limiting embodiment, the substrate surface 52, whether or not subjected to ashing, is exposed to an approximately 1 to 50 millimolar solution of APTS in suitable organic solvent, e.g. hexane, but more preferably 13 to 28 millimolar APTS in hexane, such that approximately a monolayer of APTS is deposited on the substrate surface. In order to form such a monolayer of APTS, the substrate typically is immersed in an APTS solution for 30 minutes. Once the surface 52 is prepared for spin coating, carbon nanotubes are dispersed 530 on the surface, and the surface is subjected to spinning in order to disperse the nanotubes, forming a nanotube fabric (e.g., fabric 54 of FIG. 5A). The substrate is then (optionally) annealed 540.

Different methods may be employed to apply nanotubes to surfaces to form nanofabrics: to attain desired fabric properties; the selection of one method over another depends, in part, on the properties of the pre-formed nanotubes being used. For example, under certain embodiments laser-ablated SWNTs are used; under other embodiments, commercially-available high pressure carbon monoxide decomposition SWNTs nanotubes are used, such as HiPco™ nanotubes available from Rice University; under still other embodiments, other nanotubes may be used.

Under some embodiments, laser-ablated nanotubes are mixed with a solvent at a concentration of about 100-500 µg/mL. Solvents which are quite useful for suspension of SWNTs and distribution via spin coating include isopropanol, methanol, ethanol, 1,2 dichlorobenzene, 1,3 dichlorobenzene, 1,4 dichlorobenzene, chlorobenzene, n-methylpyrollidinone, dimethylformamide, dimethylsulfoxide, acetonitrile, hexane, toluene, methylene chloride and chloroform. While all of these solvents have the ability to suspend nanotubes, the precise characteristics of the film desired and substrate used are important for solvent selection. If a low boiling solvent is desired hexane would, for example, be a better selection than DMSO. 1,2 dichlorobenzene is a preferred solvent owing to its excellent suspension properties and compatibility with industrial semiconductor processes.

Under some embodiments, HiPco™ nanotubes may be used. The HiPco™ nanotubes are SWNTs and relatively free from amorphous deposits, fibrous deposits and other impurities. HiPco™ tubes are mixed into orthodichlorobenzene at a more dilute concentration than are laser ablated nanotubes, typically 10-200 µg/mL.

Under the above embodiments, the preferred concentration depends on the length of the nanotubes used. Laser ablated nanotubes tend to have overall greater lengths than HiPco™ tubes. Regardless of the nanotubes used, the nanotubes in mixture should be adequately dispersed, e.g., by sonication.

Adequately-dispersed nanotubes may be applied 530 onto a substrate surface by spin coating. Such a surface should be relatively free of any residue remaining after storage or after any substrate preparation step, e.g. functionalization of the surface. If solvent, e.g. hexane is present on the substrate's surface, it may be removed, e.g., by baking at 100-115° C. for 1 minute. After removal of any storage solvent, the nanotubes are spun onto the substrate surface.

One way of spin coating the nanotubes involves spinning the substrate, for example, at 1000 rpm while depositing the nanotube solution on the substrate surface, for about 30 seconds or alternatively they can be applied before the spinning has begun. The substrate may (i.e., optionally) then be dried, for example, by spinning at 4000 rpm until dry. Further coats of nanotube suspension may be applied in like manner, until the substrate surface is coated with the desired density of nanotubes. Ribbon density may be varied based on desired use. Adequate layers of nanotubes typically have resistance per square measurements between 1-1000 kΩ/□. For particular applications, nanotube layers with resistances per square below 1 kΩ/□ may be preferred, and for yet other uses, nanotube films with resistance per square measurements of 1-10 MΩ/□ may be sufficient. Typically four coatings of the nanotube suspension are applied to the substrate surface to create a fabric that will have a redundancy of electrically conductive pathways. After a layer of nanotubes of desired density, i.e., a monolayer, is spun onto the substrate, the substrate may be baked 540 once again to remove any remaining solvent, e.g., at 100-115° C. After four coatings are applied as described, a fabric resistance per square of ~100 kΩ is typically measured. The actual resistance per square depends upon the quality of the nanotubes used, their compositions, and overall purity.

Spin Coating Nanotubes on Non-Functionalized Substrate Surfaces

A non-functionalized substrate surface may be coated with nanotubes by spin coating. The surface may be oxidized, e.g., by ashing in oxygen plasma, to remove surface impurities, or it may be coated and not oxidized. The nanotubes used may be, but are not limited to, laser-ablated SWNTs or HiPco™ nanotubes.

Adequately dispersed nanotubes may be deposited on a non-functionalized substrate surface by spin coating. Similarly to the above, the substrate may be spun at 1000 rpm for 30 seconds while applying a nanotube solution to the substrate surface to distribute the nanotubes or the solution may be applied first and then spun. Further coats of nanotube suspension may be applied until the substrate surface is coated with the desired density of nanotubes. The substrate may be dried (optionally) between application steps, e.g., by spinning at 4000 rpm until dry.

Similarly to the above, ribbon density may be varied based on desired use. Typically, eight coatings of the nanotube suspension are applied to the non-functionalized substrate surface, when using the preceding parameters, to attain a fabric of electrically conductive nanotubes. After a layer of nanotubes of desired density is spun onto the substrate surface, the substrate can be baked once again to remove any remaining solvent, e.g. at 100-115° C. Such a method typically results in a nanotube layer resistance per square measurement of ~1-100 kΩ which is dependent both on the number of applications performed and the purity and character of the nanotubes used. Because nanotubes that have been deposited on a surface may be solvated and removed by subsequent applications of nanotubes in solvent, it may be desirable to cure the substrate and nanotubes before subsequent applications of solvated nanotubes. Such curing may be accomplished through evaporation or drying. Another way of limiting the subsequent dissolution and removal of already-spun-on tubes (removal by dissolution and from the centrifugal force overcoming van der Waals attraction between the nanotubes and the substrate surface) is to use a different solvent for subsequent spin coating steps.

The density of the nanotube ribbon may be controlled by altering such variables as including but not limited to functionalization of the underlying surface, spin coating parameters (length of time and RPM), solvent choice, nanotube type and concentration, diameter and length of nanotubes, number of applications and substrate type and composition.

Provided below are several exemplary ways of forming nanofabrics using the above principles.

EXAMPLE 28

A wafer substrate is first ashed in oxygen plasma for 15 minutes. After ashing, the substrate is bathed for 30 minutes in a solution of 3-aminopropyltriethoxysilane (APTS), the functionalization agent, and hexane at a ratio of 30-60 μL of APTS to 10 mL of Hexane. During the surface functionalization step, a nanotube solution is prepared. HiPco™ SWNTs are mixed in a solution comprising 1 mg of nanotubes and 50 ml 1,2 dichlorobenzene. The nanotube solution is then sonicated for 1 hour to adequately disperse the nanotubes in the solvent solution. Before nanotube deposition, the substrate is removed from the hexane bath and is baked at 100-115° C. for 1 minute to remove any solvent residue. After baking, the nanotubes are spun onto the wafer at 1000 rpm for 30 seconds to distribute the nanotubes, and then they are spun at 4000 rpm to dry the wafer. Four such SWNT spin coatings are applied to the wafer. After spinning, the wafer is baked again at 100-115° C. to remove any remaining solvent.

Figure 5C:
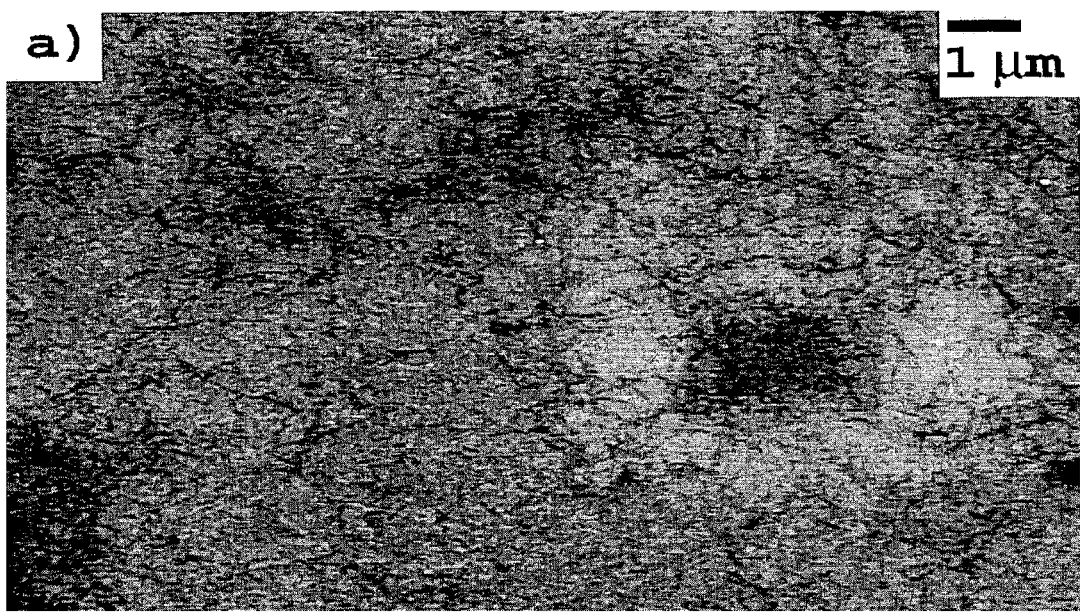
FIGS. 5C-5H are micrographs of nanofabrics formed with exemplary processes according to certain embodiments of the invention.
Figure 5D:

A resistance per square measurement of 1-100 kΩ was measured. FIGS. 5C-D display FESEM images of different magnifications of HiPco™ SWNTs spun onto a functionalized surface.

EXAMPLE 29

Figure 5E:
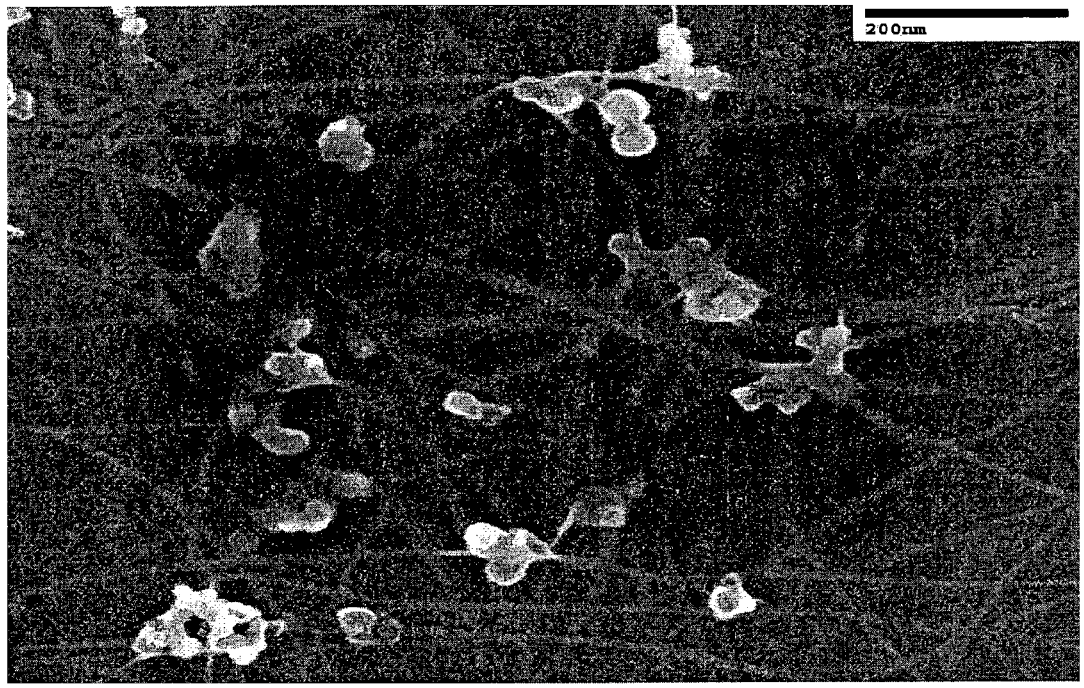

All parameters are kept the same as in example 28 except 10 mg of laser-ablated nanotubes are mixed in 100 mL of 1,2 dichlorobenzene and are spun onto a wafer surface. A resistance per square of 100-400 kΩ was measured. FIG. 5E displays a FESEM image of spun-on laser-ablated SWNTs with a functionalized surface. Some particles containing amorphous carbon impurities are observed also.

EXAMPLE 30

Figure 5G:
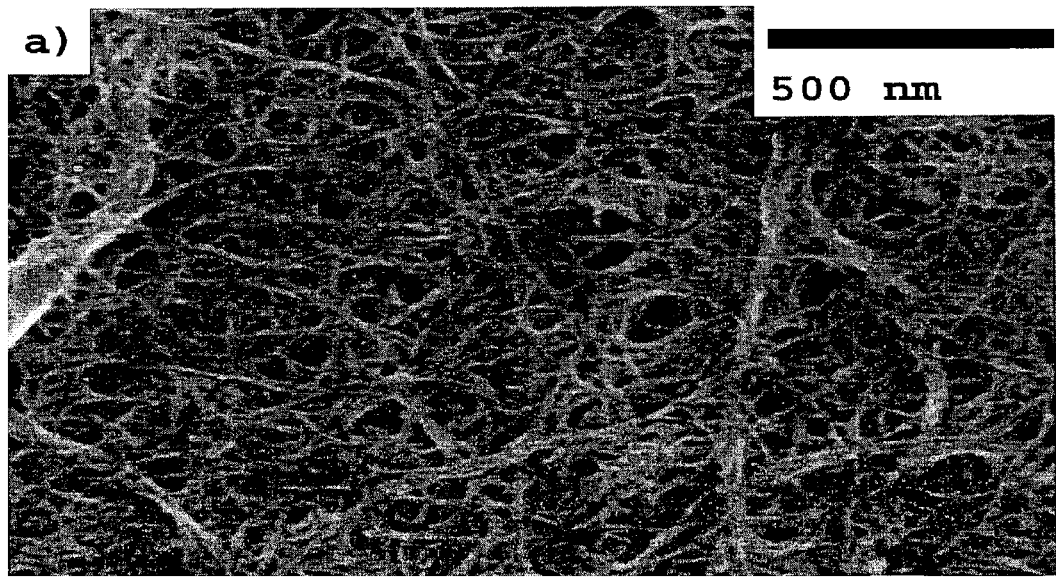
Figure 5F:
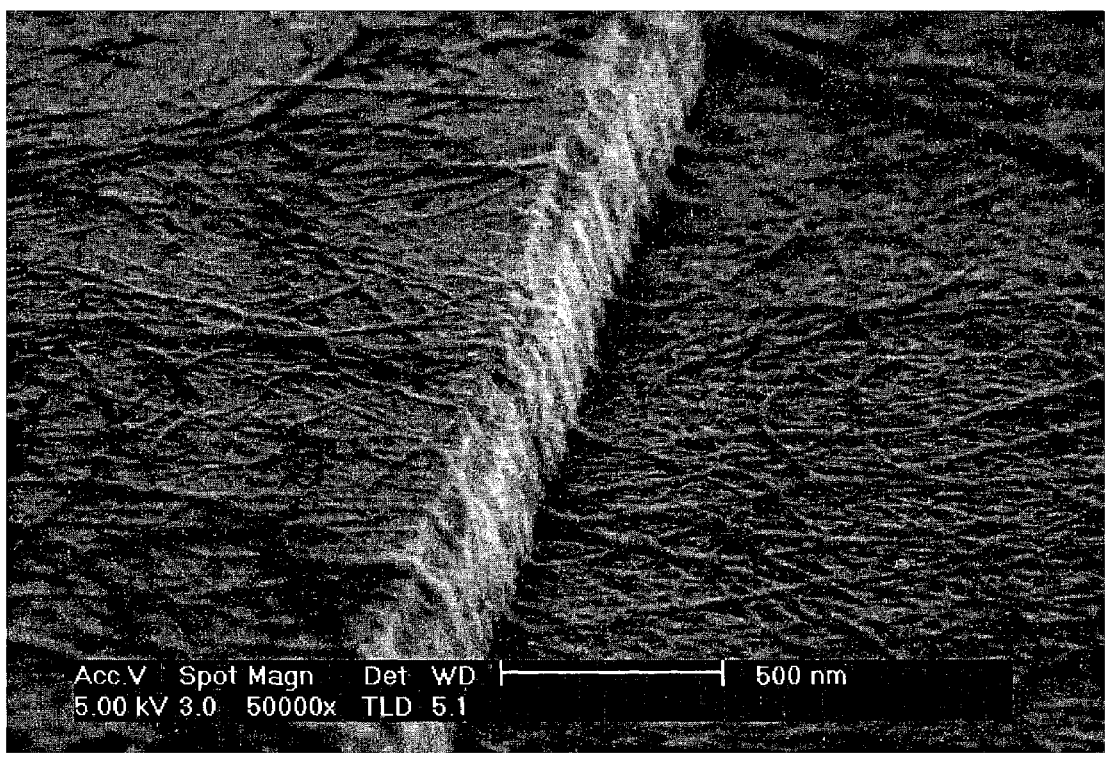

All parameters are kept constant as in example 29, except the substrate used for spin coating was stepped, i.e., not horizontally planar. FIG. 5F displays a micrograph of a nanofabric spun on to the substrate according to this method; the micrograph shows that nanotubes conform to a substrate surface via van der Waals attraction. The inventors contemplate that conformal nanofabrics may be useful in fabrication of non-horizontal electromechanical switches, especially vertical electromechanical switches or also as interconnects, actuators, relays, sensors and other electronic elements.

EXAMPLE 31

Figure 5H:
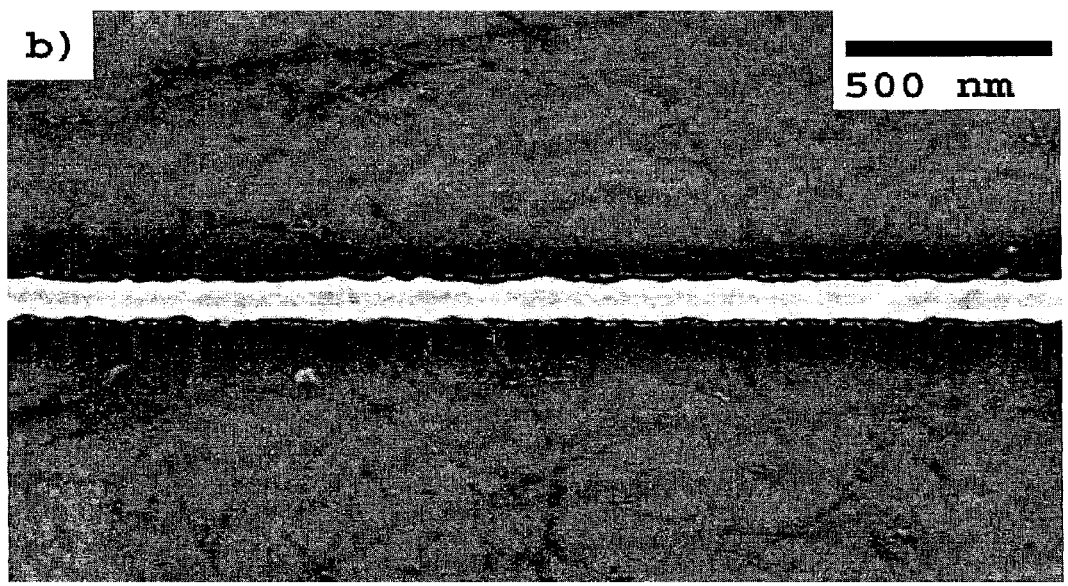

Carbon nanotubes are deposited on a non-functionalized surface as follows. A wafer surface is ashed for 1 minute. A nanotube solution is deposited and spun on to the wafer as presented in Example 28, above. Eight applications of nanotube mixture are applied to the wafer surface, producing resistance per square measurements on varying sections of the nanotube fabric ranging from 50 to 100 kΩ. FIG. 5G displays an FESEM image of SWNTs spun onto a non-functionalized wafer surface with sufficient applications to generate a multilayer nanofabric. FIG. 5H displays an FESEM micrograph of a monolayer fabric spun onto a substrate which has a prefabricated metal electrode with a width of about 130 nm shown.

Preferred embodiments operate with a range of concentrations for pre-formed nanotubes. For example for laser ablated nanotubes a concentration of about 0.1-0.5 mg/mL (100-500 ug/mL) is used. The concentration is preferably adjusted depending upon the purity and length of the nanotubes; for example, shorter nanotubes have one spinning regime and longer ones have a different regime.

In addition, preferred embodiments preferably subject the nanotube solution to sonication. For example, preferred embodiments use sonication times such as 30-120 minutes.

Patterning Nanofabrics

The new and improved methods for creating nanofabrics may be used to create articles therefrom. The U.S. patent applications, identified and incorporated above, describe specific (but not limiting) uses of such fabrics and articles. For example, the various masking and patterning techniques for selectively removing portions of the fabric are described in these applications but are not repeated here for the sake of brevity. Moreover, various component architectures are described in the incorporated applications but not repeated here for the sake of brevity.

Figure 6:
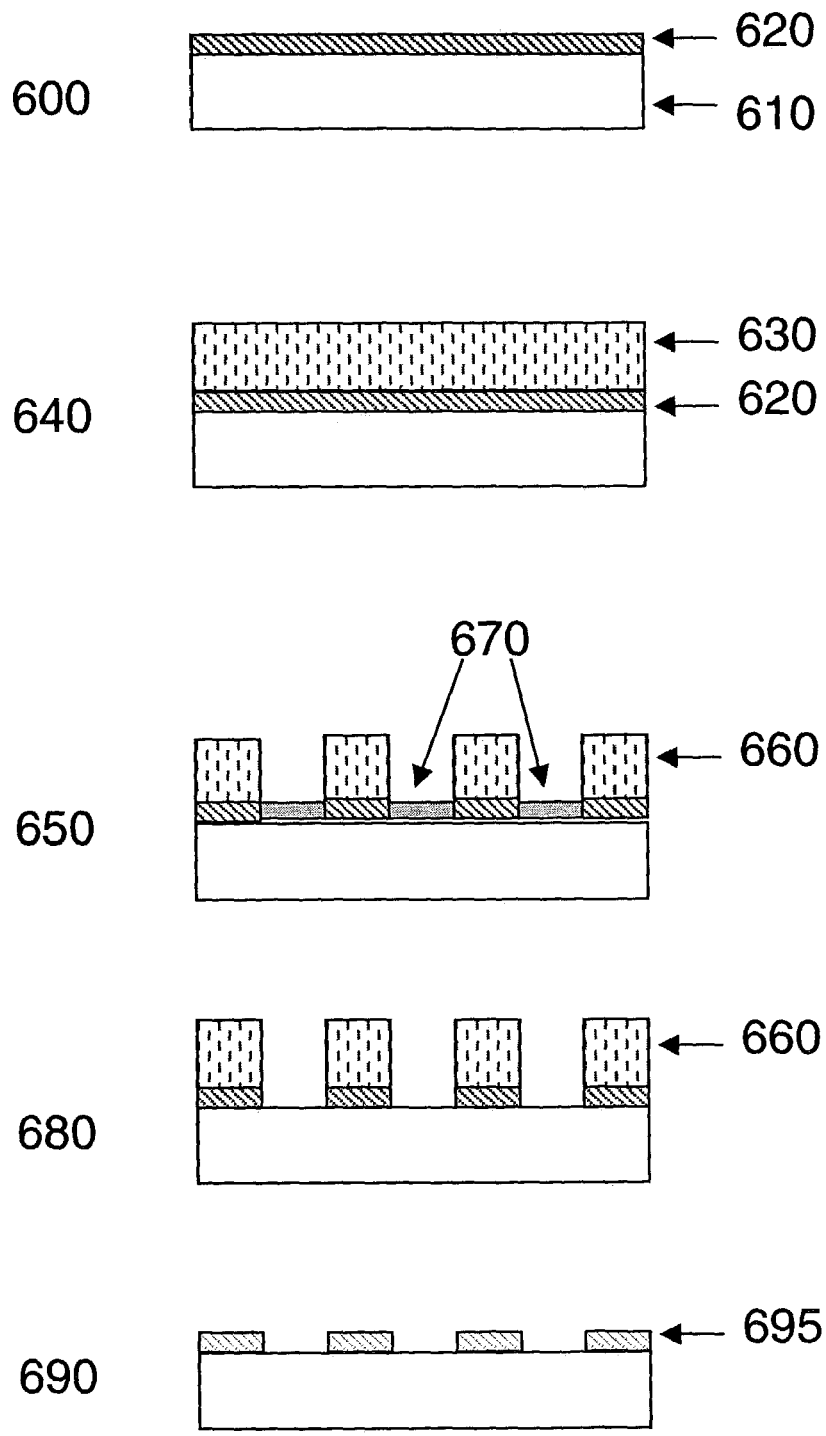
FIG. 6 are cross-sectional views of exemplary structures according to certain embodiments of the invention.

FIG. 6, for example, is a cross-sectional view of exemplary structures used in creating patterned nanofabrics. This method creates patches of carbon nanotube fabric which can be used as electronic elements. Such a patch of nanotube fabric may be used as an electromechanical switch, or as an electronic interconnect. An intermediate structure 600 is provided. Structure 600 comprises a nanofabric 620 overlying a substrate 610. The substrate 610 could be a simple substrate made of a single material; it could be a substrate which has already undergone some processing, e.g., to include vias, plugs or other elements, etc. The nanofabric 620 may be grown or formed using any of the methods disclosed or incorporated above. The nanofabric may be of SWNTs or multi-walled nanotubes. A layer of resist 630 is applied over the nanofabric 620 to form intermediate structure 640. The resist 630 is then patterned using any of a variety of techniques, including but not limited to those described in the incorporated references. For example, the resist may be patterned to correspond to the desired pattern of nanofabric patches, so that the resist will cover (and define) the desired patches. Removing selected portions of the resist (e.g., exposed portions) will create intermediate structure 650. The intermediate structure 650 includes exposed nanofabric portions 670 and remaining resist portions 660. The exposed nanofabric portions 670 may be removed in many ways; for example, by performing a reactive ion etch procedure, or oxidizing the substrate, by plasma ashing, air oxidation or other reaction methods to remove all nanotube fabric except for the desired patches, thereby creating intermediate structure 680. The remaining resist portions 660 may then be stripped from intermediate structure 680, yielding structure 690 which includes patterned patches 695 of nanofabric.

As explained in the incorporated references, the nanofabric 620 may be formed or grown over defined regions of sacrificial material and over defined support regions. The sacrificial material may be subsequently removed, yielding suspended articles of nanofabric. See, for example, Electromechanical Memory Array Using Nanotube Ribbons and Method for Making Same (U.S. patent application Ser. No. 09/915,093) filed Jul. 25, 2001, for an architecture which suspends ribbons of nanofabric.

Figure 7:
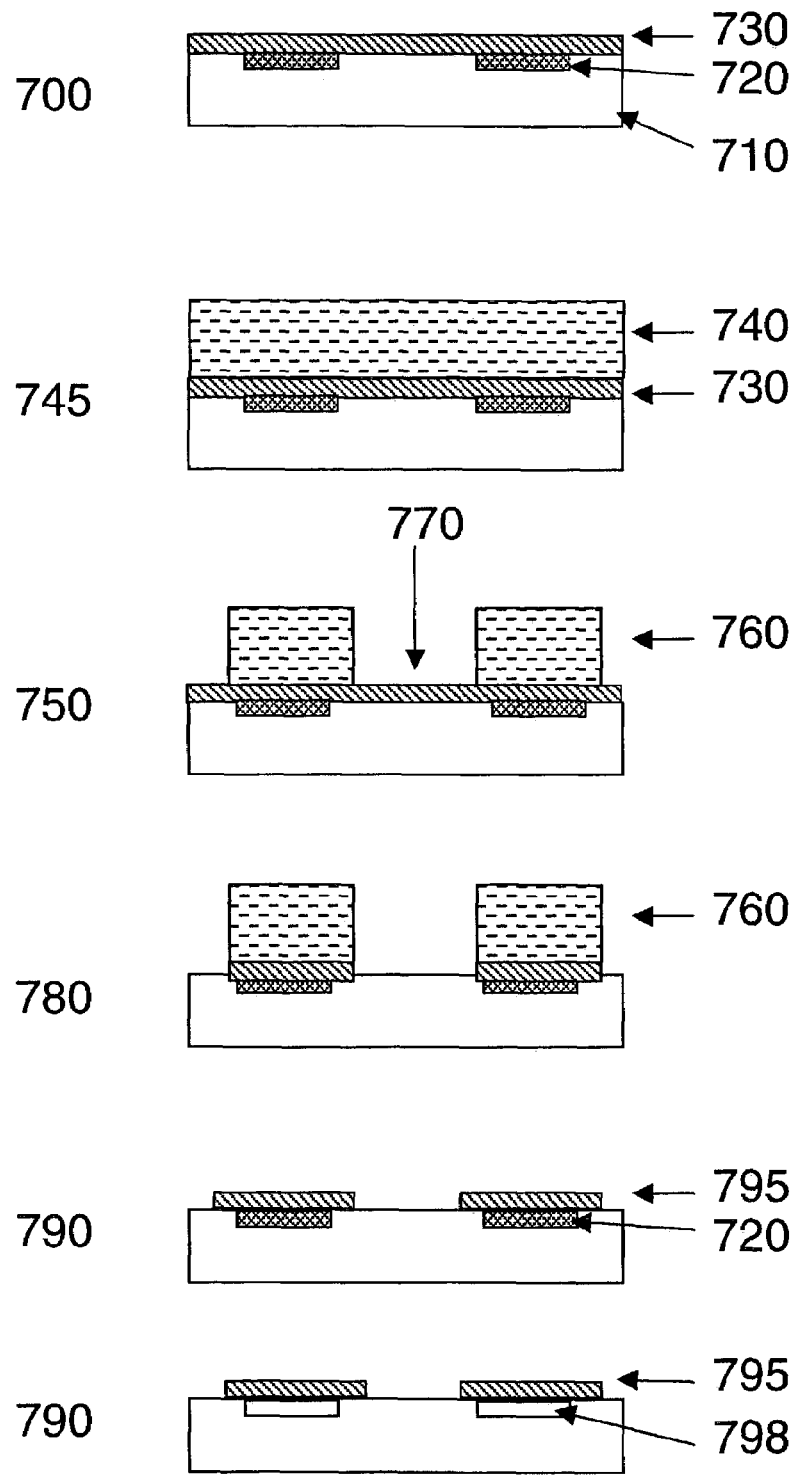
FIG. 7 shows cross-sectional views of exemplary structures according to certain embodiments of the invention.

FIG. 7, for example, is a cross-sectional view of exemplary structures used in creating suspended, patterned nanofabrics. This method creates suspended patches of carbon nanotube fabric, which can be used as electronic elements. Such a patch of nanotube fabric may be used as an electromechanical switch, or as an actuator, a relay, a sensor, especially a biosensor or chemical sensor.

An intermediate structure 700 is provided. Structure 700 comprises defined regions of sacrificial material 720 overlying a substrate 710 (which as outlined above could made of a single material; could be a substrate which has already undergone some processing, e.g. to include vias, plugs or other elements, etc.). A nanofabric 730 covers the substrate surface and the sacrificial material 720. The nanofabric 730 may be formed or grown as outlined above and may be multilayer or single layer and may have single- or multi-walled nanotubes. A layer of resist 740 is applied over the nanofabric 730 to create intermediate structure 745. The resist 740 is then patterned (not shown). Removing selected portions of the resist (e.g., exposed portions) will create intermediate structure 750. The intermediate structure 750 includes exposed nanofabric portions 770 and remaining resist portions 760. The exposed nanofabric portions 770 may be removed in many ways; for example, by performing a reactive ion etch procedure, or oxidizing the substrate, by plasma ashing, air oxidation or other reactive methods to remove all nanotube fabric except for the desired patches, thereby creating intermediate structure 780. The remaining resist portions 760 may then be stripped from intermediate structure 780, yielding structure 790 which includes patterned nanofabric patches 795 overlying defined sacrificial material 720. The sacrificial layer 720 is removed by selective etching, leaving substantially intact the suspended patterned nanofabric 795 and leaving an air gap 798 in the place of the removed sacrificial layer. The inventors contemplate that the stripping of the remaining resist portions 760 and removal of sacrificial material 720 may be done in the same step, with an appropriate process.

Figure 8A:
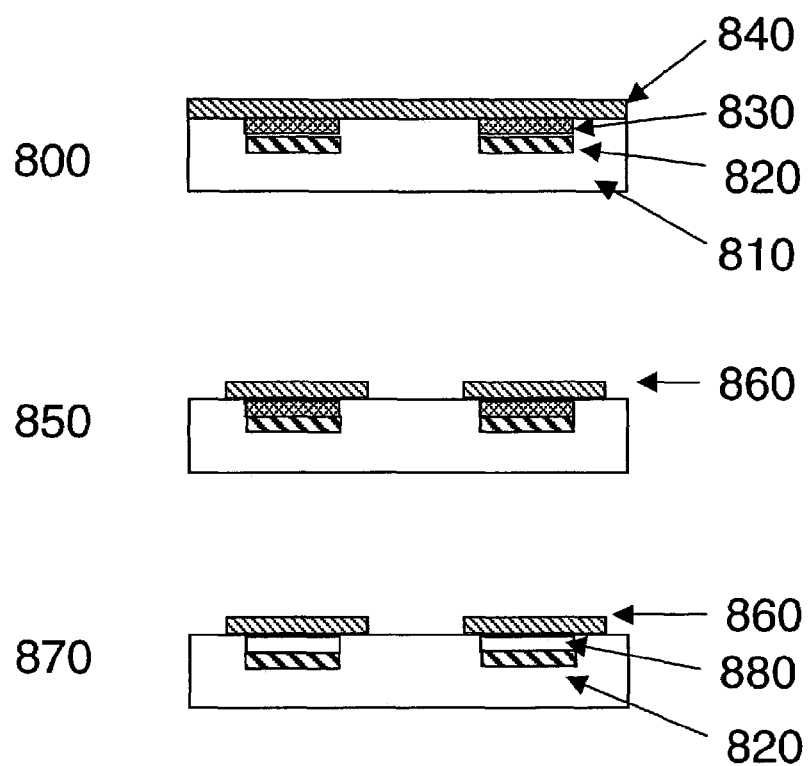
FIG. 8A shows cross-sectional views of exemplary structures according to certain embodiments of the invention.

FIG. 8A, for example, is a cross-sectional view of exemplary structures used in creating suspended, patterned nanofabrics. This method creates suspended patches of carbon nanotube fabric overlying an electrode with which the nanofabric may come into electrically conductive contact when the nanofabric is deflected. Such a device can be used as an electronic element, e.g. as an electromechanical switch, etc.

An intermediate structure 800 is provided. Structure 800 comprises a substrate 810 (similar to those described above) with already defined electrodes 820 (e.g., made of sufficiently conductive material, such as doped semiconductor or metal) and defined sacrificial material 830 thereover. A nanofabric 840 covers the substrate surface and the sacrificial layer 830. The nanofabric may be made by any of the above-described methods. Similar to that described above and as described in the incorporated references, the nanofabric 840 may be patterned (e.g., lithographic patterning) and defined portions of nanofabric may be removed to form intermediate structure 850. Patterned nanofabric articles 860 then cover defined sacrificial material 830 which in turn cover electrodes 820. The sacrificial material 830 may then be removed by selective etching, leaving remaining structures substantially intact, yielding structure 870. Structure 870 comprises suspended nanofabric articles 860 separated from electrodes 820. The nanofabric articles 860 and/or the electrodes may then be subjected to electrical stimulus to cause the nanofabric articles 860 to deflect toward, or away from, electrodes 820. As described in the incorporated references, the deflected articles retain their deflected state in a non-volatile manner.

EXAMPLE 32

Figure 8B:
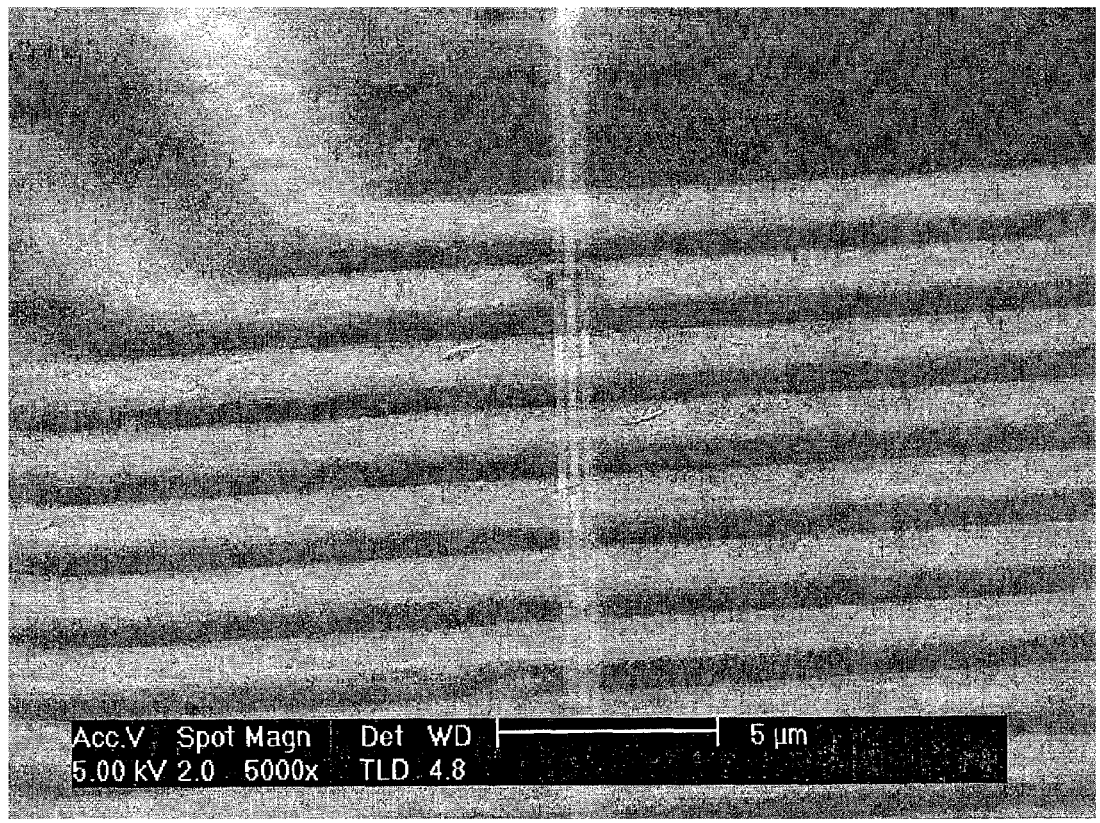
FIGS. 8B-D are micrographs of nanofabrics patterned according to certain embodiments of the invention.
Figure 8C:
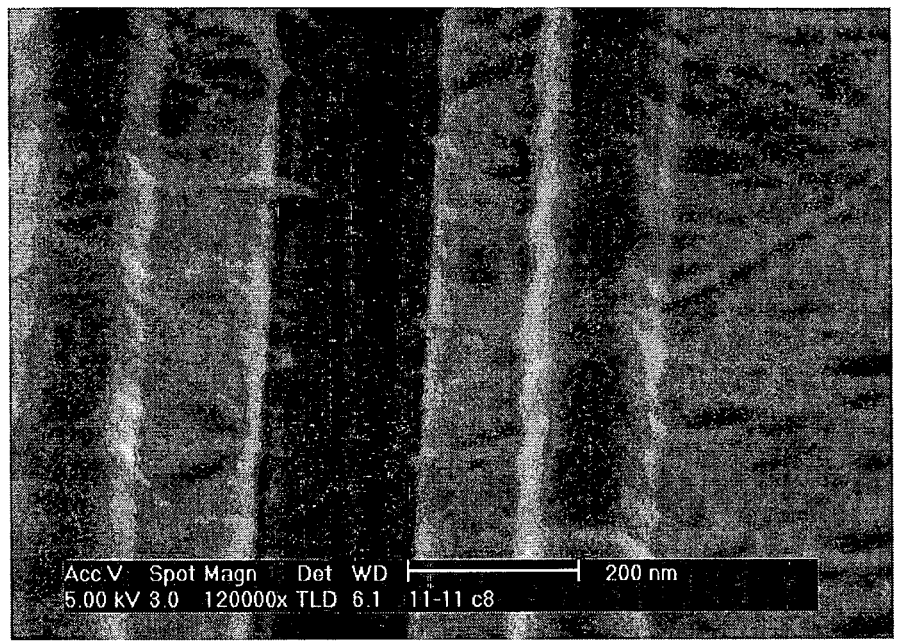
Figure 8D:
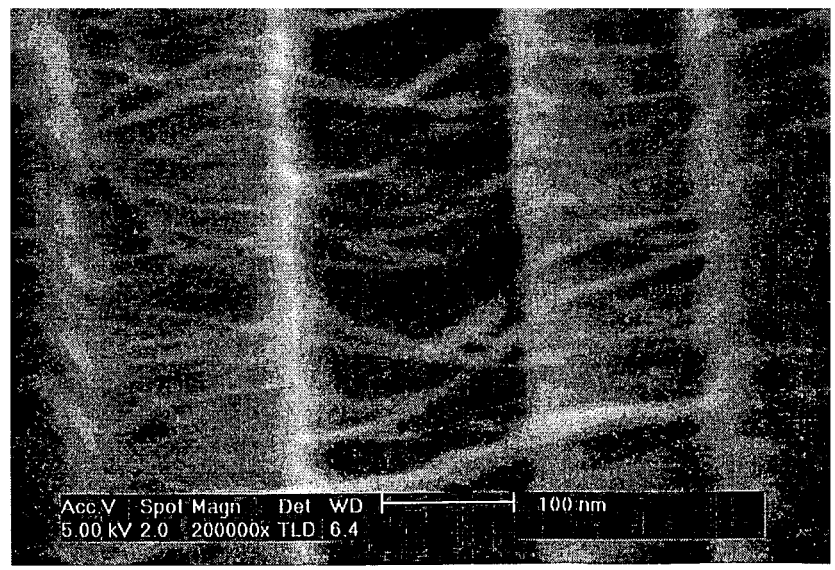

A wafer substrate, an overlying nanofabric, an embedded titanium electrode under a sacrificial layer of $Al_2O_3$ are provided. Shipley 1805 photoresist is applied to the wafer surface by spin coating at 4000 rpm for 60 seconds. The photoresist is exposed using a Kasper Mask Aligner for 8 seconds. The pattern is developed using a basic developer, thereby exposing portions of nanofabric and leaving other portions protected by the photoresist. The substrate is rinsed in deionized water and dried at 115° C. The exposed portions of nanofabric are removed by plasma ashing for five minutes with 25 cubic feet per minute oxygen at a pressure of 280 millitorr and a power of 300 Watts. The substrate is soaked in n-methylpyrollidinone at 70° C. to remove remaining photoresist for 30 minutes. The substrate is rinsed in isopropanol and dried. Hot phosphoric acid is applied to remove the $Al_2O_3$, leaving a patterned nanofabric suspended over an electrode with which it may come into electrical contact when deflected. FIG. 8B displays an FESEM image of patterned nanofabrics made by this method. In the micrograph, bare substrate regions are dark, nanofabric patches are light in color and the longitudinal light stripe is a metallic electrode. Typical resistivity for a patterned trace with a length of 100 μm and width of 3 μm is 1-10 MΩ. FIG. 8C displays an FESM image of the same structure as in 8B under greater magnification. The dark longitudinal stripe is the sacrificial layer overlying the metal electrode. FIG. 8D displays an FESM image of the same structure with the sacrificial layer removed; the nanofabric can be seen suspended over and not in contact with the electrode.

Controlled Composition of Types of Nanotubes in Nanofabric

Other embodiments involve controlled composition of carbon nanotube fabrics. Specifically, methods may be employed to control the relative amount of metallic and semiconducting nanotubes in the nanofabric. In this fashion, the nanofabric may be made to have a higher or lower percentage of metallic nanotubes relative to semiconducting nanotubes. Correspondingly, other properties of the nanofabric (e.g., resistance) will change. The control may be accomplished by direct growth, removal of undesired species, or application of purified nanotubes.

With regard to controlled direct growth, methods are known, for example, to selectively grow semiconducting nanotubes. (See Kim et al., Synthesis of Ultralong and High Percentage of Semiconducting Single-Walled Carbon Nanotubes, Vol. 2 Nanoletters 703 (2002).) The inventors envision a protocol in which selective growth of fabrics of semiconducting or metallic nanotubes followed by etching would produce nanotube ribbons or traces useful in fabrication of electromechanical devices.

With regard to removal of undesired species, methods are known, for example, to process MWNTs and SWNT ropes to convert such into metallic or semiconducting nanotubes as desired. (See Collins et al., Engineering Carbon Nanotubes and Nanotube Circuits Using Electrical Breakdown, Col. 292 Science 706 (2001).)

With regard to application of purified nanotubes, using proper bulk nanotube preparations which contain primarily metallic or semiconducting nanotubes would allow application of a nanotube fabric to a substrate. The application could be performed via spin coating of a nanotube stock solution onto a substrate, dipping a substrate into a nanotube stock solution, spraying of nanotube stock solutions onto a surface or other methods. Application of single-walled, multiwalled or mixtures of such nanotubes can be envisioned with subsequent patterning and etching to generate fabrics or traces of sufficient length and width to make electronic devices.

By way of example, FIG. 1B.2 is similar to FIG. 1B.1 and the description thereof is not repeated. In material part, the method of FIG. 1B.2 removes the optional step of annealing nanotubes found in FIG. 1B.1 and substitutes it with a selective removal of nanotubes, e.g., removing semiconducting nanotubes or metallic. By doing so the composition of the nanofabric may be controlled.

Figure 3G:
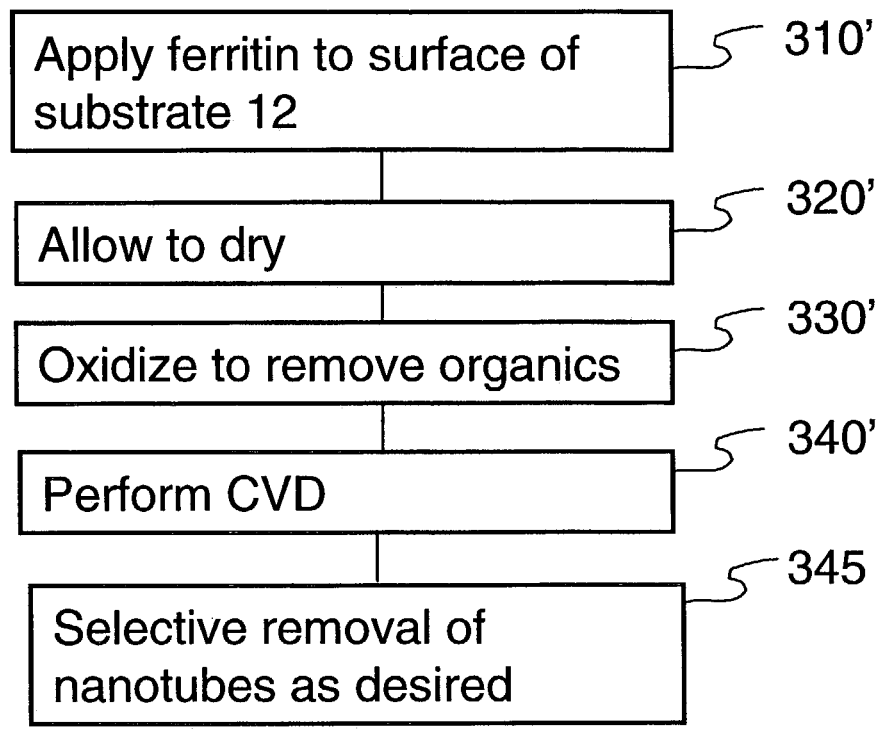
FIGS. 3G-H illustrate exemplary methods of growing nanotube fabric by CVD using the structure of FIG. 3A.
Figure 3H:
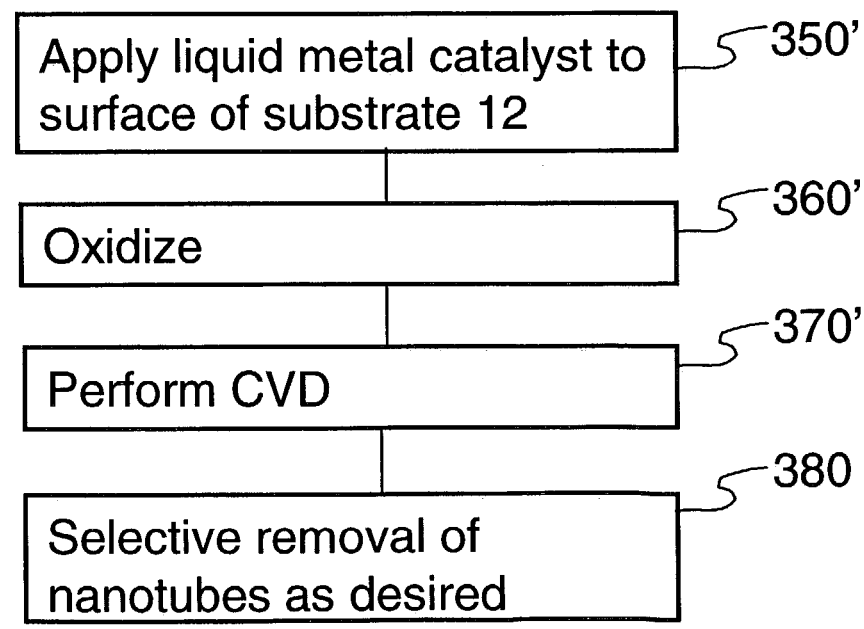

FIGS. 3G-H is similar to FIGS. 3B-C and the descriptions thereof are not repeated. In material part, the method of FIG. 3G adds a selective removal 345 of nanotubes, e.g., removing semiconducting nanotubes or metallic; analogously, the method of FIG. 3H adds a selective removal 380 of nanotubes. By doing so the composition of the nanofabric may be controlled.

Figure 4C:
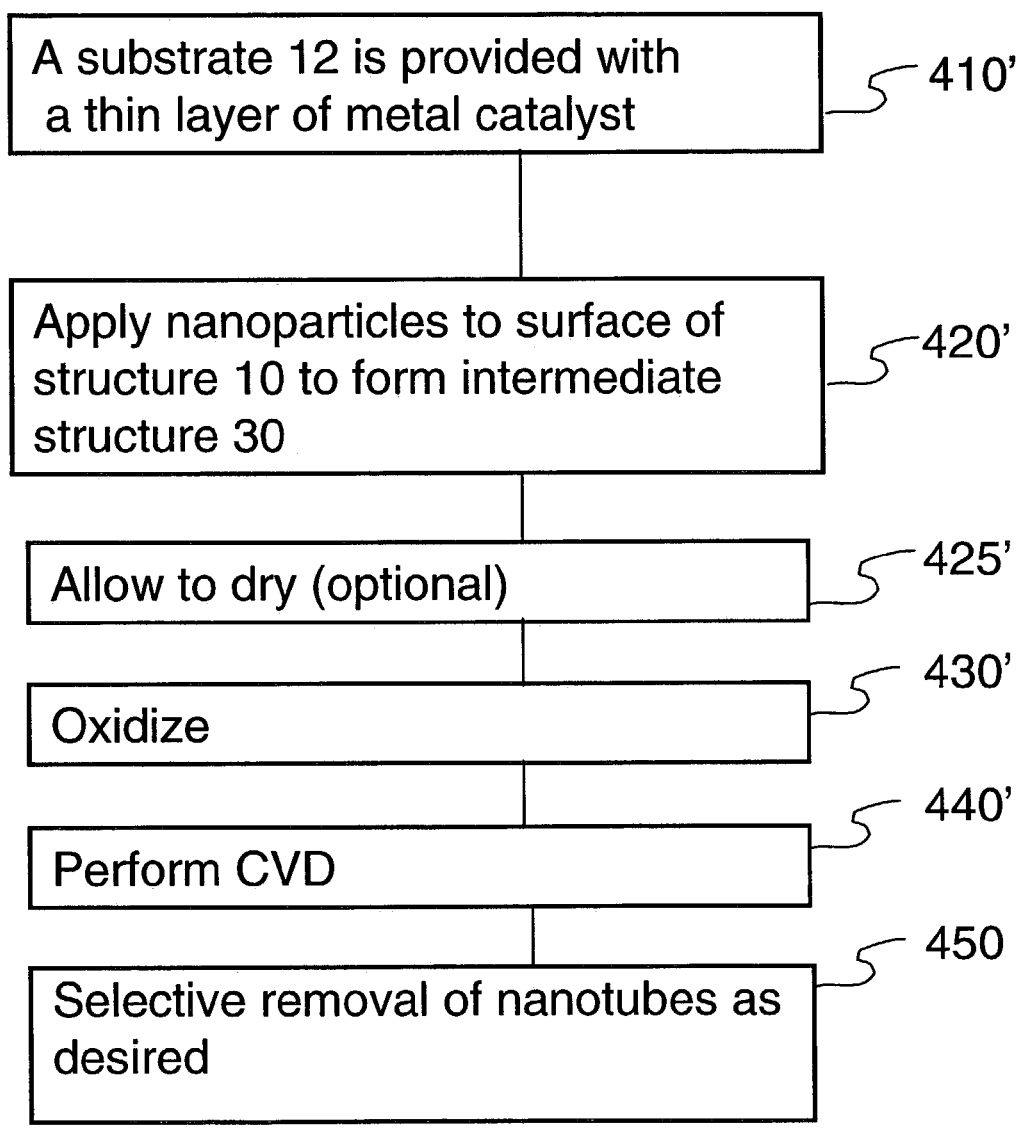

FIG. 4C is similar to FIG. 4B and the description thereof is not repeated. In material part, the method of FIG. 4C adds a selective removal 450 of nanotubes, e.g., removing semiconducting nanotubes or metallic. By doing so the composition of the nanofabric may be controlled.

Figure 4D:
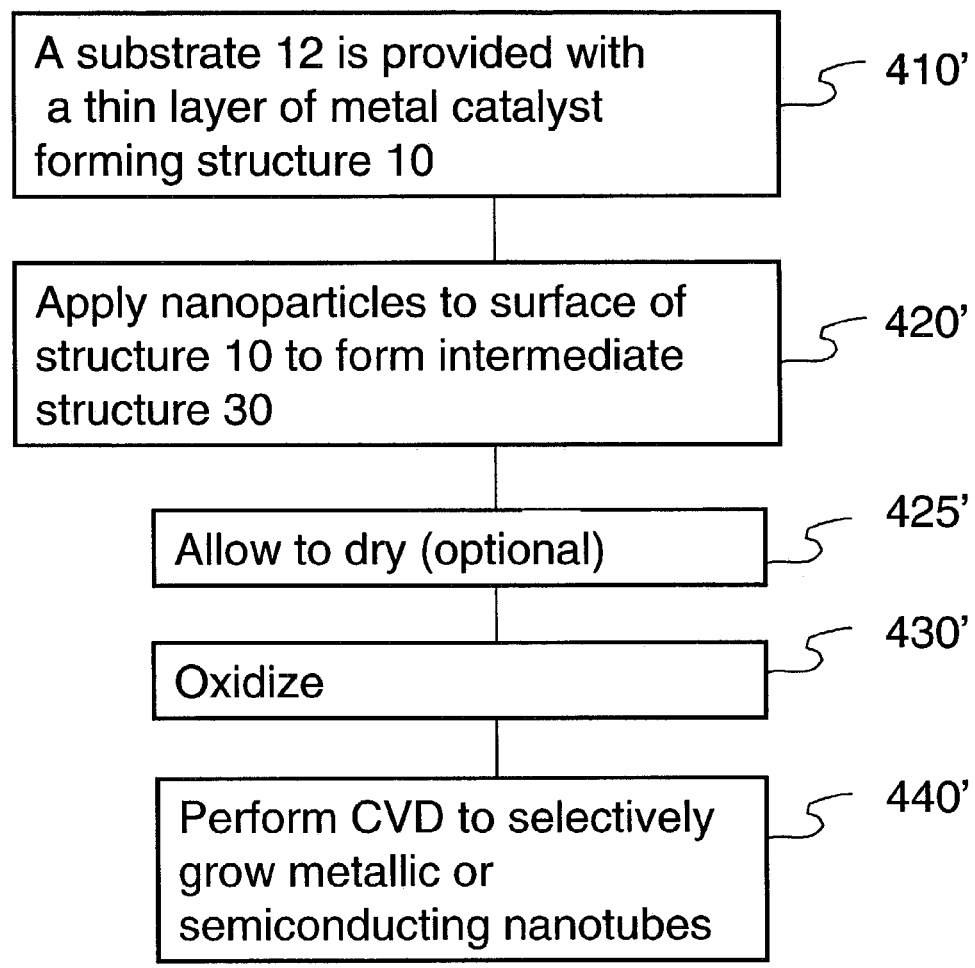

FIG. 4D is similar to FIG. 4B and the description thereof is not repeated. In material part, the method of FIG. 4D substitutes the CVD step 440 of FIG. 4B with a selective growth 440' of nanotubes, in which the growth process affects the relative concentration of one type of nanotube as compared to another. By doing so the composition of the nanofabric may be controlled.

Under some of the above embodiments, the application of nanotubes may be iterative. Thus for example a nanofabric may be created and subsequently processed to remove semiconducting nanotubes and then another application of nanotubes may be applied. Repeated application and removal will increase the relative amount of metallic or semiconducting nanotubes in the resulting nanofabric.

FIG. 5I is similar to FIG. 5B and the description thereof is not repeated. In material part, the method of FIG. 5I removes the optional annealing step 540 of FIG. 5B and adds a selective removal 550 of nanotubes, e.g., removing semiconducting nanotubes or metallic. By doing so the composition of the nanofabric may be controlled. This process step 550 can be iterated to generate a more dense nanofabric.

Figure 5J:
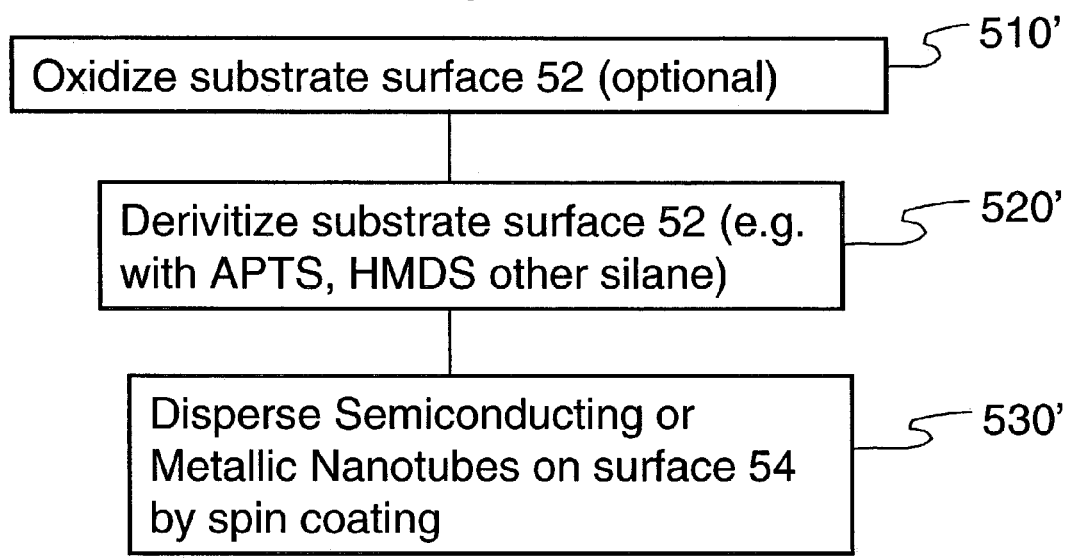

FIG. 5J is similar to FIG. 5B and the description thereof is not repeated. In material part, the method of FIG. 5I removes the optional annealing step 540 of FIG. 5B and substitutes the dispersal step 530 with a new dispersal step 530', in which the nanotubes that are disperse have a controlled composition, e.g., selected amounts of metallic nanotubes. By doing so the composition of the nanofabric may be controlled. This process step 530' can be iterated to generate a more dense nanofabric.

Other Embodiments

Catalyst deposited on substrate surface or remaining in spun-on SWNTs may be removed by rinse/wash steps if a desired property of the ribbon included that it be free of metal/catalyst. This could be performed by successive treatments in an appropriate solvent or acid which would cause the removal of the exterior carbon shell that typically passivates the particles during nanotube growth. Other unreacted nanoparticles could be removed with just a mild solvent wash.

Some of the above methods of manufacturing such nanofabrics and patterning articles therefrom are conducive to certain environments, such as a circuit manufacturing environment. Other methods provide nanofabrics and articles therefrom that have desirable characteristics, such as an ability to adhere to hydrophobic surfaces (found in many electronic devices), even when the feature size is in the nanometer regime (<200 nm).

While the inventors typically desire a monolayer fabric of single-walled nanotubes, for certain applications it may be desirable to have multilayer fabrics to increase current density, redundancy or other mechanical or electrical characteristics. Additionally it may be desirable to use either a monolayer fabric or a multilayer fabric comprising MWNTs for certain applications or a mixture of single-walled and multi-walled nanotubes. The previous methods illustrate that control over catalyst type, catalyst distribution, surface derivitization, temperature, feedstock gas types, feedstock gas pressures and volumes, reaction time and other conditions allow growth of fabrics of single-walled, multi-walled or mixed single- and multi-walled nanotube fabrics that are at the least monolayers in nature but could be thicker as desired with measurable electrical characteristics.

In the case of formation of fabrics using pre-grown nanotubes, formulation of nanotube solutions in appropriate solvents with subsequent distribution over surfaces with or without derivitization allows exquisite control over porosity and density of the fabrics and would lead to facile generation of single-walled, multi-walled or mixed single- and multi-walled fabrics that are at the least monolayers in nature but could be thicker as desired with measurable electrical characteristics.

It will be further appreciated that the scope of the present invention is not limited to the above-described embodiments, but rather is defined by the appended claims, and that these claims will encompass modifications of and improvements to what has been described.

What is claimed is:

1. A method of making an article, comprising:
providing a substrate;
applying preformed nanotubes to a surface of the substrate to create a non-woven fabric of carbon nanotubes;
selectively removing portions of the non-woven fabric by etching the fabric according to a defined pattern to create the article.

2. The method of claim 1 including functionalizing the surface to promote adhesion of the preformed nanotubes to the surface of the substrate.

3. The method of claim 2 wherein the act of functionalizing the surface includes derivitizing the surface to chemically convert the surface state.

4. The method of claim 2 further including oxidizing the surface to remove carbon and other impurities.

5. The method of claim 1 wherein the surface is reacted with a silane.

6. The method of claim 1 wherein the surface is exposed to 3-aminopropyltriethoxysilane (APTS).

7. The method of claim 6 wherein the surface is exposed to an approximately 1-50 molar solution of APTS.

8. The method of claim 6 wherein the surface is exposed to an approximately 13-28 molar solution of APTS.

9. The method of claim 8 wherein the solution of APTS includes hexane.

10. The method of claim 7 wherein the substrate is immersed in the solution of APTS for a predetermined time.

11. The method of claim 5 wherein silane is deposited on the surface as substantially a monolayer.

12. The method of claim 9 wherein the substrate is stored in hexane prior to the application of pre-formed nanotubes.

13. The method of claim 1 wherein the application of nanotubes to the surface includes spinning the substrate to disperse the pre-formed nanotubes.

14. The method of claim 1 wherein the pre-formed nanotubes are laser-ablated nanotubes.

15. The method of claim 1 wherein the pre-formed nanotubes are high pressure carbon monoxide decomposition nanotubes.

16. The method of claim 1 wherein the pre-formed nanotubes are single-walled nanotubes.

17. The method of claim 1 wherein the pre-formed nanotubes are multi-walled nanotubes.

18. The method of claim 14 wherein the nanotubes are mixed with a solvent at a concentration of about 100-500 µg/mL.

19. The method of claim 18 wherein the solvent is 1,2 dichlorobenzene.

20. The method of claim 18 wherein the nanotubes in the solvent are caused to be dispersed.

21. The method of claim 20 wherein the solution of nanotubes and solvent are subjected to sonication.

22. The method of claim 15 wherein the nanotubes are mixed with a solvent at a concentration of about 10-200 µg/mL.

23. The method of claim 22 wherein the solvent is 1,2 dichlorobenzene.

24. The method of claim 22 wherein the nanotubes in the solvent are caused to be dispersed.

25. The method of claim 24 wherein the solution of nanotubes and solvent are subjected to sonication.

26. The method of claim 13 wherein the substrate is caused to spin at a predefined rate as a solution including nanotubes is deposited on the surface and wherein the surface continues to spin for a defined duration.

27. The method of claim 26 wherein the predefined rate is about 1000 rpm and the defined duration is about 30 seconds.

28. The method of claim 26 wherein the substrate is dried subsequent to the application of nanotubes.

29. The method of claim 28 wherein the substrate is dried by a subsequent spinning operation.

30. The method of claim 13 wherein the application of nanotubes is accomplished by multiple spin coating operations of a solution of pre-formed nanotubes.

31. The method of claim 30 wherein between spin coating operations the substrate is dried of solvent.

32. The method of claim 1 wherein the application of nanotubes causes a sufficient density of nanotubes to yield a non-woven fabric characterized by a resistance of about 1-1000 k$\Omega$/□.

33. The method of claim 1 wherein the substrate with non-woven fabric is annealed.

34. The method of claim 1 wherein the carbon nanotubes of the non-woven fabric include metallic nanotubes and semiconducting nanotubes and wherein the relative composition of metallic and semiconducting nanotubes in the fabric is controlled.

35. The method of claim 1 wherein the carbon nanotubes of the non-woven fabric include metallic nanotubes and semiconducting nanotubes and wherein the method further includes selectively removing metallic nanotubes.

36. The method of claim 1 wherein the carbon nanotubes of the non-woven fabric include metallic nanotubes and semiconducting nanotubes and wherein the method further includes selectively removing semiconducting nanotubes.

37. The method of claim 35 wherein subsequent to selectively removing metallic nanotubes a subsequent application of preformed nanotubes is made.

38. The method of claim 36 wherein subsequent to selectively removing semiconducting nanotubes a subsequent application of preformed nanotubes is made.

39. The method of claim 1 wherein the non-woven fabric is made to cover the surface of the substrate and to be of substantially uniform density.

40. The method of claim 1 wherein the non-woven fabric is made to cover the surface of the substrate and to be about 2 nm or less in thickness.

41. The method of claim 1 wherein the preformed nanotubes applied to the substrate have a controlled composition of metallic nanotubes relative to semiconducting nanotubes.

* * * * *